US011871584B1

(12) United States Patent
Sato et al.

(10) Patent No.: US 11,871,584 B1
(45) Date of Patent: Jan. 9, 2024

(54) MULTI-LEVEL HYDROGEN BARRIER LAYERS FOR MEMORY APPLICATIONS

(71) Applicant: Kepler Computing Inc., San Francisco, CA (US)

(72) Inventors: Noriyuki Sato, Hillsboro, OR (US); Niloy Mukherjee, San Ramon, CA (US); Mauricio Manfrini, Heverlee (BE); Tanay Gosavi, Portland, OR (US); Rajeev Kumar Dokania, Beaverton, OR (US); Somilkumar J. Rathi, San Jose, CA (US); Amrita Mathuriya, Portland, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 87 days.

(21) Appl. No.: 17/553,475

(22) Filed: Dec. 16, 2021

Related U.S. Application Data

(63) Continuation of application No. 17/550,904, filed on Dec. 14, 2021.

(51) Int. Cl.
*H01L 21/00* (2006.01)
*H10B 53/30* (2023.01)

(52) U.S. Cl.
CPC .................................... *H10B 53/30* (2023.02)

(58) Field of Classification Search
CPC ...................................................... H10B 53/30
See application file for complete search history.

(56) References Cited

U.S. PATENT DOCUMENTS 5,739,563 A 4/1998 Kawakubo et al.
6,165,864 A 12/2000 Shen et al.
(Continued)

FOREIGN PATENT DOCUMENTS

DE 102015015854 A1 6/2017
JP 2006352005 A 12/2006
(Continued)

OTHER PUBLICATIONS

Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
(Continued)

*Primary Examiner* — Richard A Booth
(74) *Attorney, Agent, or Firm* — MUGHAL GAUDRY & FRANKLIN PC

(57) ABSTRACT

A device includes, in a first region, a first conductive interconnect, an electrode structure on the first conductive interconnect, where the electrode structure includes a first conductive hydrogen barrier layer and a first conductive fill material. A memory device including a ferroelectric material or a paraelectric material is on the electrode structure. A second dielectric includes an amorphous, greater than 90% film density hydrogen barrier material laterally surrounds the memory device. A via electrode including a second conductive hydrogen barrier material is on at least a portion of the memory device. A second region includes a conductive interconnect structure embedded within a less than 90% film density material.

20 Claims, 45 Drawing Sheets

(56) References Cited

U.S. PATENT DOCUMENTS

| | | | |
|---|---|---|---|
| 6,177,351 B1 | 1/2001 | Beratan et al. | |
| 6,211,035 B1 | 4/2001 | Moise et al. | |
| 6,365,927 B1 | 4/2002 | Cuchiaro et al. | |
| 6,368,910 B1 | 4/2002 | Sheu et al. | |
| 6,548,343 B1 | 4/2003 | Summerfelt et al. | |
| 6,613,586 B2 | 9/2003 | Bailey | |
| 6,699,725 B2 | 3/2004 | Lee | |
| 6,753,193 B2 | 6/2004 | Kim | |
| 7,075,134 B2 | 7/2006 | Araujo et al. | |
| 7,754,501 B2 | 7/2010 | Urushido | |
| 7,977,720 B2 | 7/2011 | Fukada | |
| 8,440,508 B2 | 5/2013 | Udayakumar et al. | |
| 8,916,872 B1 | 12/2014 | Tran et al. | |
| 9,847,338 B2 | 12/2017 | Nakao | |
| 9,875,784 B1 | 1/2018 | Li et al. | |
| 10,847,201 B2 | 11/2020 | Manipatruni et al. | |
| 11,043,472 B1 | 6/2021 | Dokania et al. | |
| 11,063,131 B2 | 7/2021 | Haratipour et al. | |
| 17,396,609 | 8/2021 | Guhabiswas | |
| 11,139,270 B2 | 10/2021 | Manipatruni et al. | |
| 17,449,750 | 10/2021 | Sato | |
| 11,164,976 B2 | 11/2021 | Ramamoorthy et al. | |
| 11,659,714 B1 | 5/2023 | Mukherjee et al. | |
| 2001/0013614 A1 | 8/2001 | Joshi et al. | |
| 2002/0045279 A1 | 4/2002 | Kwon et al. | |
| 2002/0098645 A1 | 7/2002 | Jung et al. | |
| 2003/0030084 A1 | 2/2003 | Moise et al. | |
| 2005/0020054 A1 | 1/2005 | Hilliger et al. | |
| 2006/0133129 A1 | 6/2006 | Rodriguez et al. | |
| 2007/0045690 A1 | 3/2007 | Fukada | |
| 2008/0057641 A1 | 3/2008 | Wang | |
| 2008/0121959 A1 | 5/2008 | Izumi | |
| 2008/0197502 A1 | 8/2008 | Kikuchi et al. | |
| 2009/0026514 A1 | 1/2009 | Wang | |
| 2010/0224961 A1 | 9/2010 | Summerfelt et al. | |
| 2010/0320518 A1 | 12/2010 | Ozaki | |
| 2011/0062550 A1 | 3/2011 | Udayakumar et al. | |
| 2013/0149794 A1 | 6/2013 | Wang | |
| 2013/0264620 A1 | 10/2013 | Yu et al. | |
| 2020/0051833 A1 | 2/2020 | Chen et al. | |
| 2020/0395460 A1 | 12/2020 | Haratipour et al. | |
| 2021/0202510 A1 | 7/2021 | Thareja et al. | |
| 2021/0398991 A1 | 12/2021 | Manfrini et al. | |
| 2021/0398992 A1 | 12/2021 | Wu et al. | |
| 2022/0376075 A1* | 11/2022 | Manfrini | H01L 29/4908 |
| 2022/0399352 A1 | 12/2022 | Leng | |
| 2023/0067555 A1 | 3/2023 | Sato et al. | |
| 2023/0187476 A1* | 6/2023 | Sato | H10B 53/40 257/295 |
| 2023/0189532 A1 | 6/2023 | Müller | |

FOREIGN PATENT DOCUMENTS

| | | |
|---|---|---|
| JP | 4428500 B2 | 3/2010 |
| KR | 100481867 B1 | 4/2005 |
| KR | 100601953 B1 | 7/2006 |
| KR | 100791074 B1 | 1/2008 |
| KR | 100901950 B1 | 6/2009 |
| WO | 2004076166 A2 | 9/2004 |

OTHER PUBLICATIONS

Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.

Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).

Walters, "Scaling and Design of Thin Film Ferroelectric Hafnium Oxide for Memory and Logic Devices," Dissertation for PhD Philosophy, University of Florida, 2020 (170 pages).

Yeh et al., "Fabrication and Investigation of Three-Dimensional Ferroelectric Capacitors for the Application of FeRAM," AIP Advances, 6 035128(2016); doi: 10.1063/1.4945405. 13 pages.

Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

"Perovskite memory devices with ultra-fast switching speed," News Release Jun. 22, 2021, Pohang University of Science & Technology (Postech), Downloaded on Oct. 19, 2021 from https://www.eurekalert.org/news-releases/603724. (2 pages).

Desu et al., "Reactive ion etching of ferroelectric SrBi2TaxNb2—xO9 thin films," Appl. Phys. Lett. 68, 566 (1996); https://doi.org/10.1063/1.116402. (3 pages).

Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).

Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).

Shi et al., "Reactive ion etching of sol-gel-derived BST thin film," Ceramics International vol. 30, Iss. 7, 2004, pp. 1513-1516. (4 pages).

Jeda et al., "Plasma etching of PZT capacitor using ISM plasma source for ferroelectric memory application," Integrated Ferroelectrics, 39:1-4, 23-30, DOI: 10.1080/10584580108011924. (8 pages).

Wang et al., "Ferroelectric Devices and Circuits for Neuro-Inspired Computing," MRS Communications (2020), 10, 538-548, doi: 10.1557/mrc.2020.71, (11 pages).

Final Office Action dated Apr. 6, 2023 for U.S. Appl. No. 17/396,609.

Final Office Action dated Jul. 19, 2023 for U.S. Appl. No. 17/478,849.

Final Office Action dated Sep. 14, 2023 for U.S. Appl. No. 17/465,792.

Non-Final Office Action dated Apr. 25, 2023 for U.S. Appl. No. 17/478,850.

Non-Final Office Action dated Aug. 3, 2023 for U.S. Appl. No. 17/552,293.

Non-Final Office Action dated Aug. 3, 2023 for U.S. Appl. No. 17/552,323.

Non-Final Office Action dated Aug. 3, 2023 for U.S. Appl. No. 17/552,345.

Non-Final Office Action dated Aug. 15, 2023 for U.S. Appl. No. 17/552,269.

Non-Final Office Action dated Dec. 8, 2022 for U.S. Appl. No. 17/396,609.

Non-Final Office Action dated Jul. 20, 2023 for U.S. Appl. No. 17/50,899.

Non-Final Office Action dated Jul. 20, 2023 for U.S. Appl. No. 17/552,266.

Non-Final Office Action dated Jul. 20, 2023 for U.S. Appl. No. 17/552,330.

Non-Final Office Action dated Mar. 31, 2023 for U.S. Appl. No. 17/465,792.

Non-Final Office Action dated Mar. 31, 2023 for U.S. Appl. No. 17/478,849.

Notice of Allowance dated Aug. 7, 2023 for U.S. Appl. No. 17/858,50.

Notice of Allowance dated Aug. 7, 2023 for U.S. Appl. No. 17/553,486.

Notice of Allowance dated Aug. 7, 2023 for U.S. Appl. No. 17/553,496.

Notice of Allowance dated Aug. 11, 2023 for U.S. Appl. No. 17/478,849.

Notice of Allowance dated Jul. 3, 2023 for U.S. Appl. No. 17/550,904.

Notice of Allowance dated Jul. 17, 2023 for U.S. Appl. No. 17/553,480.

Notice of Allowance dated Jul. 19, 2023 for U.S. Appl. No. 17/553,508.

Notice of Allowance dated Jul. 20, 2023 for U.S. Appl. No. 17/553,469.

(56) References Cited

OTHER PUBLICATIONS

Notice of Allowance dated Jul. 24, 2023 for U.S. Appl. No. 17/553,472.
Notice of Allowance dated Jul. 26, 2023 for U.S. Appl. No. 17/553,511.
Notice of Allowance dated Jun. 15, 2023 for U.S. Appl. No. 17/396,609.
Office Action dated May 16, 2023 for Taiwan Patent Application No. 111132920.
Restriction Requirement dated Apr. 26, 2023 for U.S. Appl. No. 17/550,899.
Restriction Requirement dated Apr. 26, 2023 for U.S. Appl. No. 17/552,266.
Restriction Requirement dated Apr. 26, 2023 for U.S. Appl. No. 17/552,321.
Restriction Requirement dated Aug. 22, 2022 for U.S. Appl. No. 17/396,609.
Restriction Requirement dated Dec. 30, 2022 for U.S. Appl. No. 17/465,92.
Restriction Requirement dated Jan. 11, 2023 for U.S. Appl. No. 17/478,849.
Restriction Requirement dated Jul. 13, 2023 for U.S. Appl. No. 17/552,269.
Restriction Requirement dated May 1, 2023 for U.S. Appl. No. 17/552,330.
Restriction Requirement dated May 1, 2023 for U.S. Appl. No. 17/552,345.
Restriction Requirement dated Sep. 14, 2023 for U.S. Appl. No. 17/465,796.

* cited by examiner

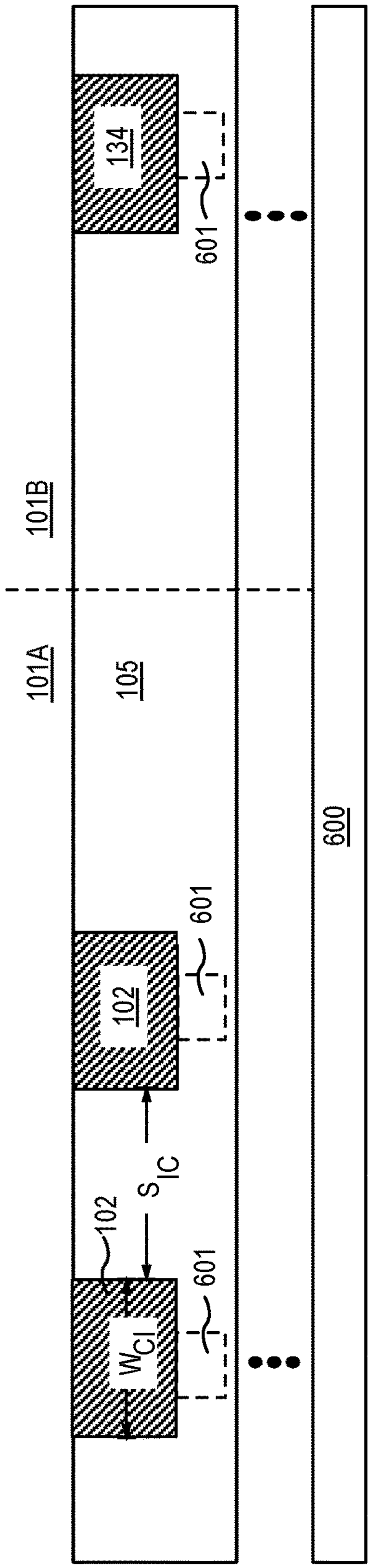
FIG. 6A
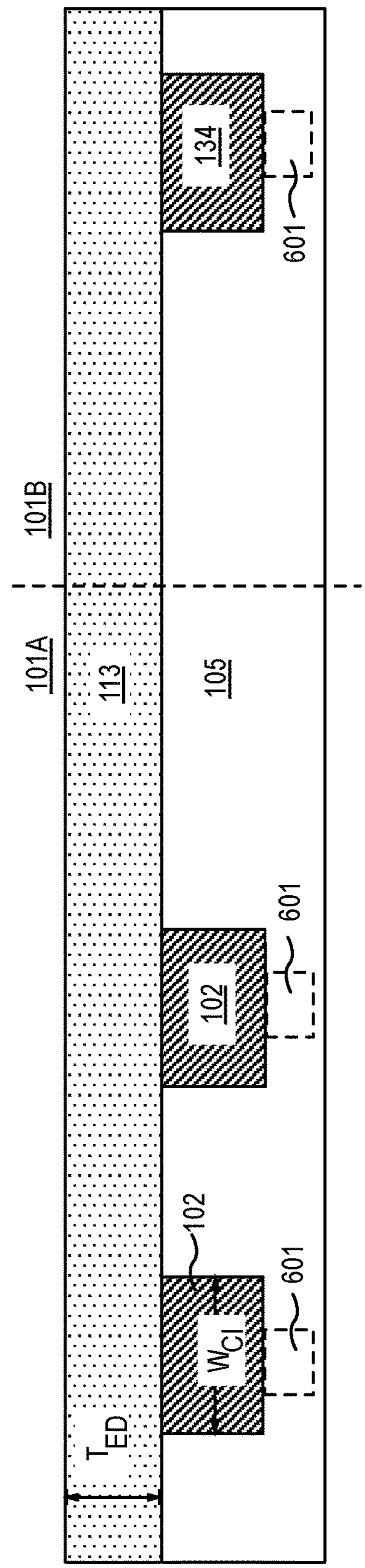
FIG. 6B
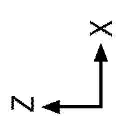

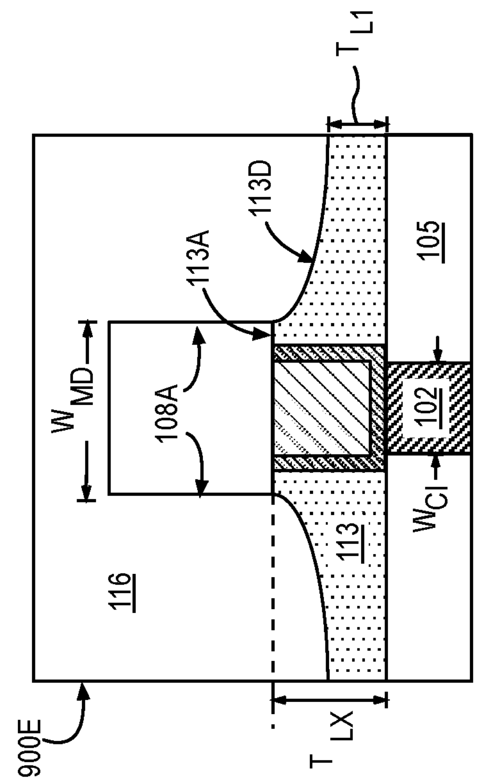
FIG. 9E
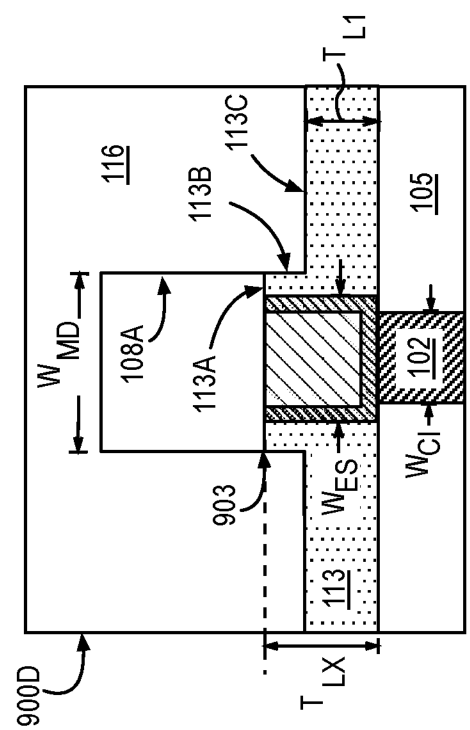
FIG. 9D
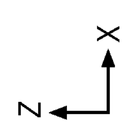

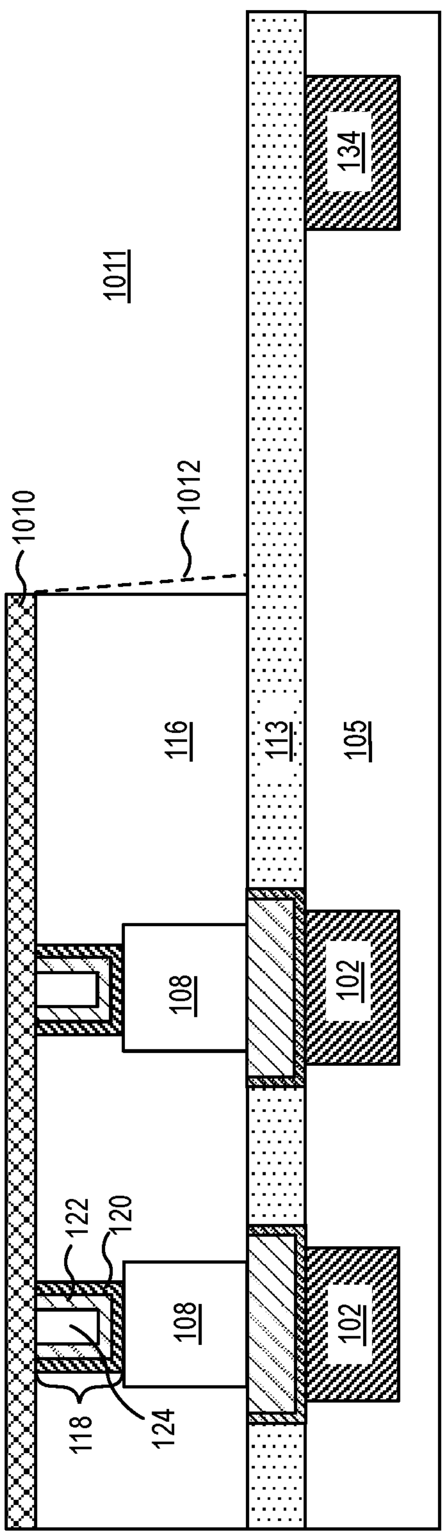
FIG. 10C
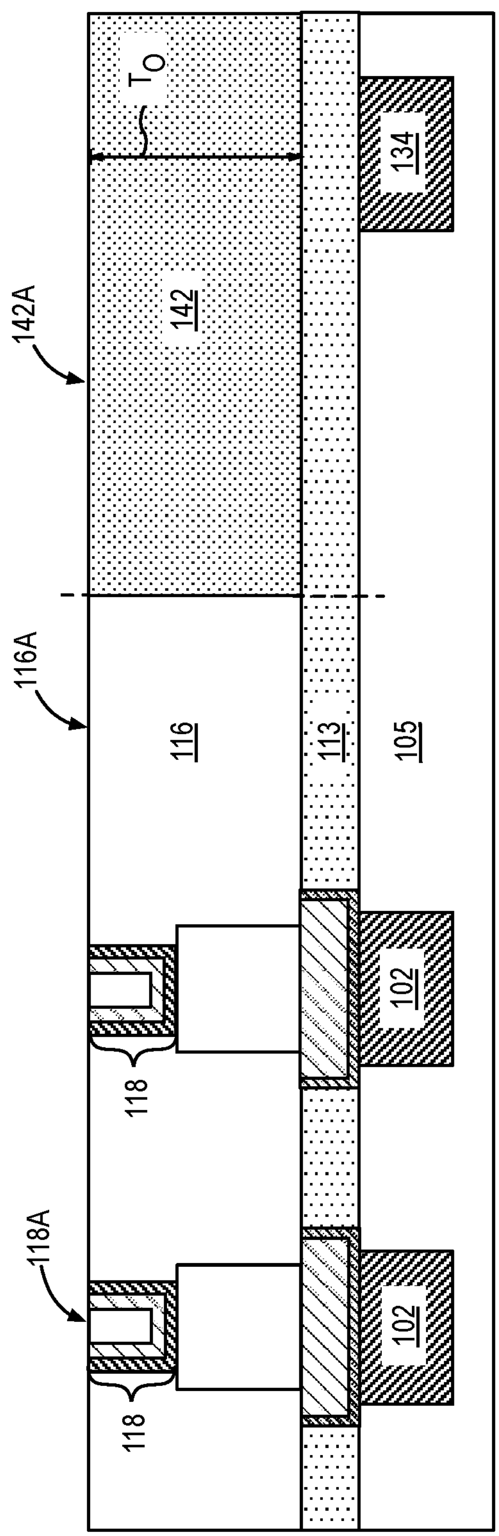
FIG. 10D
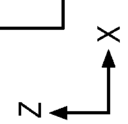

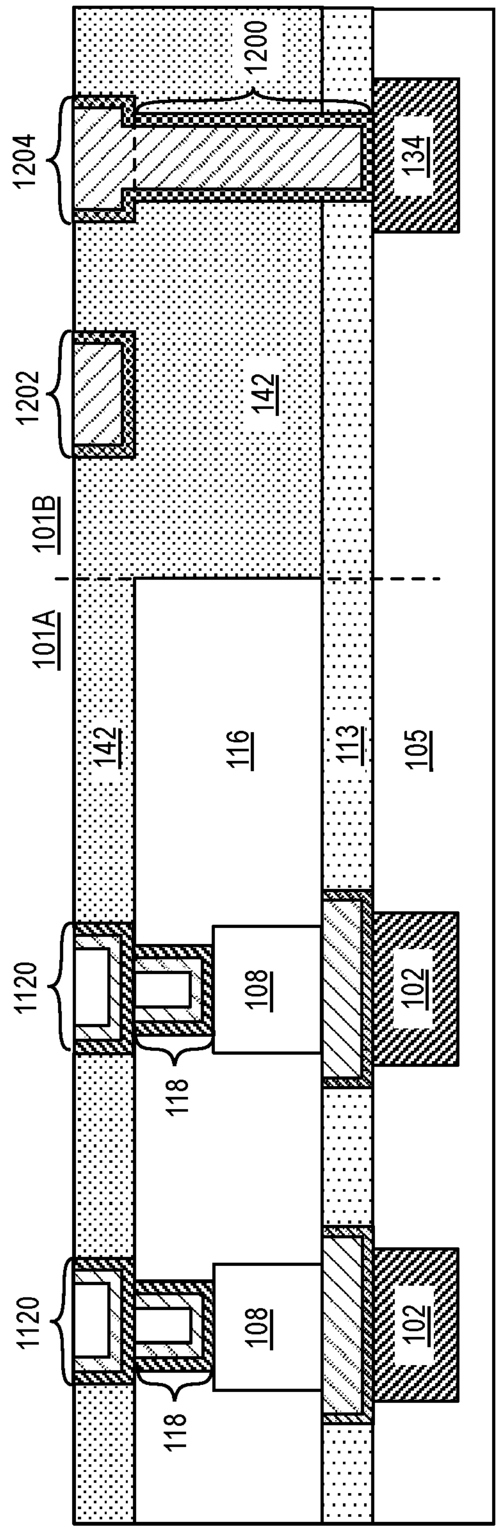
FIG. 12C
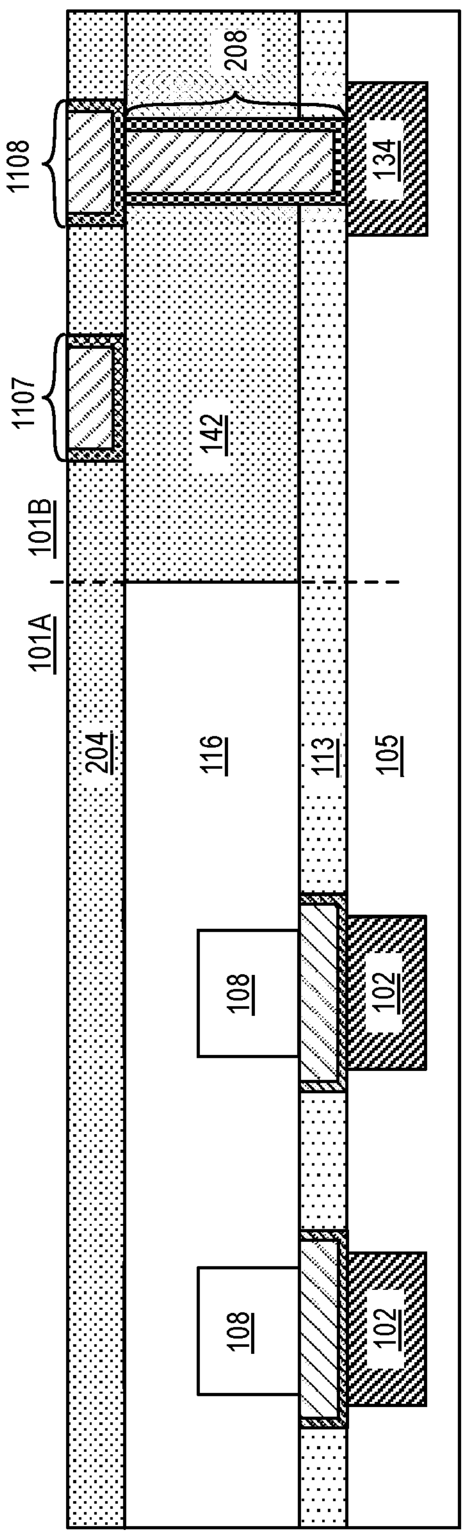
FIG. 13A
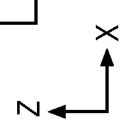

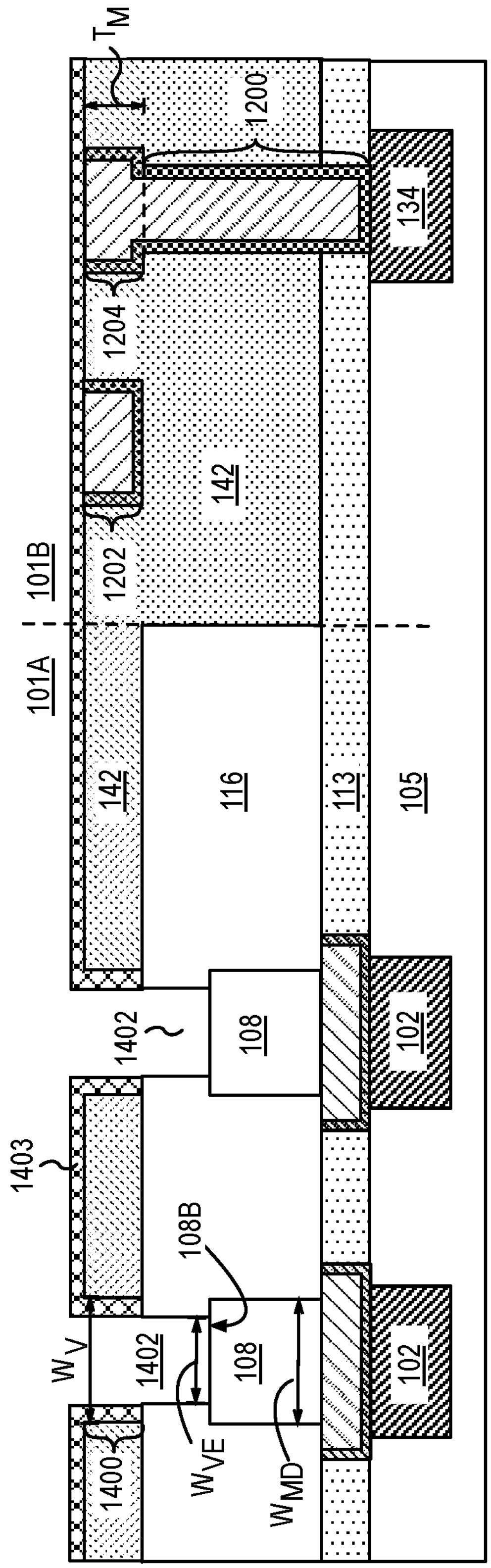
FIG. 14B
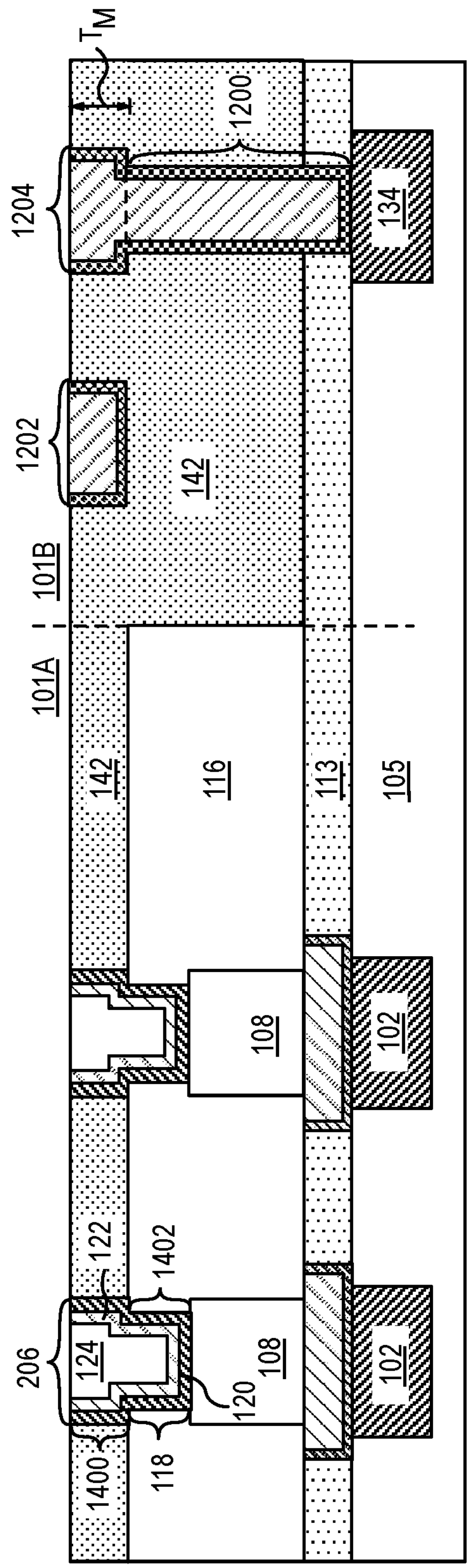
FIG. 14C
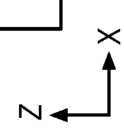

X
Z

Z
X

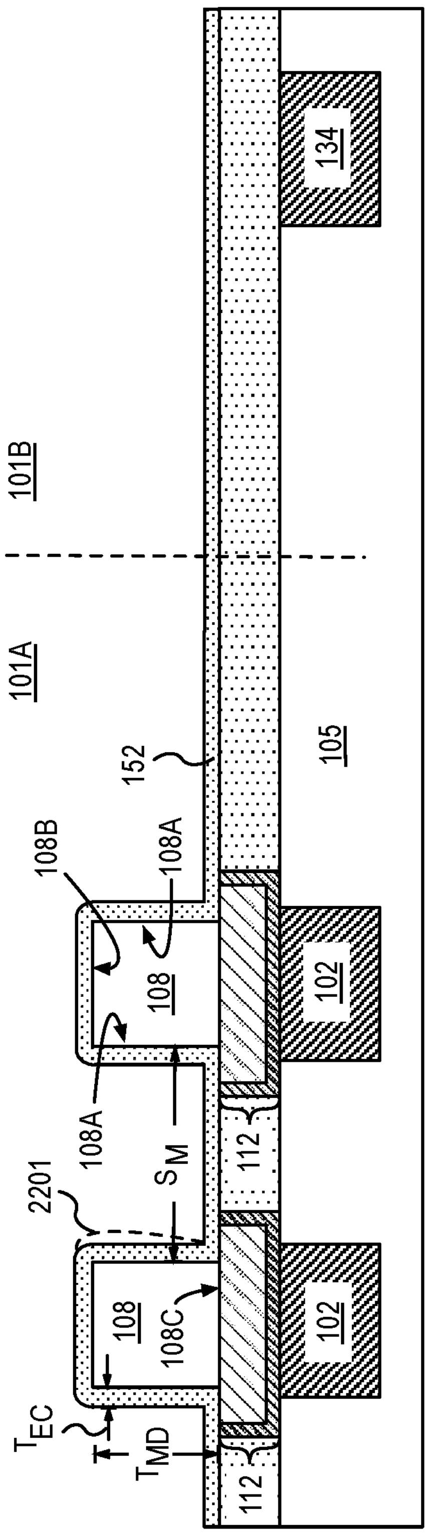
FIG. 22A
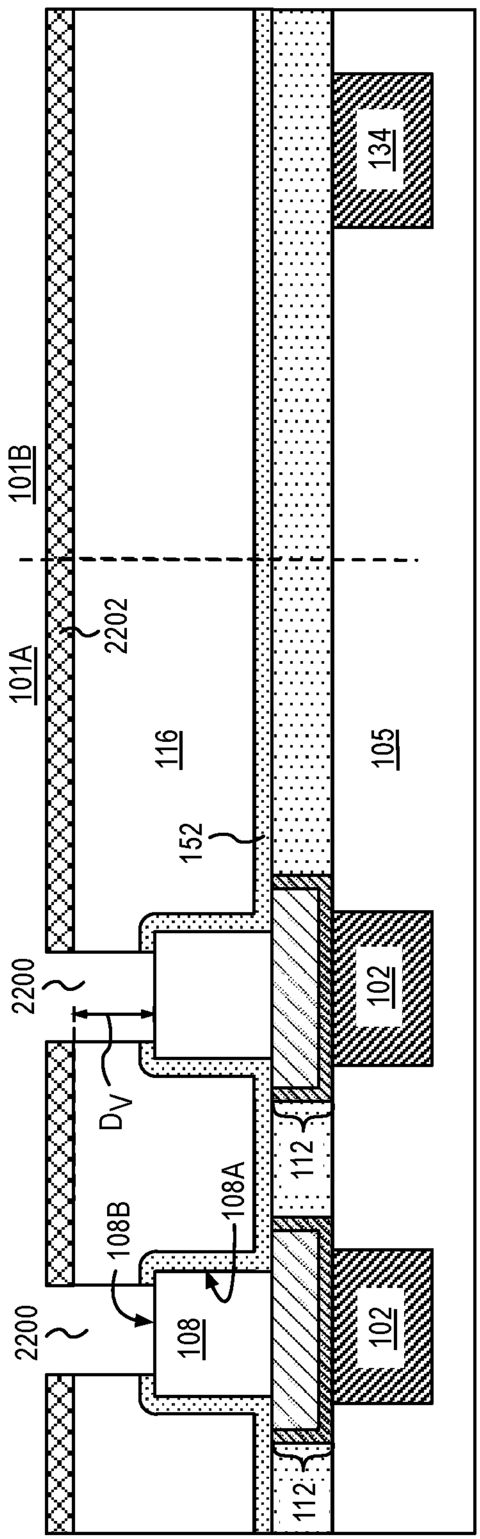
FIG. 22B
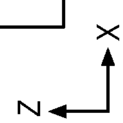

MULTI-LEVEL HYDROGEN BARRIER LAYERS FOR MEMORY APPLICATIONS

CLAIM OF PRIORITY

This Application is a Continuation Application of, and claims the benefit of priority to, U.S. patent application Ser. No. 17/550,904, filed Dec. 14, 2021, and titled "Dual Hydrogen Barrier Layer for Memory Devices," which is incorporated by reference in its entirety for all purposes.

BACKGROUND

Integration of capacitor devices including (ferroelectric or paraelectric materials) on a same plane as interconnects of logic devices can be challenging. The capacitor devices include materials that have a variety of thicknesses and are prone to hydrogen damage. When spacing between devices are scaled formation of barrier layers can be challenging. As such alternate methods to form barriers around capacitor devices and alternative enabling integration methods essential for realizing a high-density capacitor array including ferroelectric and paraelectric materials are desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 6A is a cross-sectional illustration of a plurality of conductive interconnects formed within a first dielectric above a substrate, in accordance with an embodiment of the present disclosure.

FIG. 6B is a cross-sectional illustration of the structure in FIG. 6A following the process to deposit an etch stop layer on conductive interconnects and on the first dielectric.

FIG. 9D is a cross-sectional illustration of a portion of the structure in FIG. 9A, illustrating a shape of the etch stop layer after forming the memory device and depositing the second dielectric, in accordance with an embodiment of the present disclosure.

FIG. 9E is a cross-sectional illustration of a portion of the structure in FIG. 9A, illustrating a shape of the etch stop layer after forming the memory device and depositing the second dielectric, in accordance with an embodiment of the present disclosure.

FIG. 10C is a cross-sectional illustration of the structure in FIG. 10B following the process to planarize and form a via on a memory device and following the process to remove the second dielectric from the logic region.

FIG. 10D is a cross-sectional illustration of the structure in FIG. 10C following the process to deposit a third dielectric in the logic region and planarizing the third dielectric.

FIG. 12C is a cross-sectional illustration of the structure in FIG. 12B following the process to form an electrode on a respective via electrode.

FIG. 13A is a cross-sectional illustration of the structure in FIG. 11C, in an embodiment where via electrodes are not yet fabricated.

FIG. 14B is an illustrative embodiment of the structure in FIG. 14A, following the process to form a plurality of openings in the third and in the second dielectric in the memory region, in accordance with an embodiment of the present disclosure.

FIG. 14C is a cross-sectional illustration of the structure in FIG. 14B following the process to fabricate a trench electrode on a via electrode above a respective memory device.

FIG. 22A is a cross-sectional illustration of the structure in FIG. 8D following the process to deposit encapsulation layer on the memory device.

FIG. 22B is a cross-sectional illustration of the structure in FIG. 22A following the process to form an opening in the second dielectric and in the encapsulation layer.

DETAILED DESCRIPTION

Figure 1A:
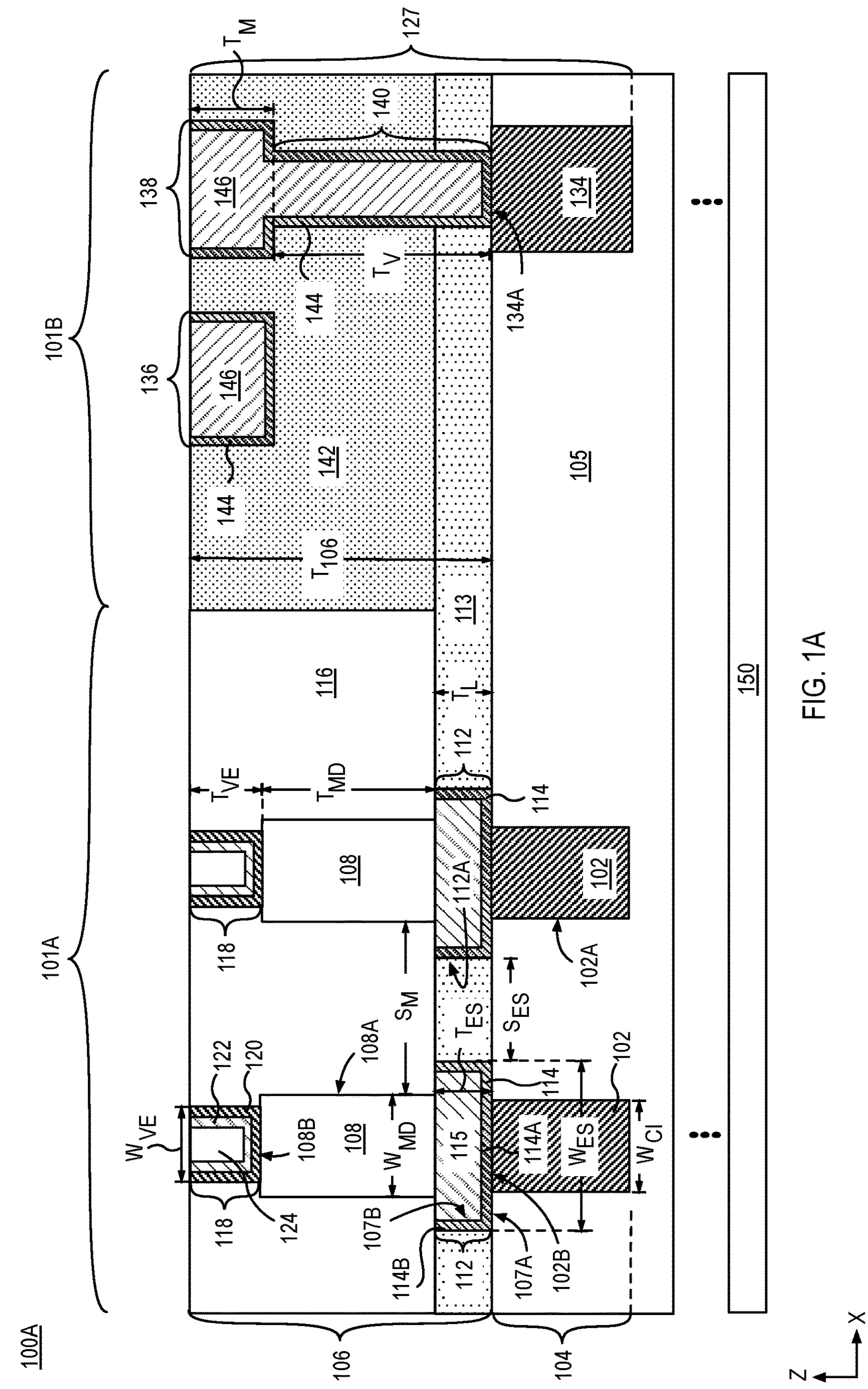
FIG. 1A is a cross-sectional illustration of a device structure including a plurality of memory devices in a memory region adjacent to interconnect structures in a logic region, where each memory device is protected by a combination of conductive and insulative hydrogen barriers, in accordance with an embodiment of the present disclosure.

A dual hydrogen barrier for memory devices and methods of fabrication are described. While various embodiments are described with reference to FeRAM or paraelectric RAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis or y-axis of a device. A material that is between two other materials may be in contact with one or both of those materials. In another example, a material that is between two or other material may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials have been implemented for memory (random access memory or RAM) applications. Perovskite materials have been implemented in capacitors such for high density FeRAM applications owing to their low power consumption and high on/off ratio. Perovskite FeRAM devices (herein FeRAM devices) are also desirable over other forms of memory such as magnetic tunnel junction (MTJ)-based devices due to the relatively low number of layers within a device compared to the MTJ. A typical FeRAM device may be fully operational with three layers, where a ferroelectric dielectric is contained between two electrode layers. The electrode layers may also include Perovskite materials to enable lattice matching and reduction in electrical resistance. Introduction of lead-free Perovskite materials offer additional environmental benefits without sacrificing device performance.

However, FeRAM devices including lead-free Perovskite materials are prone to damage from reaction with hydrogen during processing. Specifically, the damage may be result of hydrogen traveling along grain boundaries between or along electrodes coupled with two terminals of a FeRAM device. Hydrogen can cause reduction when it reacts with the one or more materials of the FeRAM device, such the electrodes or the ferroelectric material itself. Sources of hydrogen during fabrication arise from anneal operations carried to tie up dangling bonds. However, FeRAM devices can lose their polarization hysteresis characteristics as a result of hydrogen reduction.

In some embodiments, the capacitor devices have a planar structure where the individual layers are sequentially layered, one on top of another, where the layers are patterning into cylinder or rectangular shapes. Thus, it is highly desirable to protect capacitor sidewalls, top and bottom surfaces from reacting with hydrogen. In some embodiments, solutions against hydrogen diffusion include forming an insulating barrier layer, such as for example, silicon nitride, to protect sidewalls and top surfaces. A contact electrode at a top of the FeRAM device may be formed by piercing through the insulating barrier layer and exposing one or more top electrode materials. The barrier layer themselves may be further surrounded by additional insulating material such as an interlayer dielectric (ILD). However, the contact electrode formed may be wider than a width of a FeRAM device and can result in erosion of spacer. Spacer erosion can lead to exposure to the adjacent ILD material. ILD material such as silicon oxide or silicon oxide doped with carbon in general do not act as a hydrogen diffusion barrier, and are less desirable directly adjacent to one or more layers of the memory device.

In other examples, hydrogen may diffuse through one or more materials of the contact electrode towards the FeRAM device stack through a top electrode. To protect against hydrogen diffusion through a top surface of the top electrode noble metals have been implemented as part of the contact electrode structure. However, noble metals normally have crystalline structures due to strong metallic bonding. Hence their amorphous phase is thermodynamically unstable favoring transformation into a crystalline phase.

Furthermore, it is to be appreciated that hydrogen can also diffuse from layers below a bottom electrode of the ReRAM device. Typically, the bottom electrode is physically isolated from a conductive interconnect by at least one transition electrode. The conductive interconnect may be laterally surrounded by an ILD. The transition electrode may be laterally surrounded by an insulator layer that can act as a barrier against hydrogen diffusion as well as provide etch stop capability while patterning the ReRAM stack. The insulator layer is typically formed above the ILD and the conductive interconnect. The interface between the transition electrode and the conductive interconnect, can be a pathway for hydrogen diffusion. Depending on a width of the transition electrode relative to the conductive interconnect. the transition electrode may be in contact with the ILD adjacent to the conductive interconnect.

The inventors have devised a scheme to implement a dual hydrogen barrier that includes an insulative hydrogen barrier material directly adjacent to the memory device and a conductive hydrogen barrier that is integrated as part of the contact electrode. In some embodiments, the contact electrode may have a shape of a via that include a conductive hydrogen barrier having a first portion directly in contact with the memory device and a second portion that laterally surrounds a conductive (contact) material. The conductive contact material may further include one or more layers. The contact electrode may extend over a portion or an entire uppermost surface of the memory device.

To provide a barrier against hydrogen diffusion towards a bottom electrode, the transition electrode may also include a conductive hydrogen barrier material. The structure of the transition electrode may depend on the size of the memory device relative to the transition electrode. In embodiments, the transition electrode may include a conductive hydrogen barrier laterally surrounding a conductive material. In other embodiments, the transition electrode may include conductive hydrogen barrier directly across a top portion and in direct contact with the memory device.

To provide a barrier against hydrogen diffusion directly into sidewalls of the memory device, a dielectric that is amorphous, having a high film density (a film density above 90% of theoretical material density or film density) and is electrically insulating, may be directly in contact with the sidewalls of the memory device. Furthermore, when memory devices are integrated in a high density array, the space between the devices may not be large enough to deposit a barrier liner (spacer) as well as an ILD. In some such instances the high film density-dielectric is present over the entire memory region. Memory devices in the memory region may be directly adjacent to a logic region within a memory level, for system functionality. In particular, the ferroelectric devices may be directly adjacent to routing interconnects in the logic region. To minimize line capacitance, the routing interconnects are embedded within a low dielectric constant interlayer dielectric (ILD), where the ILD has a low film density (less than 90% film density) or a high porosity material.

The ferroelectric capacitors may be integrated with transistors in a memory region of a substrate. For example, ferroelectric capacitors may be on a memory level above a transistor level. There may be one or more layers of conductive interconnects between the ferroelectric capacitors (herein ferroelectric devices) and transistors in the transistor level.

A vertical thickness or height of a single level of routing interconnects (herein interconnect level) is determined by a combined thickness of one or more stacked vias and metal lines within the routing interconnects and is substantially fixed. To minimize fabrication cost, it is highly desirable to match a height of the memory level with a height of a single level of routing interconnects. The single level may include one or more stacked conductive interconnects such as a metal line on a via, or a via on a via.

For manufacturability ferroelectric devices may be generally formed directly above conductive interconnects that are coupled with transistors on a lower level. When a conductive interconnect includes copper, it is high desirable to not etch a ferroelectric device and expose the copper conductive interconnect. In such instances, an etch stop layer may be inserted between the conductive interconnect and the ferroelectric device. The etch stop layer also acts as a hydrogen barrier layer to prevent diffusion of hydrogen from a dielectric adjacent to the conductive interconnect to one or more memory devices in a layer above. However, to provide electrical conductivity between the ferroelectric device and the conductive interconnect, a transition electrode may be inserted between a ferroelectric device and a conductive interconnect. The transition electrode may be embedded within the etch stop layer. Because the transition electrode is embedded within the etch stop layer, alignment and sizing requirements of the etch stop layer relative to the conductive interconnect (or the ferroelectric device) may be relaxed. Additionally, the shape of the transition electrode may be independent of a shape of the conductive interconnect.

The ferroelectric device may be patterned by a plasma etch process. Depending on a shape and size of the ferroelectric device relative to the transition electrode, the plasma etch process may etch portions of the transition electrode and/or the etch stop layer. A resulting shape of the transition electrode and/or the etch stop layer adjacent to the ferroelectric device may partially depend on thicknesses of the transition electrode and/or the etch stop layer.

The ferroelectric device spans a height that depends on thickness of individual layers in the ferroelectric devices. Thus, depending on the thicknesses of the individual layers, the height of the ferroelectric device can vary depending on application. In general, the transition electrode has a fixed thickness. In order to maintain a height of the memory level, individual thicknesses of the ferroelectric devices and the via electrodes may be co-dependently tuned. For example, when the ferroelectric device has a reduced thickness, the thickness of the via electrode may be increased, and vice versa.

To enable high density FeRAM devices the inventors have resorted to non-lead-based perovskite materials owing its environmental friendliness for mass production. A stack for ferroelectric capacitors can include one or more hardmask materials. The one or more hardmask materials can include dielectric materials, metallic materials or a combination thereof. Implementation of an etch with high selectivity (such as a reactive ion etching, or plasma etch process) between the hardmask and device layers can advantageously enable patterning.

In some embodiments, the conductive interconnects coupled with a respective ferroelectric device are discrete island structures. In other embodiments, the conductive interconnect may be a continuous trench line, where a plurality of ferroelectric devices may be coupled with the trench line. In some such embodiments, the transition electrode may be continuous between a respective ferroelectric device and extend along a length of the trench line. In other embodiments, the conductive interconnect may be discrete, but the transition electrode (herein electrode structure) may be continuous between two or more adjacent capacitors. In further embodiments, the conductive interconnects are discrete, but a top electrode of individual ferroelectric capacitors are coupled together by a single conductive plate.

FIG. 1A is a cross-sectional illustration of a device structure 100A, including a region 101A, adjacent to a region 101B above a substrate 150. The region 101A and 101B may be, for example, a memory region and a logic region, respectively or vice versa. In the illustrative embodiment, region 101A is a memory region 101A and region 101B is a logic region 101B. The memory region 101A includes a plurality of conductive interconnects within level 104. Each conductive interconnect 102 is substantially identical within level 104. The conductive interconnect 102 is laterally surrounded by a dielectric 105. The dielectric 105 includes a material having a low film density, such as for example density less than 90% of theoretical material density. In some embodiments, dielectric 105 includes a material having a dielectric constant that is below 3.5. Dielectric 105 may include $SiO_2$, SiOC, SiC or $SiO_2$ doped with F. The device structure 100A further includes a level 106 above level 104. Level 106 include a plurality of memory devices each including one or more ferroelectric materials or one or more paraelectric materials. In the illustrative embodiment, each memory device 108 within device structure 100A are substantially identical. While two memory device such as memory devices 108 are illustrated, an array can have more than 1000 substantially identical memory devices 108. As shown, each memory device 108 is above and electrically coupled with a respective conductive interconnect 102.

As shown, an electrode structure 112 is coupled between a respective memory device 108 and a respective conductive interconnect 102. The electrode structure 112 is laterally surrounded by an etch stop layer 113. In exemplary embodiments, etch stop layer 113 includes a dielectric material. In exemplary embodiments, the dielectric material of the etch stop layer 113 does not include a metal. The electrode structure 112 may cover an entire top surface or at least a portion of the top surface of conductive interconnect 102, depending on a lateral thickness (or width), $W_{ES}$, of electrode structure 112 compared to a lateral thickness, $W_{CI}$, of conductive interconnect 102. In the illustrative embodiment, $W_{ES}$, is greater than $W_{CI}$. In embodiments where $W_{ES}$, is greater than $W_{CI}$, electrode structure 112 is also on a portion of the dielectric 105. In some such embodiments, hydrogen may diffuse from the dielectric 105 to the memory device 108. For example, interface 107A between electrode structure 112 and dielectric 105, and interface 107B between electrode structure 112 and etch stop layer 113 may provide pathways for hydrogen diffusion. To prevent hydrogen diffusion through interfaces 107A and 107B, electrode structure 112 can include a hydrogen barrier layer along interfaces 107A and 107B.

The hydrogen barrier layer may have various structural embodiments. In the illustrative embodiment, electrode structure 112 includes a conductive hydrogen barrier 114 and a conductive fill material 115 adjacent to conductive hydrogen barrier 114. As shown, conductive hydrogen barrier 114 extends along interfaces 107A and 107B and is in contact with uppermost surface 102B of conductive interconnect 102. In the illustrative embodiment, conductive hydrogen barrier 114 includes a portion 114A which is below conductive fill material 115 and a portion 114B that laterally surrounds conductive fill material 115. Portion 114B is directly between conductive fill material 115 and etch stop layer 113. Portion 114A is directly between conductive fill material 115 and conductive interconnect 102. In the illustrative embodiment, where $W_{ES}$, is greater than $W_{CI}$, portion 114A is also directly in contact with the dielectric 105. Conductive hydrogen barrier 114 and etch stop layer 113 form a dual hydrogen barrier from below the memory device 108.

Conductive hydrogen barrier 114 includes a material that is amorphous. Amorphous materials lack defined grain boundaries that can facilitate hydrogen diffusion and are thus desirable. Embodiments of the conductive hydrogen barrier 114 include materials such as, but not limited to, TiAlN with >30 atomic percent AlN, TaN with >30 atomic percent N, TiSiN with >20 atomic percent SiN, Ta carbide, (TaC), Ti carbide (TiC), tungsten carbide (WC), tungsten nitride (WN), carbonitrides of Ta, Ti, W, i.e., TaCN, TiCN, WCN, titanium monoxide (TiO), titanium oxide ($Ti_2O$), tungsten oxide (WO3), tin oxide ($SnO_2$), indium tin oxide (ITO), iridium oxide, indium gallium zinc oxide (IGZO), zinc oxide or METGLAS series of alloys, e.g., $Fe_{40}Ni_{40}P_{14}B_6$ (METGLAS is a Honeywell™). In some embodiments, the conductive hydrogen barrier 114 has a thickness that is less than 5 nm.

The device structure 100A further includes a second dielectric, such as dielectric 116 spanning the entire memory region 101A. In exemplary embodiments, the dielectric 116 includes a hydrogen barrier material where the hydrogen barrier material is amorphous, has a high film density (a film density above 90% of theoretical material density) and is electrically insulating. Amorphous materials prevent diffusion along grain boundary. High film density prevents diffusion through interconnected pores, closing all diffusion pathways. In an embodiment, dielectric 116 includes a transition metal and oxygen, such as for example $Al_xO_y$, $HfO_x$, $ZrO_x$, $TaO_x$, $TiO_x$, $AlSiO_x$, $HfSiO_x$ or $TaSiO_x$. In other embodiments, dielectric 116 includes a nitride of Al, Zr or Hf, for example AlN, ZrN, or HfN. The dielectric 116 may include a high density SiOx, SiN, SiCN, SiC or SiON. A high density material has film density greater that 90% of theoretical material density. The dielectric 116 does not include low density $SiO_x$, SiN, SiCN, SiC or SiON. A low density material has film density less than 90% of theoretical material density.

As shown dielectric 116 laterally surrounds each memory device and is in direct contact with sidewalls 108A. In the illustrative embodiment, dielectric 116 spans an entire space between any two adjacent memory devices 108. In some embodiments, the dielectric 116 is also on portions of an uppermost surface 108B of the memory device 108, such as is shown.

Figure 1B:
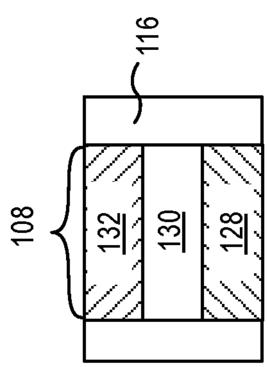
FIG. 1B is a cross-sectional illustration of layers within a memory device, where each memory device is protected by a combination of conductive and insulative hydrogen barriers, in accordance with an embodiment of the present disclosure.

In embodiments, the dielectric 116 includes a material that is compatible with the selection of ferroelectric oxide within the memory device 108. Depending on embodiments, memory device 108 can have three or more layers. An embodiment of the memory device 108 including three layers is illustrated in FIG. 1B. As shown, memory device 108 includes at least a bottom electrode 128, a dielectric layer 130 and a top electrode 132.

In an embodiment, bottom electrode 128 and top electrode 132 include a conductive ferroelectric oxide (when memory device 108 is a ferroelectric memory device 108). The conductive ferroelectric oxide includes one of a non-Pb perovskite metal oxides, such as but not limited to, La—Sr—$CoO_3$, $SrRuO_3$, La—Sr—$MnO_3$, $YBa_2Cu_3O_7$, $Bi_2Sr_2CaCu_2O_8$, or $LaNiO_3$.

In an embodiment, dielectric layer 130 is a ferroelectric dielectric layer 130 that includes non-Pb perovskite material in the form $ABO_3$, where A and B are two cations of different sizes and O is Oxygen. A is generally larger than B in size. In some embodiments, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, ferroelectric dielectric layer 130 includes low voltage ferroelectric material sandwiched between top electrode 132 and bottom electrode 128. These low voltage FE materials can be of the form $AA'BB'O_3$, where A' is a dopant for atomic site A and can be an element from the Lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 2-Volts is sufficiently low to be characterized as low voltage.

The ferroelectric dielectric layer 130 is chosen to have a similar young's modulus as the dielectric 116. Furthermore, dielectric 116 is chosen to have a low probability of presence of defects at the interface between dielectric and the ferroelectric dielectric layer 130. Additionally, dielectric 116 has a lower dielectric constant than the dielectric constant of the ferroelectric dielectric layer 130 to enable field lines to be concentrated between the top electrode 132 and the bottom electrode 128. In some embodiments, the ferroelectric dielectric layer 130 can dictate a choice of the dielectric 116.

For example, in some embodiments, where ferroelectric dielectric layer 130 include a $Pb_xZr_{1-x}Ti_yO_3$ group of families, dielectric 116 can include $Al_xO_y$, $HfO_x$, $ZrO_x$, $TaO_x$ or $TiO_x$. In some embodiments, where ferroelectric dielectric layer 130 include a $La_xBi_{1-x}Fe_yO_3$ group of families, dielectric 116 can include $Al_xO_y$, $HfO_x$, $ZrO_x$, $TaO_x$ or $TiO_x$. In some embodiments, where ferroelectric dielectric layer 130 include a $BaTiO_3$ group of families, dielectric 116 can include $Al_xO_y$, $HfO_x$, $ZrO_x$, $TaO_x$ or $TiO_x$. In some embodiments, where ferroelectric dielectric layer 130 include a $BiFeO_3$ group of families, dielectric 116 can include $Al_xO_y$, $HfO_x$, $ZrO_x$, $TaO_x$ or $TiO_x$.

In the illustrative embodiment, level 106 further includes a via electrode 118 coupled with each memory device 108. The via electrode 118 may include different structures. In each embodiment, the via electrode 118 includes at least one conductive hydrogen barrier, such as conductive hydrogen barrier 120 on the memory device 108, a liner layer 122 on the conductive hydrogen barrier 120 and a conductive fill material 124 on the liner layer 122. In the illustrative embodiment, the conductive hydrogen barrier 120 laterally surrounds the liner layer 122, and the liner layer 122 laterally surrounds the conductive fill material 124. The conductive fill material 124 may include a material such as tantalum, titanium, ruthenium, tungsten, molybdenum or copper.

In the illustrative embodiment, the conductive hydrogen barrier 120 is on a portion of the uppermost surface 108B and directly adjacent to the dielectric 116. In one such embodiment, the conductive hydrogen barrier 120 and the dielectric 116 combine to provide a seal against hydrogen diffusion to uppermost surface 108B and to sidewalls 108A.

Embodiments of the conductive hydrogen barrier 120 include a material that is amorphous. Amorphous materials lack defined grain boundaries that can facilitate hydrogen diffusion and are thus desirable. Embodiments of the conductive hydrogen barrier 120 include materials such as, but not limited to, TiAlN, with >30 atomic percent AlN, TaN, with >30 atomic percent $N_2$, TiSiN, with >20 atomic percent SiN, Ta carbide, Ti carbide, tungsten carbide, tungsten nitride, carbonitrides of Ta, Ti, W, i.e., TaCN, TiCN, WCN, titanium monoxide, titanium oxide, tungsten oxide, tin oxide, indium tin oxide, iridium oxide, indium gallium zinc oxide, zinc oxide, or METGLAS series of alloys, e.g., $Fe_{40}Ni_{40}P_{14}B_6$ (METGLAS is a Honeywell™). In some embodiments, the conductive hydrogen barrier 120 has a thickness that is dependent on $W_{VE}$. In some embodiments, conductive hydrogen barrier 120 has a thickness that is less than 5 nm. It is to be appreciated that conductive hydrogen barrier 120 may include a material that is the same or different from the material of conductive hydrogen barrier 114.

Figure 1C:
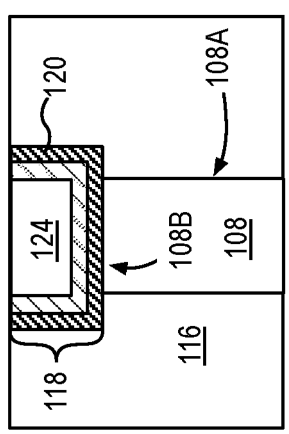
FIG. 1C is an illustrative embodiment of the device structure where a via electrode extends over an entire uppermost surface of the memory device.
Figure 1D:
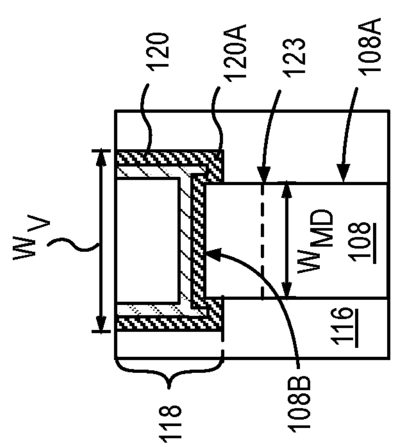
FIG. 1D is a cross-sectional illustration of a portion of the device structure in FIG. 1A, in an embodiment where a via electrode extends on a sidewall portion below the uppermost surface of the memory device.

The extent to which the dielectric 116 is on the memory device 108 is dependent on a lateral width, WMA, of the memory device 108 compared to a width, $W_{VE}$, of the via electrode 118. In some embodiments, as is illustrated in FIG. 1C, the memory device 108 has a width, $W_{MD}$, that is less than the width, $W_{VE}$. In some such embodiments, dielectric 116 is directly in contact with sidewalls 108A but not uppermost surface 108B. In other embodiments, the via electrode 118 depicted in FIG. 1C, extends below the uppermost surface 108B of the memory device 108, as illustrated in FIG. 1D. In the illustrative embodiment, conductive hydrogen barrier 120 includes a portion 120A that is adjacent to sidewall 108A and below uppermost surface 108B. To prevent shorting and/or cause device degradation, the conductive hydrogen barrier 120 does not extend below an interface 123 (indicated by dashed lines) between a ferroelectric oxide layer and one or more top electrode layers. As further illustrated, depending on a thickness of the conductive hydrogen barrier 120 and relative widths, $W_{VE}$ and $W_{MD}$ liner layer 122 may also have a portion at or below the uppermost surface 108B. In the illustrative embodiment, liner layer 122 has a lower most portion that is substantially at a level of the uppermost surface 108B. In some embodiments, liner layer 122 has a lower most portion that is at a level above the uppermost surface 108B. In other embodiments, liner layer 122 has a lower most portion that is at a level below the uppermost surface 108B.

Figure 1E:
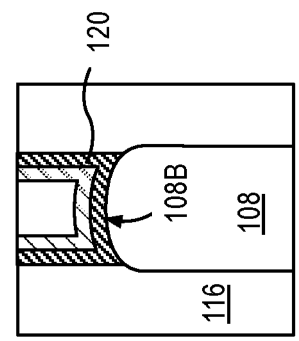
FIG. 1E is a cross-sectional illustration of a portion of the device structure in FIG. 1A, where a conductive hydrogen barrier via matches a contour of the uppermost surface of the memory device, in accordance with an embodiment of the present disclosure.

In some embodiments, the conductive hydrogen barrier 120 matches a contour of the uppermost surface 108B as illustrated in FIG. 1E. In some such embodiments, the combination of conductive hydrogen barrier 120 and the dielectric 116 provide barriers against hydrogen diffusion towards memory device 108.

Referring again to FIG. 1A, the conductive interconnect 102, electrode structure 112 and the memory device 108 can have widths that are substantially independent of each other. A spacing, $S_M$, between adjacent memory devices 108 depends on which of the conductive interconnect 102, electrode structure 112 and the memory device 108 has the largest width. In embodiments, when $W_{ES}$ is greater than $W_{MD}$, and $W_{CI}$, as is shown, $S_M$ is determined by a spacing, SES, between the adjacent electrode structures 112. In some such embodiments, $S_M$ is larger than SES and $S_M$ may range between 20 nm and 50 nm.

Reduction in SES, also leads to reduction in $S_M$. However, dielectric 116 provides further advantages when SES is reduced. Dielectric 116 permits adequate insulation and prevents hydrogen from diffusing against sidewalls 108A such that no spacer is needed between memory device 108 and dielectric 116.

Figure 1F:
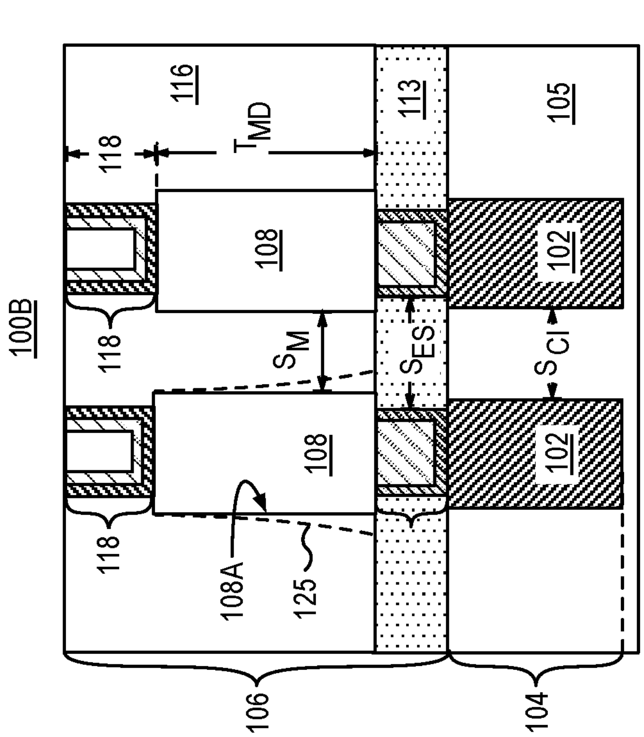
FIG. 1F is a cross-sectional illustration of the device structure in FIG. 1A, in an embodiment where the spacing between two adjacent memory devices is less than a spacing between electrode structures directly below two adjacent memory devices.

Dielectric 116 may provide further advantages when $S_M$ is less than $S_{ES}$ FIG. 1F is a cross-sectional illustration of the device structure 100B, in accordance with an embodiment of the present disclosure. Logic region 101B is not shown for clarity. Device structure 100B is an embodiment of the device structure 100A. In the illustrative embodiment, $W_{ES}$ is less than $W_{MD}$, and $W_{CI}$. When $W_{ES}$ is less than $W_{MD}$, and when $W_{MD}$ is greater than $W_{CI}$, $S_M$ can be less than $S_{ES}$, as shown. In some such embodiments, $S_M$, can be between 20 nm and 50 nm. Reducing $S_M$ can advantageously increase the density of memory devices per unit plan view area of device structure 100B. While two memory devices 108 are shown, the memory region can include 1000 memory devices arranged in an array.

In some embodiments, the spacing, $S_M$, between adjacent memory devices 108 may be comparable to or less than height, $T_{MD}$, of the memory device 108. In some such embodiments, a single dielectric 116 including a material that can act as a barrier against hydrogen diffusion can be implemented without inclusion of spacers adjacent to memory devices 108. In some embodiments, avoiding implementation of spacer layer adjacent to memory devices 108 can also help to tune the height, $T_{MD}$, of memory device 108.

In some embodiments, $S_M$ may depend on a total thickness of layers in the stack of the memory device 108. In some embodiments, sidewalls 108A are tapered as indicated by dashed lines 125. The taper in sidewall 108A can reduce $S_M$. Taper in sidewall 108A may increase with a taller stack (or an increase in $T_{MD}$) further reducing $S_M$. However, memory device 108 may need to have a minimum height for device functionality. In some such embodiments, a single dielectric such as dielectric 116 provides substantial advantages as density of memory devices 108 is increased because a single insulator material can be present in the space between two adjacent memory devices 108. Reduction in $S_M$ reduces space to implement a spacer.

Figure 1G:
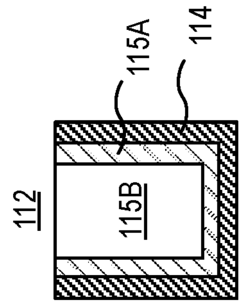
FIG. 1G is a cross-sectional illustration of an embodiment of an electrode structure that includes a liner layer between a conductive hydrogen barrier and a conductive fill material.

In general, the lateral thicknesses $W_{CI}$, and $W_{ES}$ can be independent of each other. A $W_{ES}$ that is greater than $W_{CI}$ or $W_{CI}$ and $W_{MD}$, may determine choice of material of electrode structure 112 and conductive fill material 115. The conductive fill material 115 may include a material such as tantalum, titanium, ruthenium, tungsten, molybdenum or copper. For example, when $W_{ES}$ is greater than $W_{MD}$, electrode structure 112 may not include a material such as copper to prevent sputtering of the electrode structure 112 during fabrication of the memory device 108. When $W_{ES}$ is less than $W_{MD}$ (as illustrated in FIG. 1F) conductive fill material 115 may include copper. In some embodiments, depending on the material, the conductive fill material 115 can further include an adhesion liner 115A and a fill metal 115B on the adhesion liner 115A as illustrated in FIG. 1G.

Referring again to FIG. 1A, in different embodiments, $W_{CI}$ can depend on a plan view shape of the conductive interconnect 102. Conductive interconnect 102 and the electrode structure 112 can have a variety of plan view shapes as will be discussed below. The relative shapes (discussed below) of the electrode structure 112 and conductive interconnect 102 can determine relative alignment between sidewalls 112A and 102A. In some embodiments, the memory device 108 can be directly in contact with the conductive hydrogen barrier 114, if $W_{MD}$ and $W_{ES}$ are substantially similar and if there is positional misalignment.

In some embodiments, etch stop layer 113 includes a material such as silicon, nitrogen and/or carbon. In exemplary embodiments, etch stop layer 113 includes a material that is different from the material of the dielectric 116. The etch stop layer 113 and the electrode structure 112 have a thickness that is determined by a vertical thickness of the memory device 108 and thickness, $T_{106}$, of the level 106. As shown the etch stop layer 113 has a vertical thickness, $T_L$, and the electrode structure 112 has a vertical thickness $T_{ES}$. In the illustrative embodiment, $T_L$, is substantially equal to $T_{ES}$. As such an uppermost surface 113A is co-planar or substantially co-planar with uppermost surface 112B. In some embodiments, portions of the uppermost surface 112B is concaved due to a processing methodology utilized. Thicknesses of conductive hydrogen barrier 114 and conductive fill material are determined by a desired $T_{ES}$. In most embodiments thickness of conductive fill material 115 is equal to or greater than that the thickness of the conductive hydrogen barrier 114.

Relative size of $W_{CI}$, $W_{ES}$ and $W_{MD}$, can also provide flexibility in a thickness of the etch stop layer 113 or electrode structure 112. In some examples when $W_{ES}$ is greater than $W_{MD}$, TES and TEL can be relatively thinner compared to when $W_{ES}$ is less than $W_{MD}$ because of process margins to be discussed below.

As shown, and via electrode 118 has a vertical thickness, $T_{VE}$. Level 106 has a vertical thickness, $T_{106}$ that is substantially equal to a combined sum of $T_{ES}$, $T_{MD}$, and $T_{VE}$. It is to be appreciated that individual thicknesses $T_{ES}$, $T_{MD}$, and $T_{VE}$ may be co-dependently chosen to optimize performance of memory device 108. For example, $T_{MD}$ may vary between 30 nm and 90 nm and $T_{ES}$ and $T_{VE}$ may be adjusted co-dependently to balance $T_{106}$.

In the illustrative embodiment, logic region 101B includes an interconnect structure 127 spanning levels 104 and 106. Interconnect structure 127 includes one or more conductive interconnects in level 104 and one or more vias and metal lines coupled with conductive interconnect 134 in level 106. In the illustrative embodiment, interconnect structure 127 includes conductive interconnect 134 in level 104 and a plurality of metal lines 136 and 138, where metal line 138 is coupled with conductive interconnect 134 through via structure 140. Metal line 138 may be coupled with a conductive interconnect through a via on a different plane, behind the plane of the illustration.

In the illustrative embodiment, level 106 within the logic region further includes a dielectric 142 on the etch stop layer 113, where dielectric 142 is directly adjacent to the dielectric 116. Dielectric 142 includes a material that is designed to minimize electrical impact to logic circuitry, for example signal delays such as RC delays. Such electrical impact can arise due to scaling in feature sizes of metallic interconnects, such as vias and metal lines, as well as due to reduction in space between them. Increase in capacitive coupling and electrical resistance can increase signal delays. However, reducing a dielectric constant of the dielectric 116 can ameliorate electrical impact. Lowering the dielectric constant may be generally associated with increasing porosity in the film. Film porosity may be greater than 90 atomic percent by volume in dielectric 116. In some embodiments dielectric 142 has a dielectric of approximately 3.5 or less. In embodiments dielectric 142 includes silicon and oxygen (such as low K $SiO_2$). In the illustrative embodiment, dielectric 142 laterally surrounds at least a portion of the via structure 140. Depending on $T_L$ an $T_{106}$, dielectric 142 includes a material with a low film density (a film density much below 90% of theoretical material density) for example low density $SiO_2$, carbon doped oxide (CDO), SiOC, SiCN, SiC, SiOxNy, F-doped oxides, or H-doped oxides.

In the illustrative embodiment, etch stop layer 113 extends continuously from memory region 101A to logic region 101B. At least a portion of the via structure 140 is adjacent to the etch stop layer 113, as shown. The etch stop layer 113 may be in contact with the conductive interconnect 134 depending on a lateral thickness of the via structure 140. In some embodiments, such as is shown, at least a portion of the etch stop layer 113 is on the conductive interconnect 134.

Via structure 140 has a vertical thickness, $T_V$, as measured from a lower most point of level 104 or from surface 134A of conductive interconnect 134, and metal line 138 has a vertical thickness, $T_M$. In exemplary embodiments, a combined sum of $T_M$ and $T_V$ is equal to a combined sum of individual thicknesses $T_{ES}$, $T_{MD}$, and $T_{VE}$. In general, $T_M$ and $T_{VE}$ need not be equal. In some embodiments, $T_{VE}$ is between 80%-100% of $T_M$. In some embodiments, $T_M$ is between 20 nm and 50 nm. In other embodiments, $T_M$ is between 50 nm and 200 nm.

In an embodiment, $T_{MD}$ has a thickness between 10 nm and 100 nm and $T_{ES}$ has a thickness between 2 nm and 20 nm. In an embodiment, sum of $T_{MD}$ and $T_{ES}$ is approximately between 85%-100% of $T_V$. In some embodiments, $T_V$ is between 20 nm and 50 nm. In other embodiments, $T_V$ is between 20 nm and 150 nm.

Conductive interconnect 134 has one or more properties of conductive interconnect 102. Conductive interconnects 102 and 134 include a metal such as copper, cobalt, molybdenum, tungsten or ruthenium. In some embodiments, conductive interconnects 102 and 134 include a liner layer and a fill metal on the liner layer. For example, the liner layer may include a material, such as but not limited to, ruthenium, cobalt or tantalum and the fill metal may include copper, molybdenum or tungsten. Conductive interconnects 102 and 134 have a thickness that spans a portion of dielectric 105 within level 104. There may be other vias and interconnect routing connections within level 104 that are not shown in the Figure. The conductive interconnects 102 and 134 may be discrete vias or continuous trenches, as will be discussed further below.

In an embodiment, via structure 140, metal lines 136 and 138, include a same or substantially the same material. In the illustrative embodiment, via structure 140, metal lines 136 each include a liner layer 144 and a fill material 146 on the liner layer 144. For example, the liner layer 144 may include a material, such as but not limited to, ruthenium, cobalt, tantalum, or nitrides of tantalum and titanium, and the fill material 146 may include copper, molybdenum or tungsten. In some embodiments, via structure 140 and metal lines 136 and 138, include a same or substantially the same material as the material of the conductive interconnect 102.

The substrate 150 may include a suitable substrate such as is utilized in semiconductor device fabrication and may comprise a material such as silicon, germanium, silicon germanium, group III-V materials, group III-N materials or quartz.

Figure 1H:
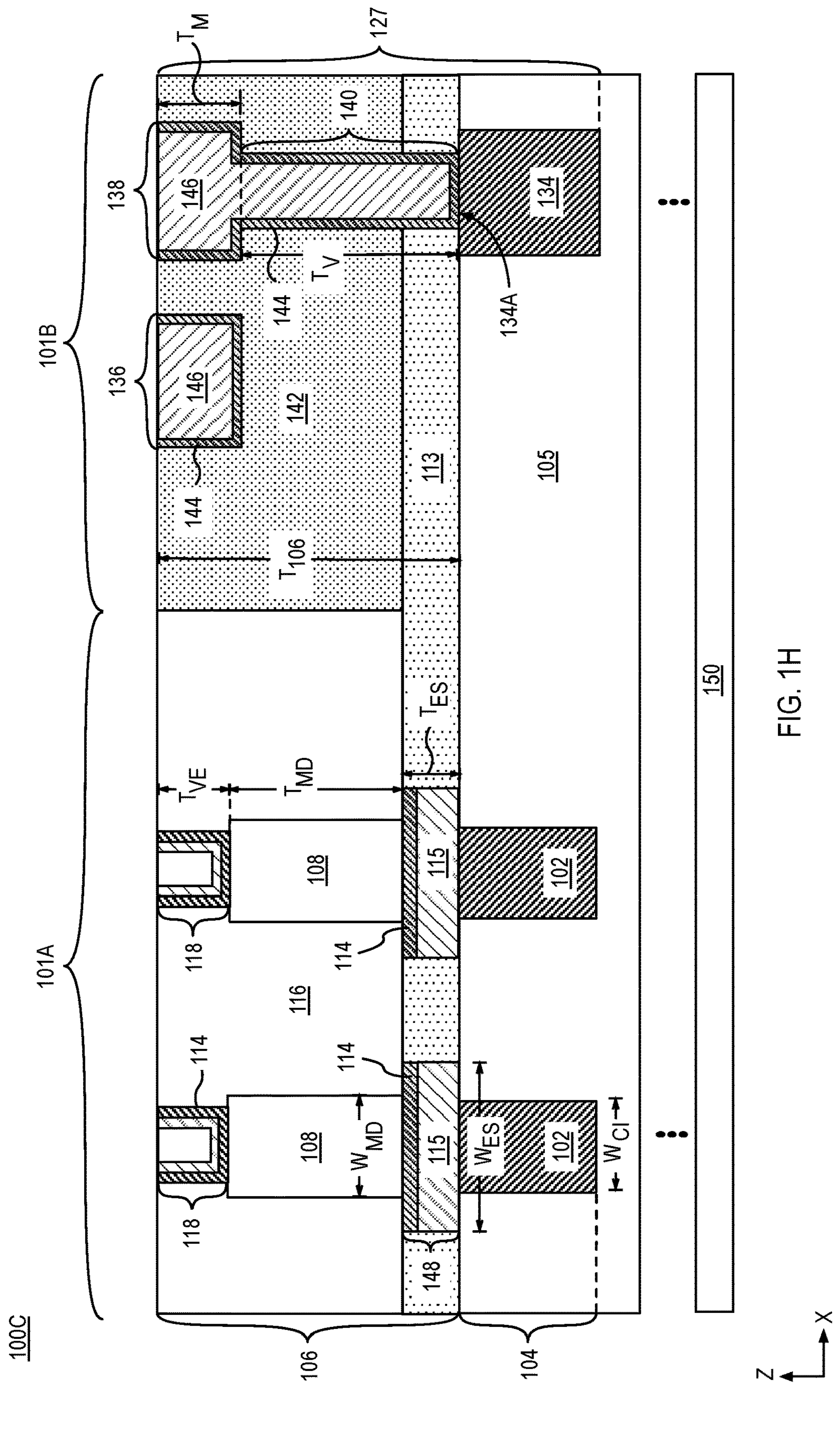
FIG. 1H is a cross-sectional illustration of an electrode structure where a conductive hydrogen barrier layer as a top layer above a conductive fill material, in accordance with an embodiment of the present disclosure.

FIG. 1H is an example of a device structure 100C, that includes an electrode structure 148 that has a structure that is different from the electrode structure 112 depicted in the device structure 100A of FIG. 1A. The electrode structure 148 includes conductive fill material 115 and conductive hydrogen barrier 114, where the conductive hydrogen barrier 114 extends laterally above and in direct contact with conductive fill material 115. In the illustrative embodiment, though conductive hydrogen barrier 114 does not laterally surround conductive fill material 115, it forms a barrier between memory device 108 and the dielectric 105. In the illustrative embodiment, conductive hydrogen barrier 114 has an uppermost surface that is co-planar or substantially co-planar with the uppermost surface of the etch stop layer 113. Electrode structure 148 has a vertical thickness $T_{ES}$. In exemplary embodiments, $T_{ES}$ is equal to or substantially equal to $T_L$, as shown. In the illustrative embodiment, the electrode structure 148 has a lateral thickness $W_{ES}$ that is greater than $W_{MD}$. In some such embodiments, memory device 108 is on a portion of the electrode structure 148. Device structure 100C is the same or substantially the same as device structure 100A in all other regards.

Figure 1I:
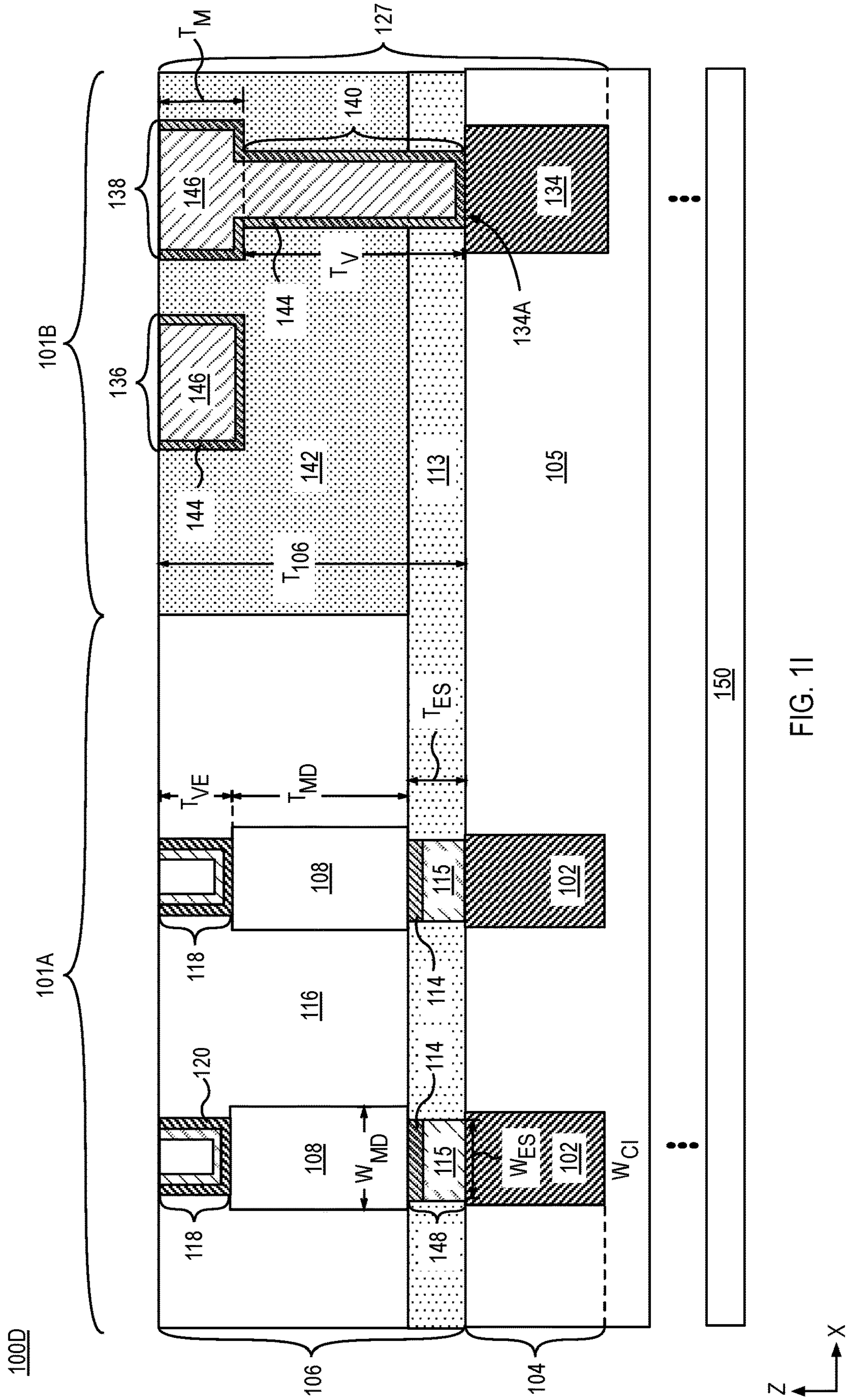
FIG. 1I is a cross-sectional illustration of the device structure in FIG. 1H in an embodiment where the spacing between two adjacent memory devices is less than a spacing between electrode structures coupled with a respective memory device.

In other embodiments, $W_{ES}$ of electrode structure 148 that is less than $W_{MD}$ as illustrated in device structure 100D in FIG. 1I. In the illustrative embodiment, memory device 108 is also on a portion of the etch stop layer 113. While $W_{ES}$ is less than $W_{MD}$, the combination of etch stop layer 113 and conductive hydrogen barrier 114 provide adequate protection as a hydrogen barrier to memory device 108. Device structure 100D is substantially the same or substantially the same as device structure 100C in all other regards.

Figure 1J:
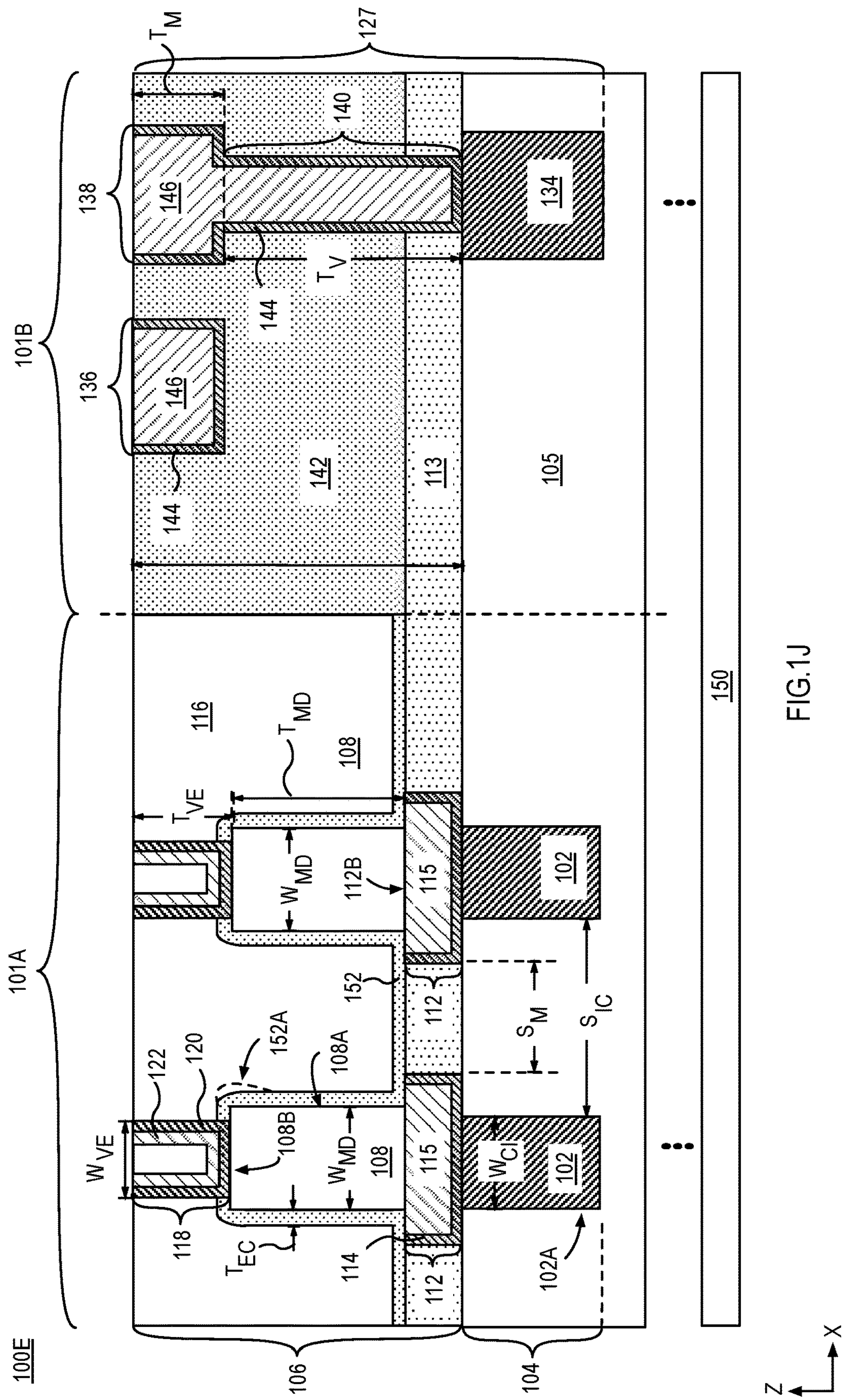
FIG. 1J is an illustrative embodiment of the structure in FIG. 1A, where an encapsulation layer is inserted between the dielectric and memory device.

In some embodiments, the dielectric 116 may be separated from the memory device 108 by a layer of material that may be similar or different than the material of dielectric 116. FIG. 1J is an illustrative embodiment of the device structure 100A in FIG. 1A, where an encapsulation layer 152 is inserted between the dielectric 116 and memory device 108. The encapsulation layer 152 in device structure 100E may include a material that is substantially similar to a material of the dielectric 116 or be different. In the illustrative embodiment, encapsulation layer 152 is directly adjacent to sidewalls 108A, on a portion of electrode structure 112 and on the etch stop layer 113. As shown, encapsulation layer 152 is on an uppermost surface 108B and adjacent to conductive hydrogen barrier 120, where $W_{VE}$ is less than $W_{MD}$.

In one or more embodiments, the encapsulation layer 152 can have a thickness, $T_{EC}$, that varies between 1 nm and 5 nm. The encapsulation layer 152 may be substantially conformal with sidewalls 108A and uppermost surface 108B, as illustrated. But in other embodiments, an upper portion 152A of the encapsulation layer 152 may be wider than $T_{EC}$.

The encapsulation layer 152 may extend over to a boundary between the memory region 101A and logic region 101B, as shown. As shown, encapsulation layer 152 is adjacent to dielectric 142. The encapsulation layer 152 does not extend over the logic region 101B to exclude material that is capable of possessing a high dielectric constant in a region filled with logic interconnect circuitry.

In the illustrative embodiment, where $W_{ES}$ is greater than $W_{MD}$, the encapsulation layer 152 is in contact with both the conductive hydrogen barrier 114 and the conductive fill material 115. In other embodiments, where $W_{ES}$ is less than $W_{MD}$, encapsulation layer 152 is not in contact with electrode structure 112.

Figure 2A:
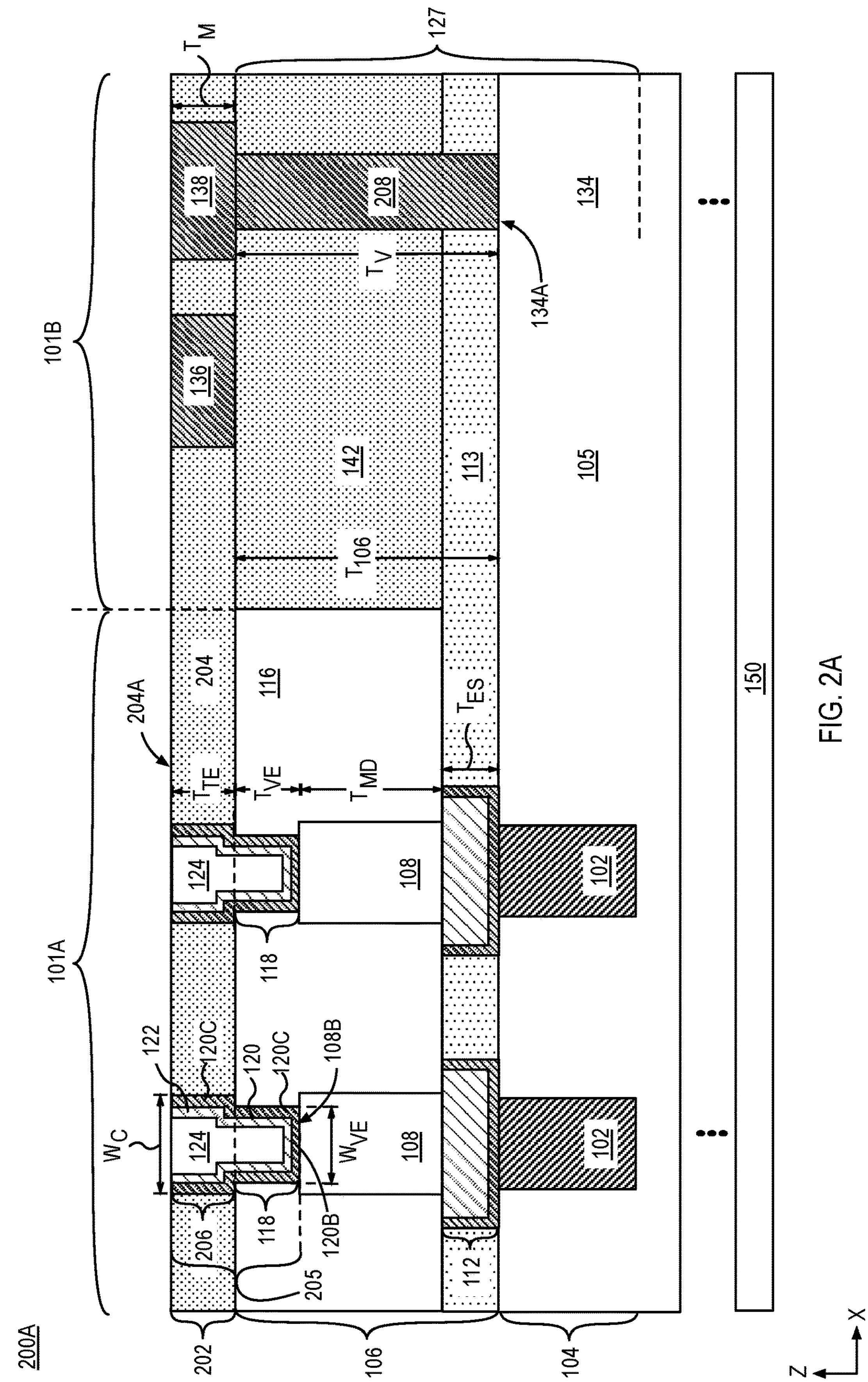
FIG. 2A is a cross-sectional illustration of a device structure, where a trench electrode is integrated with a via electrode above a memory device, in accordance with an embodiment of the present disclosure.

In some embodiments, it is advantageous for $T_{MD}$ to be comparable to $T_{ES}$. For example, $T_{MD}$ may be at most 2 times $T_{ES}$. In some such embodiments, $T_{MD}$ and $T_{ES}$ combined may not be equivalent to $T_V$ such as is illustrated in FIG. 2A. FIG. 2A is a cross-sectional illustration of a device structure 200A, in accordance with an embodiment of the present disclosure. Device structure 200A includes many of the features of the device structure 100A such as conductive interconnect 102, electrode structure 112, memory device 108, via electrode 118, conductive interconnect 134, dielectric 116, and dielectric 142.

In the illustrative embodiment, the device structure 200A further includes a level 202 above level 106. Level 202 includes a dielectric 204 on the dielectric 116. For integration flexibility dielectric 204 may include a material having a lower film density than dielectric 116. In some embodiments, dielectric 204 includes a material that is the same or substantially the same as the material of the dielectric 142.

In the illustrative embodiment, device structure 200A includes an electrode structure 205 that is coupled with the memory device 108. As shown, electrode structure 205 includes via electrode 118 and a contact electrode 206 on the via electrode 118. Via electrode is adjacent to dielectric 116 and contact electrode 206 is adjacent to dielectric 204. Electrode structure 205 includes layers that are contiguous with layers within via electrode 118 and contact electrode 206.

In the illustrative embodiment, via electrode 118 has one or more features of the via electrode 118 described in association with FIG. 1A. Referring again to FIG. 2A, conductive hydrogen barrier 120 within via electrode 118 includes a lateral portion 120B that is on memory device 108 and a plurality of vertical portions 120C. Vertical portions 120C are directly adjacent to dielectric 116. The via electrode also includes liner layer 122 and conductive fill material 124.

As shown, conductive hydrogen barrier 120, liner layer 122, and conductive fill material 124 are contagious within electrode structure 205. The contact electrode 206 (within electrode structure 205) includes vertical portions 120C of conductive hydrogen barrier 120, where vertical portions 120C are adjacent to dielectric 204. In the illustrative embodiment, contact electrode 206 has a width, $W_C$ that is greater than a width $W_{VE}$. In some such embodiments, the conductive hydrogen barrier 120 includes a portion that is on uppermost surface 116A of dielectric 116, as shown. As such, conductive hydrogen barrier 120 extends from the uppermost surface 108B adjacent to dielectric 116 and dielectric 204, to an uppermost surface 204A.

The conductive hydrogen barrier 120, liner layer 122 within contact electrode 206 do not include lateral portions. The absence of lateral portions is an artifact of a co-fabrication process that is utilized to form electrode structure 205, as will be discussed below. The liner layer 122 follows a contour of and is directly adjacent to the conductive hydrogen barrier 120. Conductive fill material 124 includes a portion within the contact electrode 118 and a portion within contact electrode 206.

Dielectric 116 and conductive hydrogen barrier 120 combine to facilitate blocking of hydrogen such that dielectric 204 may include a porous, low density ILD material without impact to memory device 108. A dielectric such as dielectric 204 that includes an ILD material facilitates fabrication of electrodes and lines within both the memory region 101A and logic region 101B in level 202.

Contact electrode 206 may be a via or a trench. Depending on embodiments, contact electrode 206 can have a width that is the same as the width of via electrode 118 or be different. In embodiments, where contact electrode 206 is a trench electrode 206, contact electrode 206 may couple a plurality of via electrodes 118 above a respective memory device 108, as will be discussed below.

In other embodiments, as will be discussed below, contact electrode 206 may not include conductive hydrogen barrier 120.

In the illustrative embodiment, via electrode 118 and metal lines 136 and 138 are on two different levels. In the illustrative embodiment, metal lines 136 and 138 are within level 202 above via structure 208. Via structure 208 includes one or more properties of via structure 140 such as material composition and lateral thickness. In some such embodiments, via structure 208 has a vertical thickness, $T_V$ that is equal to a vertical thickness, $T_{106}$, of level 106. In the illustrative embodiment, $T_V$ is equivalent or substantially equivalent to sum of $T_{ES}$, $T_{MD}$ and $T_{VE}$. It is to be appreciated that $T_{VE}$ can be reduced to accommodate a taller stack (increase in $T_{MD}$) for memory device 108.

As discussed earlier metal lines 136 and 138 have a vertical thickness $T_M$. In the illustrative embodiment, $T_M$ is a thickness of level 202. As shown, $T_M$ is also substantially equal to a vertical thickness TTE of contact electrode 206.

Figure 2B:
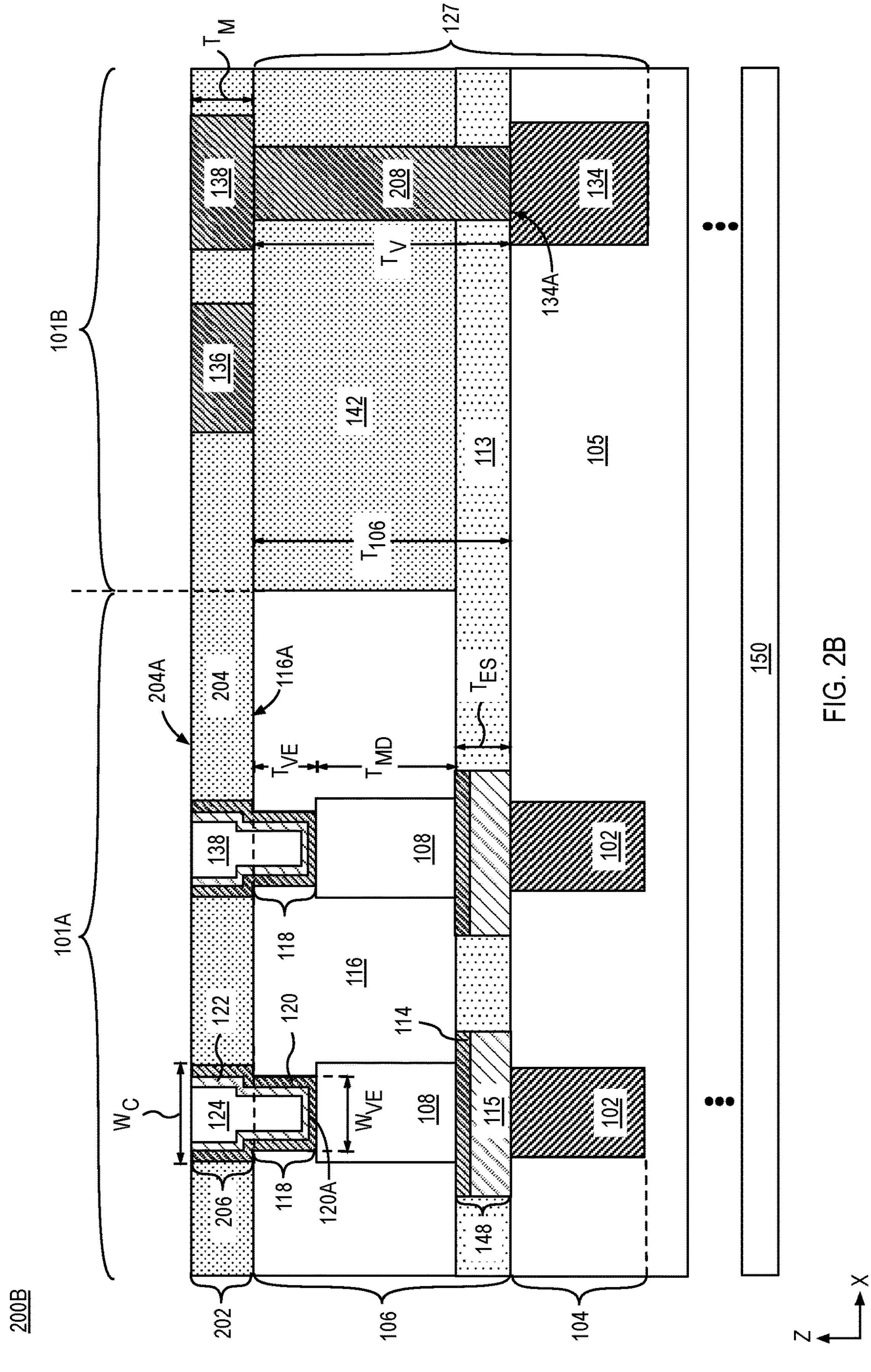
FIG. 2B is a cross-sectional illustration of a device structure, where a trench electrode is integrated with a via electrode above a memory device, in accordance with an embodiment of the present disclosure.

The electrode structure 112 in FIG. 2A may be replaced by an electrode structure 148, as illustrated in FIG. 2B, in accordance with an embodiment of the present disclosure. Device structure 200B includes one or more features of the device structure 200A other than the electrode structure 148. It is to be appreciated that electrode structure 148 in device structure 200B, may be wider than or narrower than the memory device 108 and conductive interconnect 102.

Figure 3A:
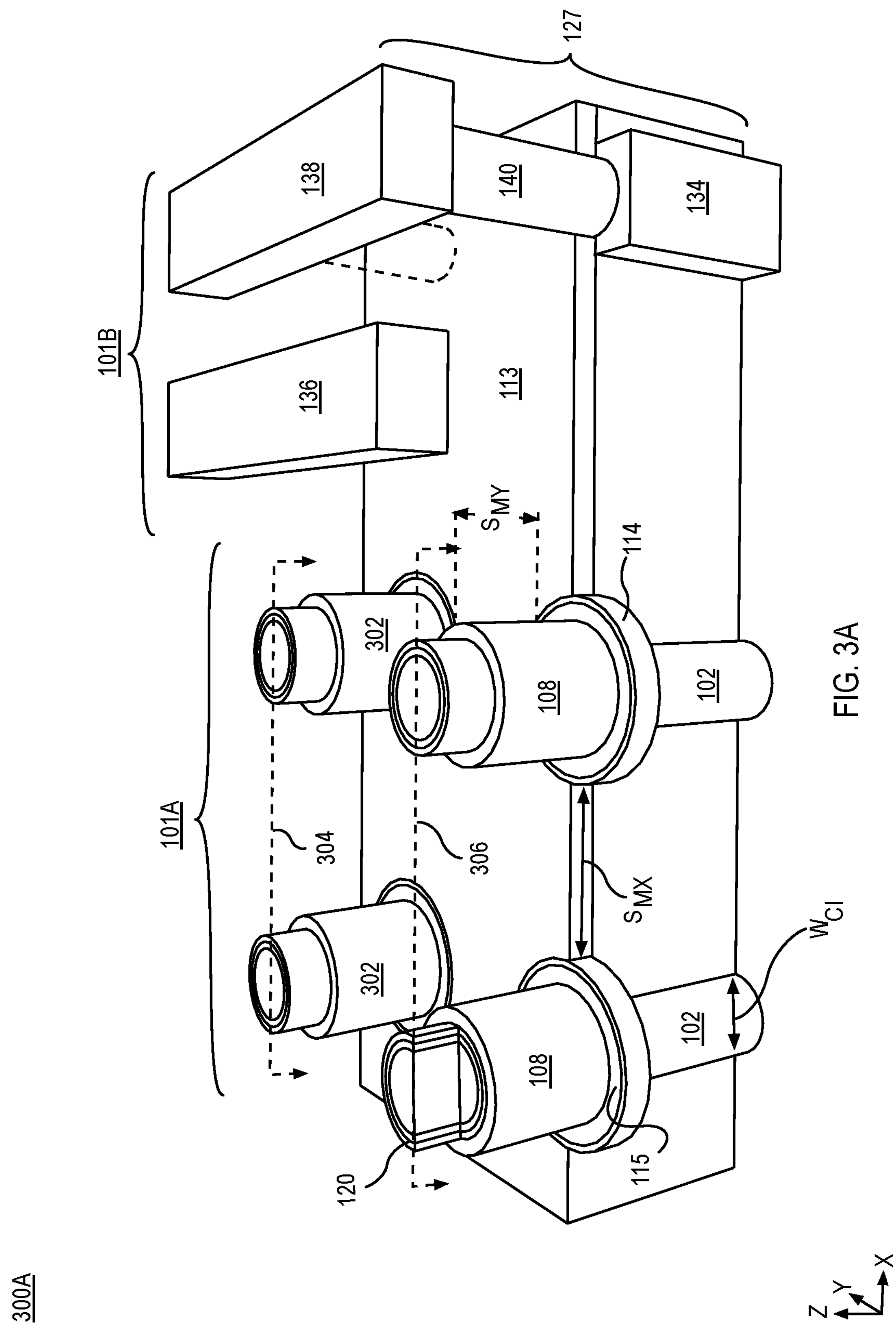
FIG. 3A is an isometric illustration of the device structure in FIG. 1A, where conductive interconnect that is coupled with a respective trench capacitor has a discrete island structure, in accordance with an embodiment of the present disclosure.

FIG. 3A is an isometric illustration of the device structure 300A, in accordance with an embodiment of the present disclosure. Device structure 300A includes many of the features of device structure 100A described in association with FIG. 1A. As shown, conductive interconnects 102 are discrete islands. Device structure 300A further includes further features not illustrated in FIG. 1A as well as some variations in features of certain structures.

Device structure 300A includes a plurality of memory devices such as memory device 302 on plane 304, behind a plane 306 of memory device 108. Memory device 302 is substantially identical to and has all the properties of memory device 108. In the illustrative embodiment, each of the memory devices 108 and 302 are coupled with a respective conductive interconnect 102.

As shown each conductive interconnect 102 has a discrete island structure (i.e., a conductive interconnect surrounded by dielectric 105). The conductive interconnect 102 may include a variety of shapes. As illustrated conductive interconnect 102 is discrete, cylindrical, and spaced apart from an adjacent conductive interconnect 102. In some such embodiments, lateral thickness or width, $W_{CI}$ is also a diameter.

In the illustrative embodiment, the respective memory device 108 and memory device 302 have a cylindrical shape. In some such embodiments lateral thickness or width, $W_{MD}$, is a diameter of the respective memory device 108 or memory device 302.

In the illustrative embodiment, electrode structure 112 also has a cylindrical shape. In some such embodiments $W_{ES}$, is a diameter of the electrode structure 112. However, it is to be appreciated that the shape of the electrode structure 112 can be independent of the shape of the memory device 108 or 302, or a shape of conductive interconnect 102. As shown a portion of the conductive hydrogen barrier 114 is an annular shaped ring around the conductive fill material 115.

In the illustrative embodiment, each electrode structures 112 is spaced apart from an adjacent electrode structures 112 by a distance, $S_M$ along the x-direction and along the y-direction. In embodiments, $S_M$ along the x-direction and along the y-direction may be the same or different.

In the illustrative embodiment, conductive interconnect 134 is a conductive trench interconnect 134 that extends along the y-direction. As shown, metal lines 136 and 138 also extend along the y-direction. In some embodiments, via structure 140 is conductive via between metal line 138 and conductive trench interconnect 134. In other embodiments, interconnect structure 127 can include a plurality of vias such as via structure 140 between metal line 138 and conductive interconnect 134 to prevent an increase in electrical line resistance. In other embodiments, via structure 140 may be replaced by a metal line (not illustrated).

Figure 3C:
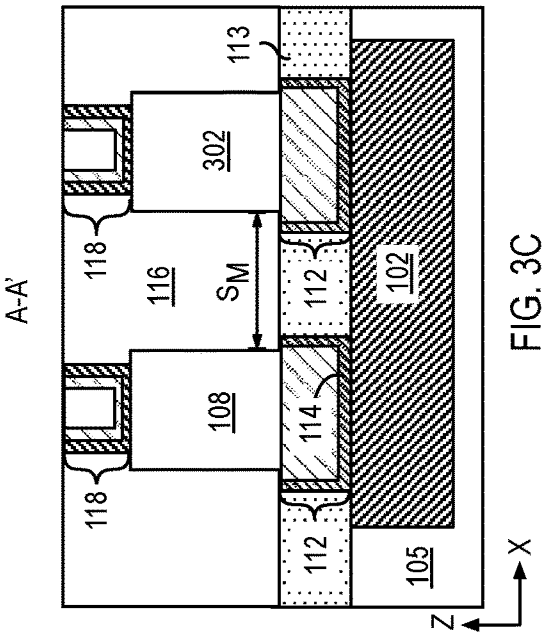
FIG. 3C is a cross sectional illustration, though a line A-A' of the device structure in FIG. 3B.
Figure 3D:
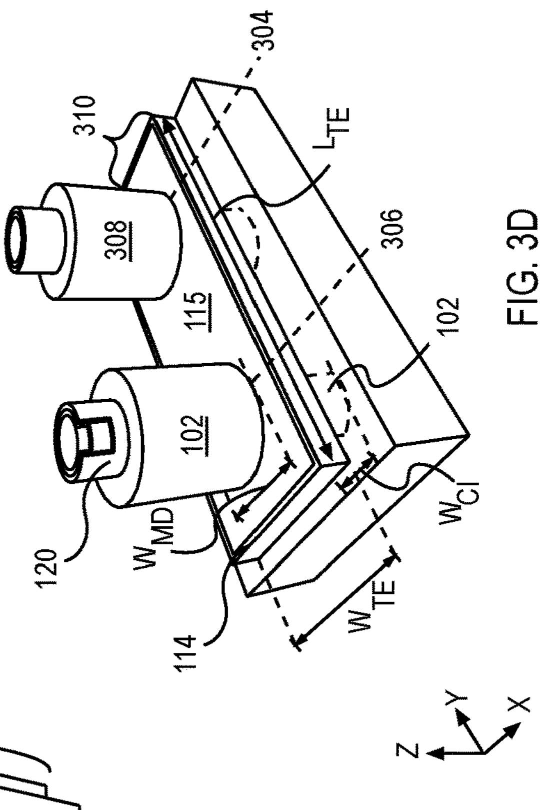
FIG. 3D is an isometric illustration of the device structure in FIG. 3A, where the conductive interconnects are discrete island structures, but the electrode structure is a trench electrode that couples multiple memory devices, in accordance with an embodiment of the present disclosure.
Figure 3B:
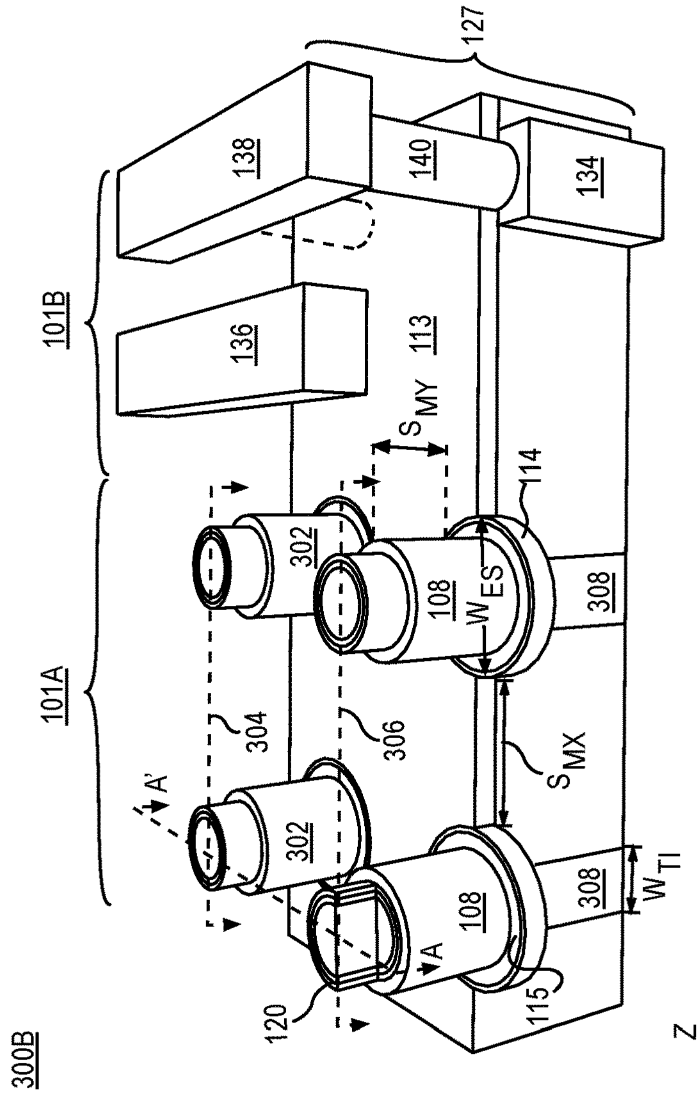
FIG. 3B is an isometric illustration of the device structure in FIG. 1A, where the conductive interconnect is a trench interconnect coupling a plurality of memory devices through a respective electrode structure, in accordance with an embodiment of the present disclosure.

In some embodiments, conductive interconnect 102 is a trench interconnect 308, as illustrated in device structure 300B of FIG. 3B. Only the memory region 101A is illustrated for clarity. The trench interconnect 308 may continuously extend continuously from under memory device 108 on plane 306 to under memory device 302 on plane 304, as shown in the cross-sectional illustration of FIG. 3C. In the illustrative embodiment, the trench interconnect 308 couples a lower most electrode of memory device 108 and 302 along a length of the trench (along the y-direction). In embodiments, trench interconnect 308 includes a material that is the same or substantially the same as the material of the conductive interconnect 102. Trench interconnect 308 is not exposed to memory device 108 or 302 during memory device fabrication. As shown, the conductive hydrogen barrier 114 and the etch stop layer 113 act as a collective hydrogen barrier.

Referring again to FIG. 3B, because the etch stop layer 113 extends over the trench interconnect 308, the electrode structure 112 can have a shape and/size that is independent of the shape of trench interconnect 308. It is also to be appreciated that electrode structure 112 can be offset along the x or the y direction relative to the trench interconnect 308, without loss of device functionality, as long as there is at least 50% overlap. As shown, trench interconnect 308 has a lateral thickness, WTI. In general, $W_{TI}$ may be equal to, less than or greater than $W_{ES}$. In the presence of a trench interconnect 308, etch stop layer 113 may be thicker than in the presence of conductive interconnect 102 (illustrated in FIG. 3A). In the presence of a trench interconnect 308, while the trench interconnect 308 can be narrower than electrode structure 112, e.g., along x-direction, trench interconnect 308 is wider than that electrode structure 112 along the y-direction. A thicker etch stop layer 113 may advantageously provide sufficient material while patterning to form memory devices 108 and 302 (along the y-direction) as will be discussed below.

As discussed above, the shape of the electrode structure 112 may be independent of the trench interconnect 308 or the memory device 108. The electrode structure 112 (depicted in FIG. 3B) has a cylindrical shape. However, the electrode structure 112 can be rectangular in other embodiments, such as is illustrated in FIG. 3D (the etch stop layer 113 or dielectric 116 is not shown for clarity). As shown, the conductive interconnect 102, in the memory region 101A are discrete islands, however, electrode structure 112 is a trench electrode structure 310 that couples two or more memory devices 108. Trench electrode structure 310 may extend laterally from above a conductive interconnect 102 on plane 306 to above conductive interconnect 102 on plane 304, behind plane 306. As such, trench electrode structure 310 couples a lower most electrode of the respective memory devices 108 and 302. Trench electrode structure 310 provides enhanced flexibility to couple a selected number of memory devices along a row without having to provide a continuous trench. The flexibility to choose the number of devices and groups of devices can provide additional electrical advantages such as for programming.

Trench electrode structure 310 has one or more properties of electrode structure 112, such as conductive hydrogen barrier 114 and conductive fill material 115. As shown, conductive hydrogen barrier 114 extends along the length and width LTE and a width $W_{TE}$. In some embodiments, $W_{TE}$ is smaller or greater than $W_{MD}$, or $W_{CI}$. As shown, $W_{TE}$ is greater than $W_{MD}$, and $W_{CI}$. LTE is substantially greater than $W_{CI}$. Although as illustrated, $W_{TE}$ is greater than $W_{CL}$, in other embodiments, $W_{TE}$ can be less than $W_{CI}$ without loss of functionality. Furthermore, as explained above, $W_{MD}$ can be independent of $W_{TE}$.

Figure 4B:
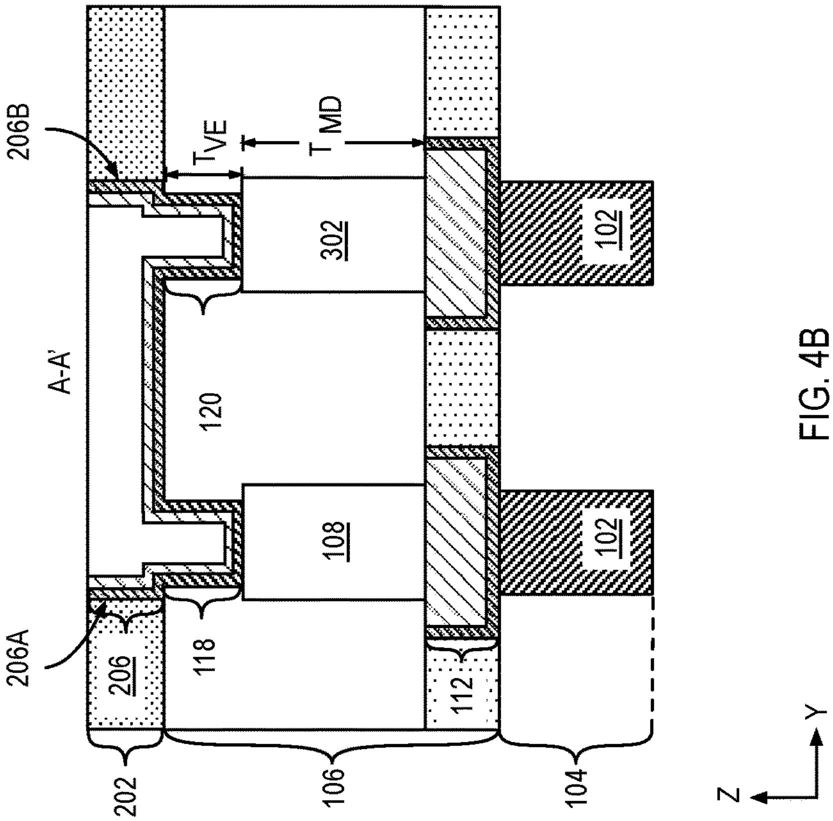
FIG. 4B is a cross sectional illustration, though a line A-A' of the device structure in FIG. 4B, in accordance with an embodiment of the present disclosure.
Figure 4A:
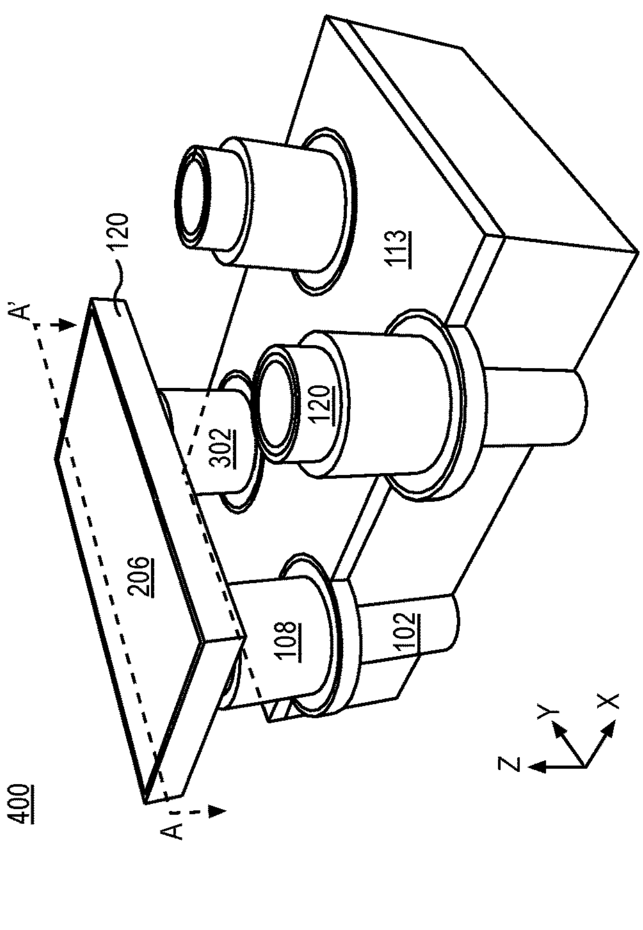
FIG. 4A is an isometric illustration of the device structure in FIG. 2A, in accordance with an embodiment of the present disclosure.

FIG. 4A is an isometric illustration of device structure 400, in accordance with an embodiment of the present disclosure. Device structure includes one or more features of the device structure 200A illustrated in FIG. 2. In the illustrative embodiment, contact electrode 206 extends from memory device 108 to memory device 302 (along y-direction). In other embodiments, contact electrode 206 connects two or more adjacent memory devices 108 (along x-direction).

FIG. 4B is a cross-sectional illustration through a line A-A' of the structure in FIG. 4A. As shown, conductive hydrogen barrier 120 extends continuously from a first sidewall 206A of contact electrode 206 above memory device 108 to a second sidewall 206B. In the illustrative embodiment, liner layer 122 is adjacent to conductive hydrogen barrier 120 and conductive fill material 124 fills extends continuously from above memory device 108 to memory device 302.

Figure 5:
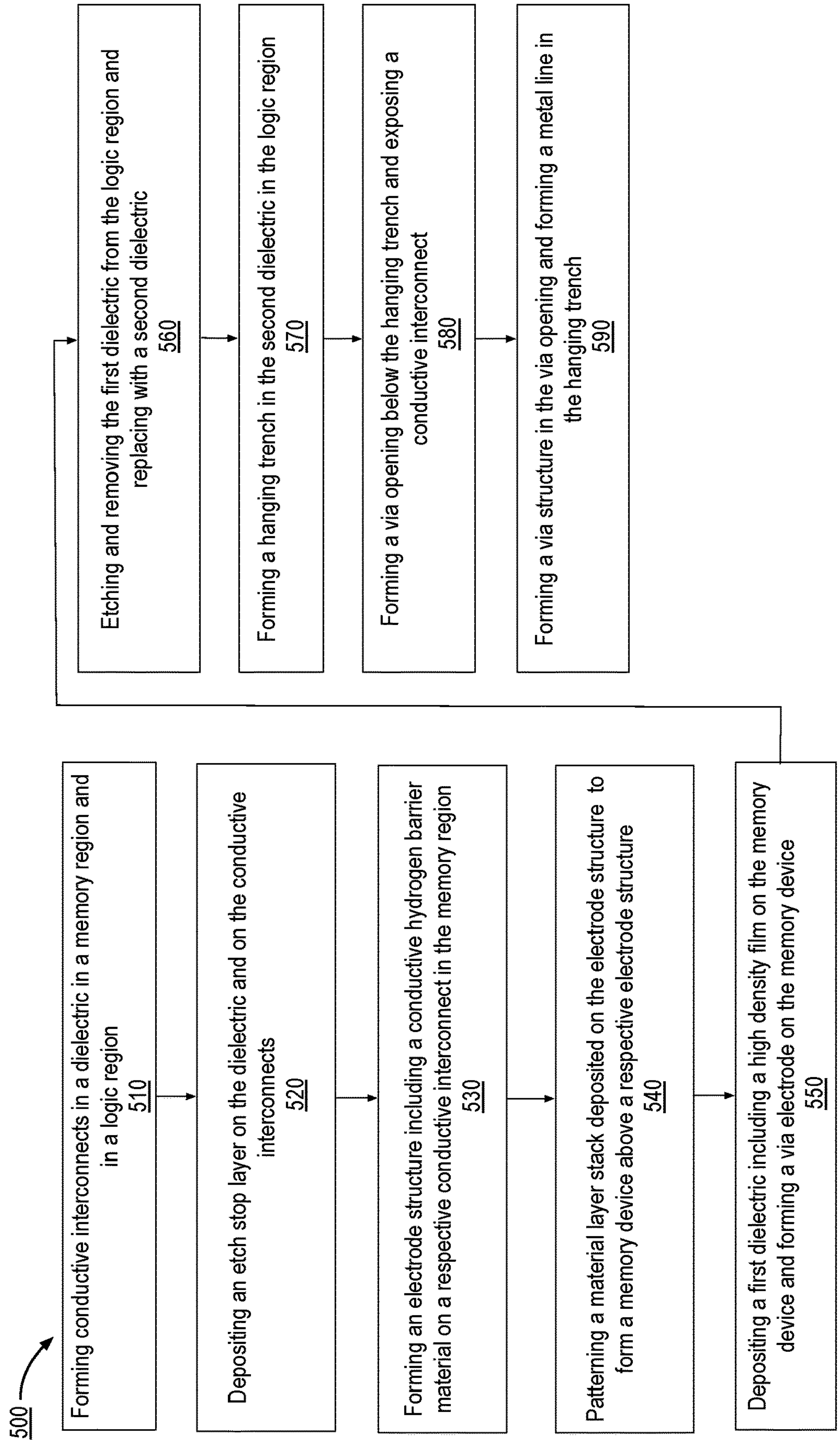
FIG. 5 is a flow diagram to form memory devices with dual hydrogen barrier layers in a memory region and conductive interconnects in a logic region, in accordance with some embodiments of the present disclosure.

FIG. 5 is a flow diagram to form memory devices in a memory region and conductive interconnects in a logic region, in accordance with some embodiments of the present disclosure. Some operations can be performed simultaneously or out of order. The method begins at operation 510, with the formation conductive interconnects in a dielectric in a memory region and in an adjacent logic region. The method 500 continues at operation 520 with the deposition of an etch stop layer on the dielectric and on the conductive interconnects. The method continues at operation 530 with the formation of electrode structures including a conductive hydrogen barrier material on each of the conductive interconnects, in the memory region. The method continues at operation 540 with the process to etch a material layer stack deposited on the electrode material to form a memory device above a respective conductive interconnect in the memory region. The method continues at operation 550 with the deposition of a first dielectric including a high density film and forming a via electrode including a conductive hydrogen barrier material on a respective memory device. The method continues at operation 560 with a process to etch and remove the first dielectric from the logic region and replacing with a second dielectric including a porous material. The method continues at operation 570 with a formation of a hanging trench in the second dielectric in the logic region. The method continues at operation 580 with the formation of via opening below the hanging trench and exposing a conductive interconnect. The method concludes at operation 590 with the formation of a via structure in the via opening and a metal line in the hanging trench.

FIG. 6A is a cross-sectional illustration of a plurality of conductive interconnects 102 and 134 formed within dielectric 105 above a substrate 600. In the illustrative embodiment, conductive interconnects 102, are formed in a memory region and conductive interconnect 134 is formed in a logic region. In exemplary embodiments, there may be one or more levels of transistors and interconnects between conductive interconnects 102 and 134 and substrate 600. In high density memory applications, the number of conductive interconnects 102 and 134 can range between 1K and 5K within a given array in memory region 101A. Conductive interconnects 102 and 134 have a lateral thickness, $W_{CI}$, that may be determined by a minimum acceptable electrical resistance. In some embodiments, conductive interconnects 102 are discrete structures that are substantially, rectangular, circular or elliptical in plan-view shape and conductive interconnect 134 is a trench line (extending into the plane of the Figure). In some embodiments, conductive interconnects 102 have a lateral thickness between 20 nm and 40 nm. For example, conductive interconnects 102 may have a lateral thickness between 20 nm and 40 nm, along the x-direction, as shown. In other embodiments, conductive interconnects 102 and 134 are trenches that extend into the plane of the Figure. The conductive interconnects 102 and 134 may have shapes that are independent of each other. As shown, conductive interconnects 102 have substantially the same lateral thickness to minimize variability in device performance.

In some embodiments, the conductive interconnects 102 and 134 are electrically and mechanically coupled with vias and/or lines such as via 601 and/or line 601 indicated in dashed boxes in the Figure. The via 601 and/or line 601 may include a same or substantially the same material as a material of the conductive interconnect 102.

In some embodiments, conductive interconnects 102 and 134 include a liner layer and a fill metal on the liner layer. For example, the liner layer may include a material, such as but not limited to, ruthenium, cobalt or tantalum and the fill metal may include copper or tungsten. In one or more embodiments, conductive interconnects 102 and 134 include copper fill metal on a ruthenium or a tantalum liner. In an embodiment, each of the conductive interconnects 102 are separated by spacing $S_{IC}$. $S_{IC}$ is substantially determined by a designed density of memory devices to be fabricated within a given area, as well as by underlying structures embedded within layers below conductive interconnects 102.

In various embodiments, substrate 600 includes a material that is the same or substantially the same as the material of the substrate 150 described in association with FIG. 1A.

FIG. 6B is a cross-sectional illustration of the structure in FIG. 6A following the process to deposit an etch stop layer 113 on conductive interconnects 102 and 134 as well as on the dielectric 105. Etch stop layer 113 is deposited to a thickness, $T_{ED}$ that is chosen to accommodate a height of an electrode structure to be formed. For example, the as deposited thickness, $T_{ED}$, may include process margins for multiple planarization processes to be utilized. $T_{ED}$ is also chosen to provide sufficient material against etch erosion during process to form memory devices in the memory region 101A.

The etch stop layer 113 also functions as a diffusion barrier layer. A diffusion barrier is essential for preventing diffusion of copper from conductive interconnect 134, and hydrogen during downstream process to the memory devices to be formed or other devices within the logic region. As such, etch stop layer 113 includes a material such as, but not limited to, silicon nitrogen and one or more of, oxygen or carbon.

Figures 7A, 7B, 7C, 7D:
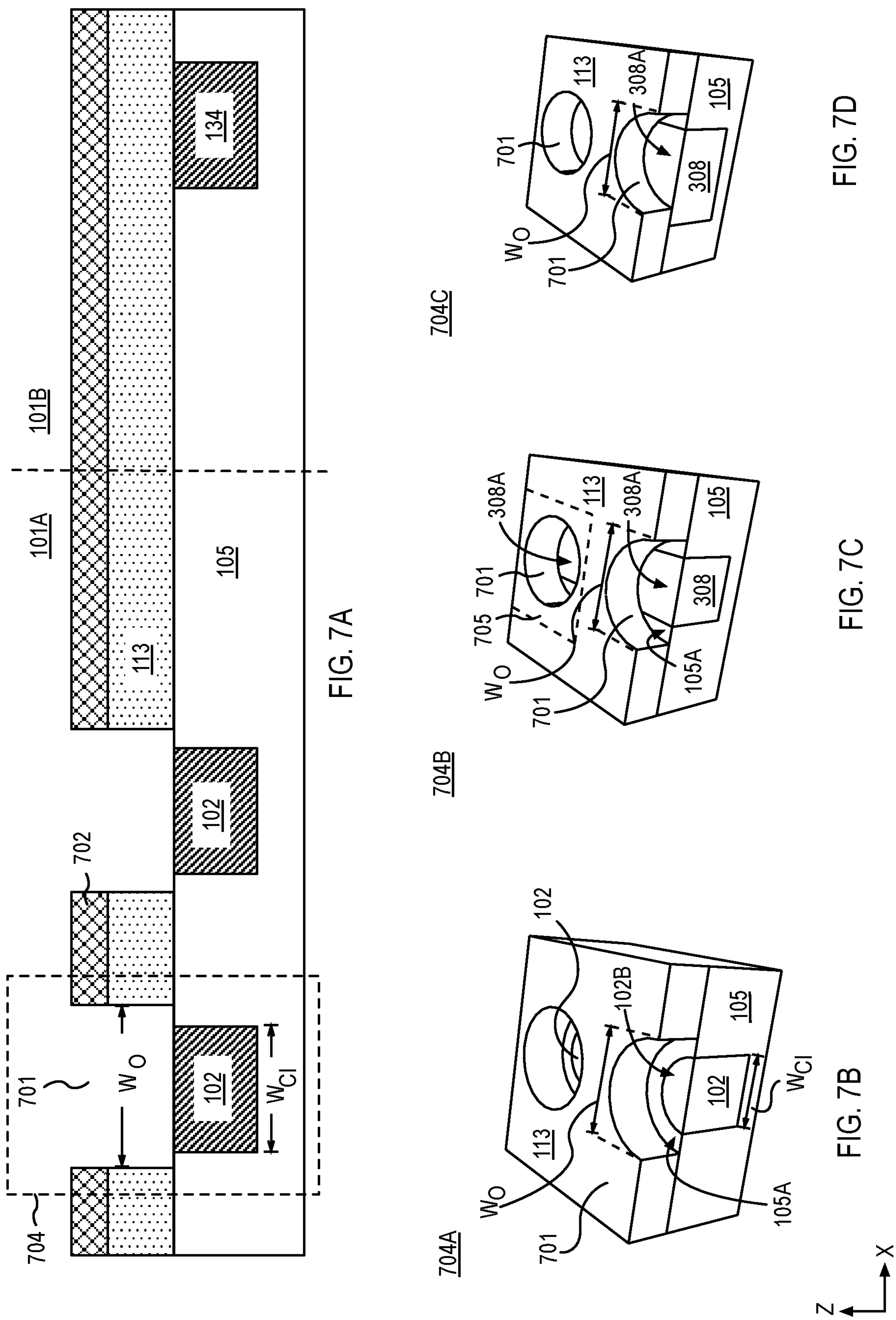
FIG. 7A is a cross-sectional illustration of the structure in FIG. 7A following the process to etch openings in etch stop layer to form electrode structures.
FIG. 7B is an isometric illustration of a portion of the structure in FIG. 7A, in accordance with an embodiment of the present disclosure.
FIG. 7C is an isometric illustration of a portion of the structure in FIG. 7A, in accordance with an embodiment of the present disclosure.
FIG. 7D is an isometric illustration of a portion of the structure in FIG. 7A, in accordance with an embodiment of the present disclosure.

FIG. 7A is a cross-sectional illustration of the structure in FIG. 7A following the process to etch openings 701 in etch stop layer 113 to form electrode structures. In an embodiment, photoresist mask 702 is formed by a lithographic process on etch stop layer 113. Exposed portions of etch stop layer 113 may be etched by a plasma etch process through opening in the photoresist mask 702. In the illustrative embodiment, the openings 701 have a lateral thickness, $W_O$. $W_O$ may be substantially the same across various openings 701 that are designed to form electrode structures. $W_O$ may be narrower, equal to or wider than $W_{CI}$ of conductive interconnects 102. In the illustrative embodiment, $W_O$ is less than $W_{CI}$. The substrate 600 is not illustrated in FIGS. 6B-14C, for clarity.

Shape of openings 701 may be circular or rectangular and the conductive interconnects may be discrete islands or trenches depending on embodiments. FIGS. 7A-7C illustrate different embodiments (for example portions 704A, 704B and 704C) of a portion 704 of the conductive interconnect and opening in FIG. 7A. The photoresist mask 702 is removed for clarity.

FIG. 7B is an isometric illustration of a portion 704A of the structure in FIG. 7A, in accordance with an embodiment of the present disclosure. A cross section through opening 701 is illustrated. In the illustrative embodiment, the conductive interconnect 102 is cylindrical, where $W_{CI}$ is less than $W_O$, (for example diameter) of opening 701. As shown opening 701 is circular and $W_O$ may be, for example, a diameter of the opening 701. In other embodiments, opening 701 can be rectangular and/or extend over two or more conductive interconnects, such as for example, conductive interconnects 102. The dielectric 105 is exposed during formation of the openings 701 when $W_{CI}$ is less than $W_O$, as shown. In the illustrative embodiment, uppermost surface 102B of conductive interconnect 102 is co-planar or substantially co-planar with uppermost surface 105A of dielectric 105.

In some embodiments, the conductive interconnect within portion 704C is a trench interconnect 308 as illustrated in FIG. 7C. In some such embodiments, the openings 701 expose different portions of uppermost surface 308A of trench interconnect 308. In the illustrative embodiment, $W_{TI}$ is less than $W_O$ and openings 701 expose uppermost surface 105A of the dielectric 105. In the illustrative embodiment, uppermost surface 308A of trench interconnect 308 is co-planar or substantially co-planar with uppermost surface 105A. In the illustrative embodiment, opening 701 is circular. However, in other embodiments, the opening 701 can be rectangular as indicated by dashed lines 705.

While it is desirable for the opening 701 to be substantially aligned with sidewalls of trench interconnect 308, in some embodiments, the opening 701 may be offset relative to trench interconnect 308, as is illustrated in portion 704C in FIG. 7D. Such an offset may be a result of misalignment between photoresist mask 702 and the trench interconnect 308 (or a conductive interconnect in other embodiments). The method adopted to fabricate an electrode structure within opening 701 is not impacted by misalignment as long as at least 50% of the opening 701 exposes the uppermost surface 308A of trench interconnect 308. Misalignment does not enable hydrogen to diffuse through to the memory device 108 (not shown).

Figure 8A:
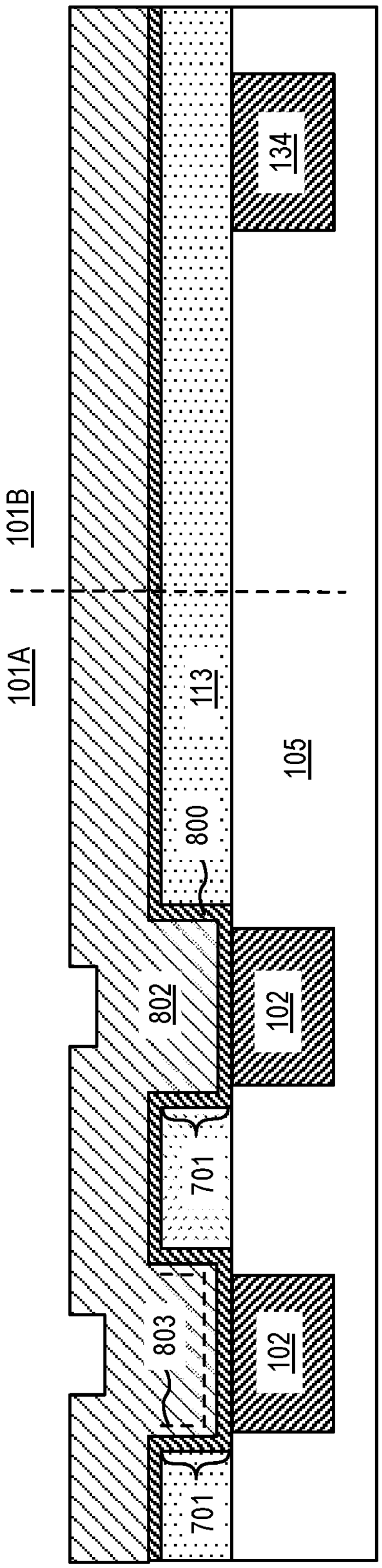
FIG. 8A is a cross-sectional illustration of the structure in FIG. 7A following the process to deposit one or more electrode materials on the conductive interconnects and on etch stop layer.

FIG. 8A is a cross-sectional illustration of the structure in FIG. 7A following the process to deposit one or more electrode materials on the conductive interconnects 102 and on etch stop layer 113. In an embodiment, a conductive hydrogen barrier material 800 is deposited in the opening 701, on sidewalls of etch stop layer 113 and on the conductive interconnect 102. In the illustrative embodiment, conductive hydrogen barrier material 800 is also deposited on exposed portions of the dielectric 105. A fill material 802 is filled in remaining portions of opening 701 on the conductive hydrogen barrier material 800. Depending on the type of material chosen for fill material 802, a liner layer (indicated by dashed lines 803) may be first deposited on the conductive hydrogen barrier material 800 and then the fill material 802 is deposited on the liner layer. In embodiments the conductive fill material 115 includes tantalum, titanium, ruthenium, tungsten or copper.

Figure 8B:
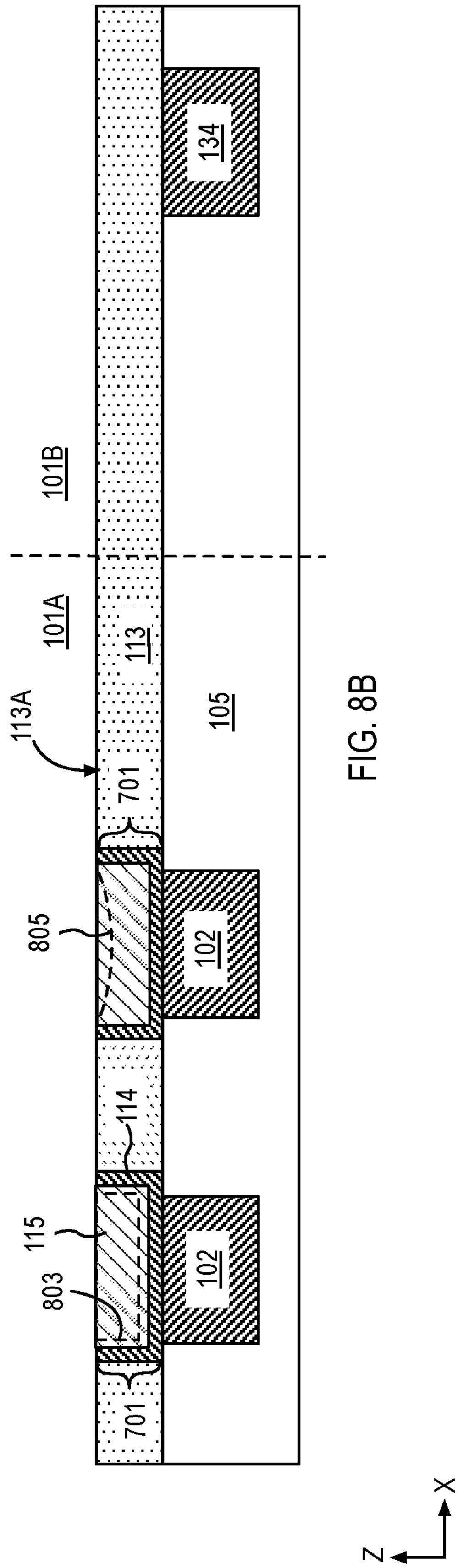
FIG. 8B is a cross-sectional illustration of the structure in FIG. 8A following the process to planarize a fill material and a conductive hydrogen barrier material to form an electrode structures above a conductive interconnect in the memory region.

FIG. 8B is a cross-sectional illustration of the structure in FIG. 8A following the process to planarize the fill material 802 and the conductive hydrogen barrier material 800. In an embodiment, the planarization process includes a chemical mechanical planarization (CMP) process. The CMP process removes the fill material 802 and the conductive hydrogen barrier material 800 from an uppermost surface 113A of the etch stop layer 113. The planarization process isolates the conductive hydrogen barrier material 800 to form a conductive hydrogen barrier 114 and the fill material 802 to form a conductive fill material 115

The CMP process may also reduce the as deposited thickness of the etch stop layer 113 to a thickness $T_{EC}$. $T_{EC}$ may be substantially uniform across the memory and logic regions 101A and 101B, respectively. There may be variations in thicknesses of up 5% from the CMP processing due to the presence of the electrode structures. Additionally, in some embodiments, the conductive fill material 115 may be dished (or recessed in a concave manner) as indicated by dashed lines 805. A concaved profile may change a surface profile of each layer within a memory device to be formed. The extent of dishing may be dependent on $W_{CI}$ and on a pattern density of and spacing between the electrode structures 112.

Figure 8C:
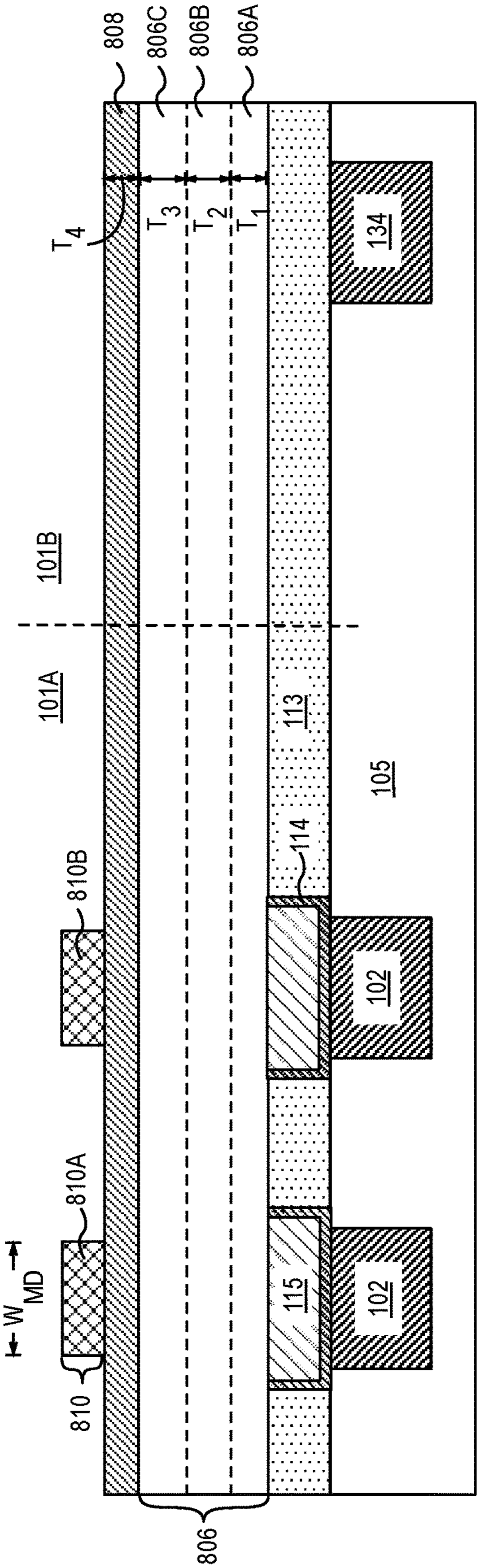
FIG. 8C is a cross-sectional illustration of the structure in FIG. 8B following the process to form material layer stack on the electrode structure and on the etch stop layer.

FIG. 8C is a cross-sectional illustration of the structure in FIG. 8B following the process to form material layer stack 806 on the electrode structure 112 and on the etch stop layer 113.

The process to form material layer stack 806 includes blanket deposition of at least three material layers, where the number further depends on a type of memory device to be fabricated. In some embodiments, the material layer stack 806 includes deposition of layers for a ferroelectric memory device. In other embodiments, the material layer stack 806 includes deposition of layers for a paraelectric memory device.

In an embodiment, individual layers of material layer stack 806 (for a ferroelectric memory device) are deposited in situ, i.e., without breaking vacuum. Material layer stack 806 maybe deposited by an atomic layer deposition (ALD) process, a plasma enhanced chemical vapor deposition (PECVD), chemical vapor deposition (CVD), a physical vapor deposition (PVD) process or a combination thereof. In some embodiments, conductive layer 806A is blanket deposited on electrode structure 112 and on etch stop layer 113. In an embodiment, conductive layer 806A includes a conductive ferroelectric oxide. The conductive ferroelectric oxide includes one of a non-Pb perovskite metal oxides, such as but not limited to, La—Sr—$CoO_3$, $SrRuO_3$, La—Sr—$MnO_3$, $YBa_2Cu_3O_7$, $Bi2Sr_2CaCu_2O_8$, or $LaNiO_3$.

Conductive layer 806A is deposited to a thickness, $T_1$, that is suitable for minimizing electrical resistance and to minimize tapering of sidewalls during a patterning process that will be utilized to fabricate memory devices. In some embodiments, conductive layer 806A has a thickness that is between 3 nm and 30 nm. A thickness of less than 30 nm is highly desirable to prevent significant tapering in sidewalls during the patterning process.

In an embodiment, the deposition process is continued by deposition of a dielectric layer 806B (for example, a ferroelectric dielectric layer 806B for a ferroelectric memory device). The dielectric layer 806B may be blanket deposited on the conductive layer 806A. Dielectric layer 806B has a thickness, $T_2$, that is between 1 nm and 30 nm. In some embodiments, dielectric layer 806B includes non-Pb Perovskite material in the form $ABO_3$, where A and B are two cations of different sizes and O is oxygen. A is generally larger than B in size. In some embodiments, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, dielectric layer 806B includes a low voltage ferroelectric material sandwiched between the conductive oxide layers (806A and 806C). Low voltage materials can be of the form $AA'BB'O_3$, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of conductive layer 806C on dielectric layer 806B. In an exemplary embodiment, the conductive layer 806C includes a material that is the same or substantially the same as the material of conductive layer 806A. When conductive layers 806A and 806C include the same material, the material layer stack is symmetric. In different embodiments, conductive layer 806C can have a different thickness than conductive layer 806A. In embodiments, conductive layer 806C is deposited to a thickness, $T_3$, between 3 nm and 30 nm. Conductive layer 806C between 3 nm and 30 nm can facilitate the patterning process.

In some embodiments, such as is shown, the deposition process concludes with the formation of hardmask layer 808 on conductive layer 806C. In some embodiments, hardmask layer 808 is blanket deposited by a PECVD, CVD or PVD process. In an embodiment, hardmask layer 808 includes a material that has a favorable etch selectivity compared to the ferroelectric materials in material layer stack 806. In some embodiments, hardmask layer 808 includes materials that can be patterned with high fidelity with respect to a masking layer formed on hardmask layer 808, for example $SiO_2$, $Si_3N_4$, DLC (Diamond Like Carbon) or $Al_2O_3$. In other embodiments, hardmask layer 808 includes a conductive material that is different from the conductive material of the ferroelectric material. In some embodiments it is desirable to deposit hardmask layer 808 to a thickness, $T_4$, that enables patterning of at least the conductive layer 806C. In other embodiments, hardmask layer 808 may deposited to a thickness, $T_4$, that depends on a total thickness of material layer stack 806. $T_4$ may be at least 20 nm. In a different embodiment, hardmask layer 808 includes a bilayer where the bilayer includes a metallic layer and a dielectric on the metallic layer.

In an embodiment, photoresist mask 810 is formed on hardmask layer 808 and is formed by a lithographic process. The photoresist mask 810 includes blocks 810A and 810B. Each block 810A-810B is a mask for patterning a discrete memory device, such as for example a ferroelectric memory device.

In an embodiment, the dielectric layer 806B includes paraelectric materials. Paraelectric materials may include: SrTiO3, Ba(x)Sr(y)TiO3 (where x is −0.05, and y is 0.95), HfZrO2, Hf—Si—O, or La-substituted PbTiO3. In some embodiments, material layer stack including paraelectric materials can range from 5 nm to 100 nm in total thickness.

Figure 8D:
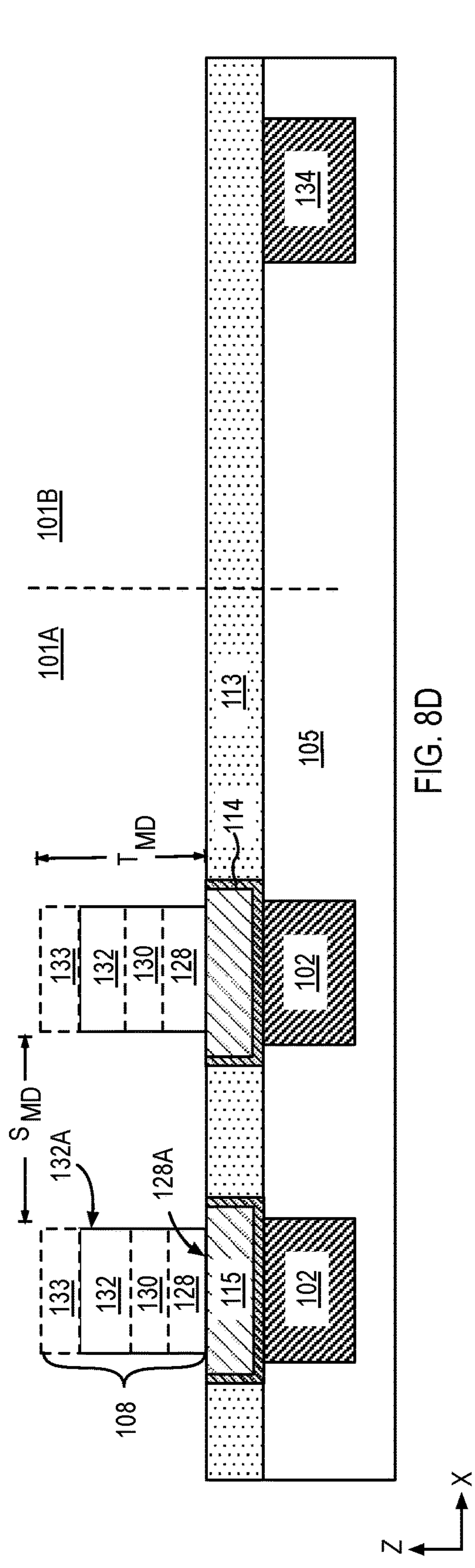
FIG. 8D is a cross-sectional illustration of the structure in FIG. 8C following the process to pattern the material layer stack to form a memory device above an electrode structure.

FIG. 8D is a cross-sectional illustration of the structure in FIG. 8C following the process to pattern hardmask layer 808 and the material layer stack 806. In an embodiment, hardmask layer 808 is etched by a plasma etch process. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9-1e12 ions/$cm^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations. It is highly desirable to pattern hardmask layer 808 to have substantially vertical side walls to prevent increase in a width when patterning the remaining layers in material layer stack 806.

A $CH_XF_Y$ (fluorocarbon) $O_2$ and Ar based gas combination may be utilized to etch hardmask layer 808 to form hardmask 133 in one of the three different plasma discharges described above. In an exemplary embodiment, hardmask 133 has a substantially vertical profile relative to a lowermost surface 128A. In some embodiments, photoresist mask 810 is removed after forming hardmask 133. The plasma etch process is continued to pattern conductive layer 806C. Hardmask 133 is utilized to etch conductive layer 806C. In an embodiment, a plasma etch process is utilized to etch the conductive layer 806C to form a top electrode 132. In the illustrative embodiment, top electrode 132 has substantially vertical sidewalls 132A. In some embodiments, hardmask 133 is removed during the plasma etch process as indicated by dashed lines, when the hardmask 133 includes a dielectric material. The etch process is continued to etch dielectric layer 806B to form etched dielectric layer 130 (herein dielectric layer 130).

The plasma etch process is continued to etch and form a bottom electrode 128. In an embodiment, the process utilized to etch conductive layer 806A (FIG. 8C) to form bottom electrode 128 may be substantially the same as the etch process utilized to form top electrode 132. In the illustrative embodiment, sidewalls of the memory device 108 are substantially vertical respect to a normal to lowermost surface 128A. The process of forming the top electrode 132, dielectric layer 130, bottom electrode 128 also completes formation of memory device 108.

Figures 9A, 9B, 9C:
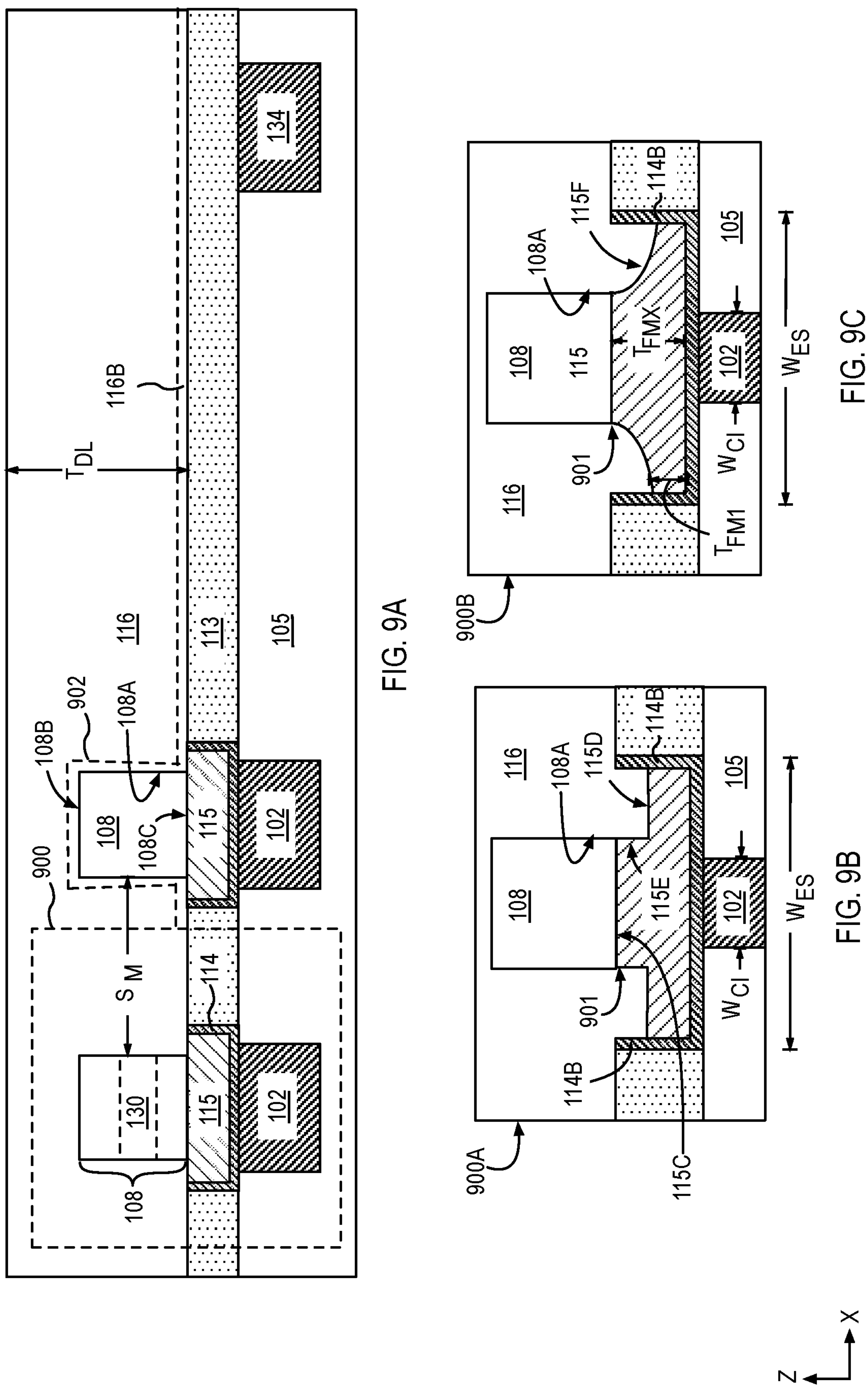
FIG. 9A is a cross-sectional illustration of the structure in FIG. 8D following the process to deposit a second and planarize a second dielectric on the memory devices.
FIG. 9B is a cross-sectional illustration of a portion of the structure in FIG. 9A, illustrating a shape of resulting conductive fill material after forming the memory device and depositing the second dielectric, in accordance with an embodiment of the present disclosure.
FIG. 9C is a cross-sectional illustration of a portion of the structure in FIG. 9A, illustrating a shape of resulting conductive fill material after forming the memory device and depositing the second dielectric, in accordance with an embodiment of the present disclosure.

FIG. 9A is a cross-sectional illustration of the structure in FIG. 8D following the process to deposit a dielectric 116 and following a process to planarize the dielectric 116. In an embodiment, dielectric 116 can be deposited by an atomic layer deposition (ALD) process, a plasma enhanced chemical vapor deposition (PECVD), chemical vapor deposition (CVD), a physical vapor deposition (PVD) process or a combination thereof.

In an embodiment, the dielectric includes a transition metal and oxygen, such as for example $Al_xO_y$, $HfO_x$, $ZrO_x$, $TaO_x$, $TiO_x$, $AlSiO_x$, $HfSiO_x$ or $TaSiO_x$. In other embodiments, dielectric 116 includes a nitride of Al, Zr or Hf, for example AlN, ZrN, or HfN. Some of the dielectric materials may be deposited by a process that utilizes hydrogen or ammonia containing precursor chemicals, while other materials may be deposited by a process that does not utilize hydrogen or be performed in an environment where hydrogen may be present. In some embodiments, deposition of dielectric 116 is performed by a combination of processing operations. A first operation may utilize a physical vapor deposition process to deposit a material including a transition metal and oxygen, such as but not limited to $Al_XO_Y$, $HfO_X$, $ZrO_X$, $TaO_X$, $TiO_X$, AlSiOX, $HfSiO_X$, $TaSiO_X$, or a transition metal and nitrogen such as but not limited to AlN, ZrN, or HfN. A second operation may be subsequently performed where one or more of $Al_XO_Y$, $HfO_X$, $ZrO_X$, $TaO_X$, $TiO_X$, AlSiOX, $HfSiO_X$, $TaSiO_X$, AlN, ZrN, or HfN may be deposited by a process that may or may not utilize a hydrogen precursor.

In other embodiments, dielectric 116 may include a same material sequentially deposited by two different deposition methods. For example, a first deposition process may be utilized to deposit a material in a hydrogen free environment, and a second deposition process may be utilized to deposit the same material that utilizes hydrogen. The advantage of this dual deposition operation is important when spacing, $S_M$, between adjacent memory devices 108 approaches 2-3 times a thickness of the material deposited by the first deposition process. In some such embodiments, a thin layer of dielectric 116B (within dashed lines 902) is deposited on the memory device 108 and on etch stop layer 113. A physical vapor deposition (PVD) process can be utilized to deposit thin layer of dielectric 116B to a thickness of less than 5 nm, where the deposition process does not expose the memory device 108 to hydrogen. In some embodiments, the PVD deposited material may have a wider portion adjacent to uppermost surface 108B and a narrower portion on sidewall 108A, as shown. The second deposition process may utilize a combination of CVD and ALD processes to provide uniform deposition, for example between adjacent memory devices 108. In some such embodiments, the dielectric 116 includes a same material as the material of the thin layer of dielectric 116B. In other embodiments, where $S_M$ is 20 nm or less, a dual deposition process described above can form a keyhole or an air gap between adjacent memory devices 108.

Some of the dielectric 116 materials can be deposited by a single ALD deposition process because they may be deposited by a hydrogen free precursor. In other embodiments, a first process may include ALD to deposit thin layer of dielectric 116B, followed by a bulk dielectric deposition using a CVD or a PVD process. It is to be appreciated that thin layer of dielectric 116B may include a different material than dielectric 116. Such an embodiment is described below in association with FIGS. 22A-22D.

In the illustrative embodiment, the dielectric 116 is blanket deposited on the memory device 108, on exposed portions of conductive fill material 115 and conductive hydrogen barrier 114. The dielectric 116 is deposited to a vertical thickness, $T_{DL}$, that is equal to or greater than a height of a via to be fabricated in the logic region 101B. The material of the dielectric 116 can be chosen based on the material of the ferroelectric dielectric layer 130 in the memory device 108, as discussed above. By pairing the dielectric 116 with the ferroelectric dielectric layer 130 can minimize lattice dislocations that can cause voids and potential pathways for hydrogen diffusion.

In some embodiments, the plasma etch process described in association with FIG. 8D can recess portions of the conductive fill material 115. The shape of resulting conductive fill material 115 and resulting structure of dielectric 116 is illustrated with respect to portions 900 in FIGS. 9B and 9C. FIG. 9B is a cross-sectional illustration of the structure within portion 900 in FIG. 9A, in accordance with an embodiment of the present disclosure. In some such embodiments, conductive fill material 115, as shown in portion 900A, may have surfaces that are at different levels or recessed relative to uppermost surface 115C. For example, as shown, conductive fill material 115 includes a surface 115D that is recessed relative to uppermost surface 115C, where the uppermost surface 115C and a lower most surface of memory device 108 meet at interface 901. In some such embodiments, the surface 115D may be substantially planar, and sidewall 115E may be substantially vertical as shown. In some embodiments, the conductive hydrogen barrier 114 can be substantially unimpacted by the etch process as shown. In the illustrative embodiment, dielectric 116 also fills the space above the surface 115D and below an interface 901 between memory device 108 and the conductive fill material 115. When dielectric 116 is deposited, dielectric 116 is contact with surface 115D, sidewall 115E and vertical portion 114B of conductive hydrogen barrier 114.

In other embodiments, the conductive fill material 115 is recessed with less well defined surfaces and sidewalls compared to conductive fill material 115 in FIG. 9B. FIG. 9C is a cross-sectional illustration of the structure within portion 900 in FIG. 9A, in accordance with an embodiment of the present disclosure. As shown in portion 900B, exposed surfaces of conductive fill material 115 are recessed to produce a gradually sloped surface away from the sidewall of memory device 108. The sloping surface is curved as shown. The conductive fill material 115 has a thickness $T_{FM}$ as measured from the interface 901 between the conductive fill material 115 and memory device 108. $T_{FM}$ decreases from a maximum thickness, $T_{FMX}$, under the memory device 108 to a min thickness $T_{FM1}$ where conductive fill material 115 is directly in contact with vertical portion 114B of conductive hydrogen barrier 114. $T_{FM}$ changes along the x-direction. As shown, $T_{FM}$ decreases away from sidewall 108A. In the illustrative embodiment, dielectric 116 also fills the space above the sloping surface 115F and below an interface 901 between memory device 108 and conductive fill material 115. When dielectric 116 is deposited, dielectric 116 is contact with surface 115F and sidewall portion 114B of conductive hydrogen barrier 114.

In some embodiments, where $W_{ES}$ is less than $W_{MD}$, memory device 108 is in contact with an uppermost surface 113A of etch stop layer 113 as shown in portion 900D in FIG. 9D. In some embodiments, the plasma etch process utilized to form memory device 108 will also recess portions of the uppermost surface 113A that is not covered by the memory device 108. In some such embodiments, the dielectric 116 is also deposited below an interface 903 between the memory device 108 and etch stop layer 113. The dielectric 116 is in contact with sidewall 113B and recessed surface 113C. The etch stop layer 113 has a thickness $T_L$ as measured from the interface 903 between the etch stop layer 113 and memory device 108. $T_L$ decreases from a maximum thickness, $T_{LX}$, under the memory device 108 to a min thickness $T_{L1}$ away from sidewall 108A. As shown, $T_L$ is substantially uniform away from sidewall 108A.

In other embodiments, where $W_{ES}$ is less than $W_{MD}$, the etch stop layer 113 is recessed with less well defined surfaces and sidewalls compared to etch stop layer 113 in FIG. 9D. As shown in portion 900E of FIG. 9E, exposed surfaces of etch stop layer 113 are recessed to produce a gradually sloped surface away from the sidewall of memory device 108. The sloping surface is curved as shown. The etch stop layer 113 has a thickness $T_L$ as measured from the interface 903 between the etch stop layer 113 and memory device 108. $T_L$ decreases from a maximum thickness, $T_{LX}$, under the memory device 108 to a min thickness, $T_{L1}$, away from sidewall 108A, $T_{L1}$ decreases away from sidewall 108A. In the illustrative embodiment, dielectric 116 also fills the space above the sloping surface 113D and below an interface 903. When dielectric 116 is deposited, dielectric 116 is contact with surface 113D.

In various embodiments, discussed with reference to FIGS. 9B-9D, conductive hydrogen barrier 114, etch stop layer 113 and dielectric 116 combine to provide a conductive and an insulative hydrogen barrier.

Figure 10A:
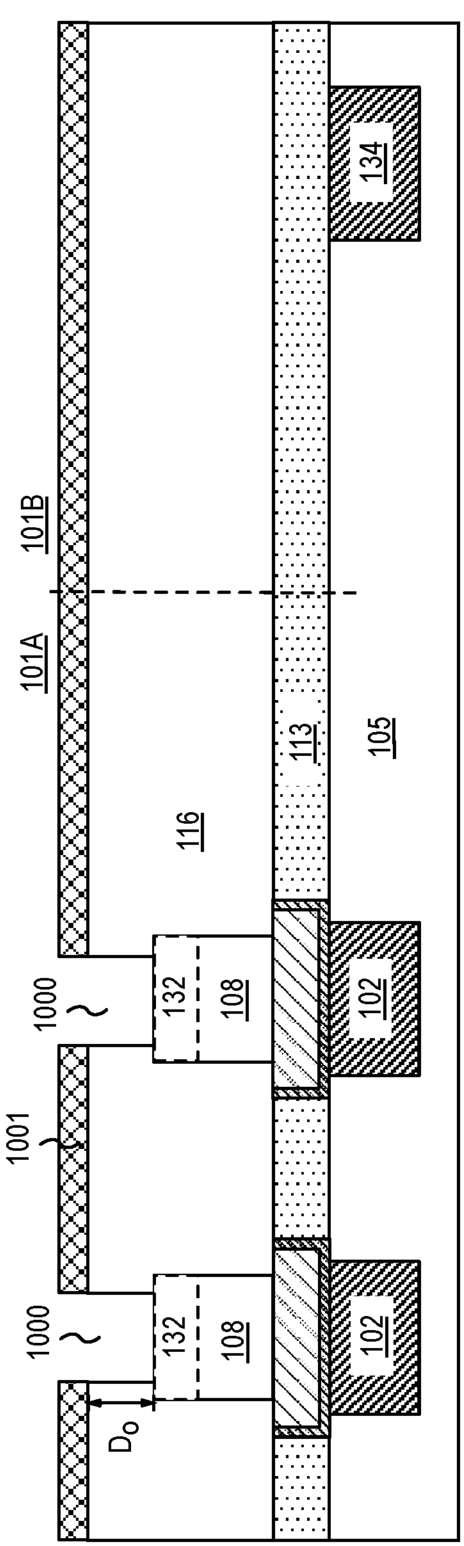
FIG. 10A is a cross-sectional illustration of the structure in FIG. 9A following the process to form openings in the second dielectric through a first mask.

FIG. 10A is a cross-sectional illustration of the structure in FIG. 9A following the process to form openings 1000 in the dielectric 116 through a mask 1001. The openings 1000 may have sidewalls that are substantially vertical or flared. In the illustrative embodiment, the sidewalls of opening 1000 are substantially vertical. Mask 1001 may be formed on the dielectric 116 by a lithographic process. The openings 1000 may be formed by a plasma etch process that etches dielectric 116 but is selective to top electrode 132 of memory device 108. In some embodiments, the opening 1000 exposes a portion of the uppermost surface 108B of the memory device 108. In other embodiments, the openings 1000 are wider and expose an entire upper most surface 108B. In some embodiments, when openings 1000 exposes the entire uppermost surface 108B, etch process may recess portions of dielectric 116 adjacent to top electrode 132. In some embodiments, openings 1000 can have a depth Do, between 30 nm-70 nm. The Do may be larger than a final vertical thickness of via electrode that is fabricated due to plurality of planarization process operations to be utilized.

Figure 10B:
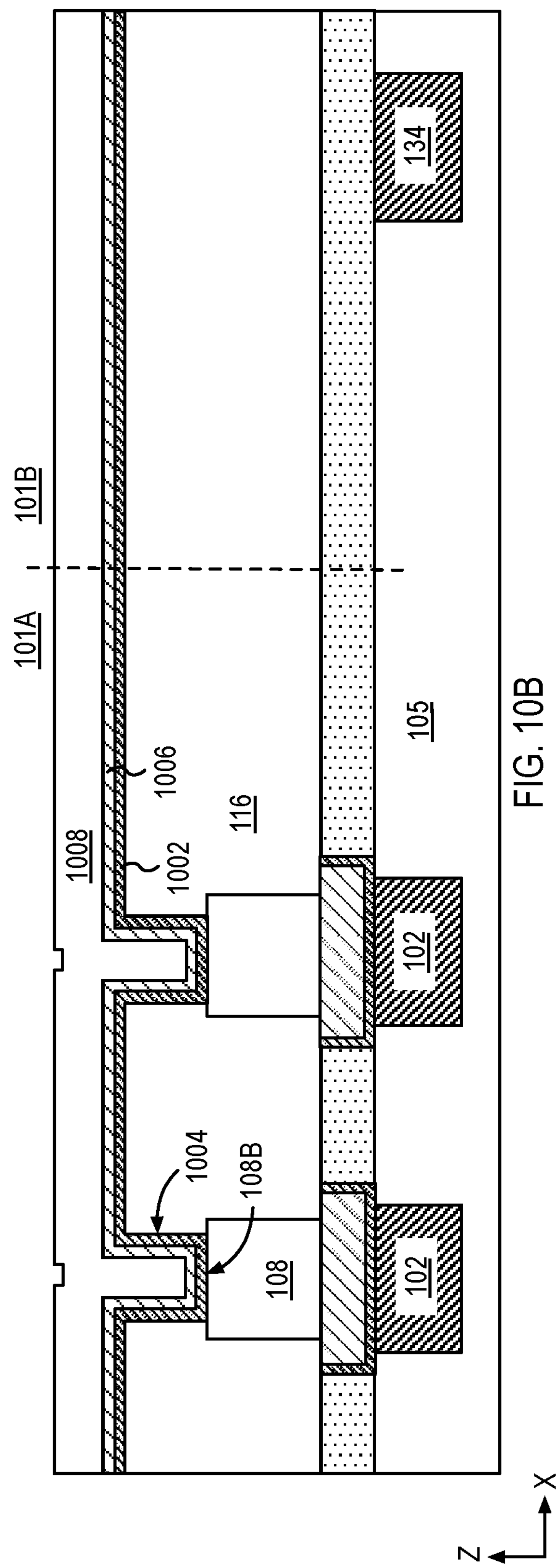
FIG. 10B is a cross-sectional illustration of the structure in FIG. 10A following the process to deposit materials to form via electrodes.

FIG. 10B is a cross-sectional illustration of the structure in FIG. 10A following the process to deposit materials to form via electrodes. In the illustrative embodiment, conductive hydrogen barrier material 1002 is blanket deposited into the openings 1000, on the memory device 108 and on sidewall of dielectric 116. The conductive hydrogen barrier material 1002 includes a material that is compatible with the dielectric 116 so that an interface 1004 between the conductive hydrogen barrier material 1002 and the dielectric 116 is not a source of dislocations.

In an embodiment, a liner layer material 1006 is blanket deposited in the openings 1000, and on the conductive hydrogen barrier material 1002. A layer of fill metal 1008 is deposited into the remaining portions of openings 1000 on the liner layer material 1006.

In embodiments, the conductive hydrogen barrier material 1002, the liner layer material 1006 and layer of fill metal 1008 are deposited by an ALD, PVD or sputter deposition process.

FIG. 10C is a cross-sectional illustration of the structure in FIG. 10B following the process to planarize and form a via electrode 118 on each memory device 108 and following the process to remove dielectric 116 from the logic region 101B.

In an embodiment, the planarization process includes a chemical mechanical planarization (CMP) process. The CMP process removes layer of fill metal 1008, liner layer material 1006 and the conductive hydrogen barrier material 1002 from an uppermost surface 116A of the dielectric 116. The planarization process isolates the conductive hydrogen barrier material 1002 to form a conductive hydrogen barrier 114, liner layer material 1006 to form liner layer 122 and the layer of fill metal 1008 form conductive fill material 124 within the openings 1000. The CMP process may also reduce the as deposited thickness of the dielectric 116.

After the process to fabricate via electrodes 118. A mask 1010 is formed on the dielectric 116 to further pattern and remove the dielectric 116 from the logic region 101B. It is to be appreciated that while dielectric 116 is utilized to block diffusion of hydrogen toward memory device 108, dielectric 116 includes a material that has a high film density. Dielectric 116 may also have a higher than desirable dielectric constant capable of increasing capacitance to the logic interconnect circuitry. It is advantageous to replace the dielectric 116 in the logic region 101B with a dielectric that is compatible with interconnect circuitry. In an embodiment, a plasma etch process is utilized to etch the dielectric 116, form an opening 1011 and expose the etch stop layer 113 in logic region 101B. In some embodiments the dielectric 116 has a sidewall profile that is substantially vertical. In other embodiments. Sidewall 116A is tapered as indicated the dashed line 1012.

FIG. 10D is a cross-sectional illustration of the structure in FIG. 10C following the process to deposit a dielectric 142 in the logic region 101B and planarizing the dielectric 142. In an embodiment, the dielectric 142 is blanket deposited on the etch stop layer 113, on the dielectric 116 and on via electrodes 118. The blanket deposition may be carried out by an ALD, PVD, PECVD, or a CVD process. After deposition the dielectric 142 is planarized. The planarization process is designed to leave a dielectric 142 having a vertical thickness, $T_O$, that will accommodate fabrication of a via structure and metal lines within the dielectric 142. In the illustrative embodiment, the dielectric 116 has an uppermost surface 116A that is co-planar or substantially co-planar with an uppermost surface 142A of dielectric 142. Also as shown, uppermost surfaces 118A of via electrodes 118 are co-planar or substantially co-planar with the uppermost surface 142A, and 116A.

Figure 10E:
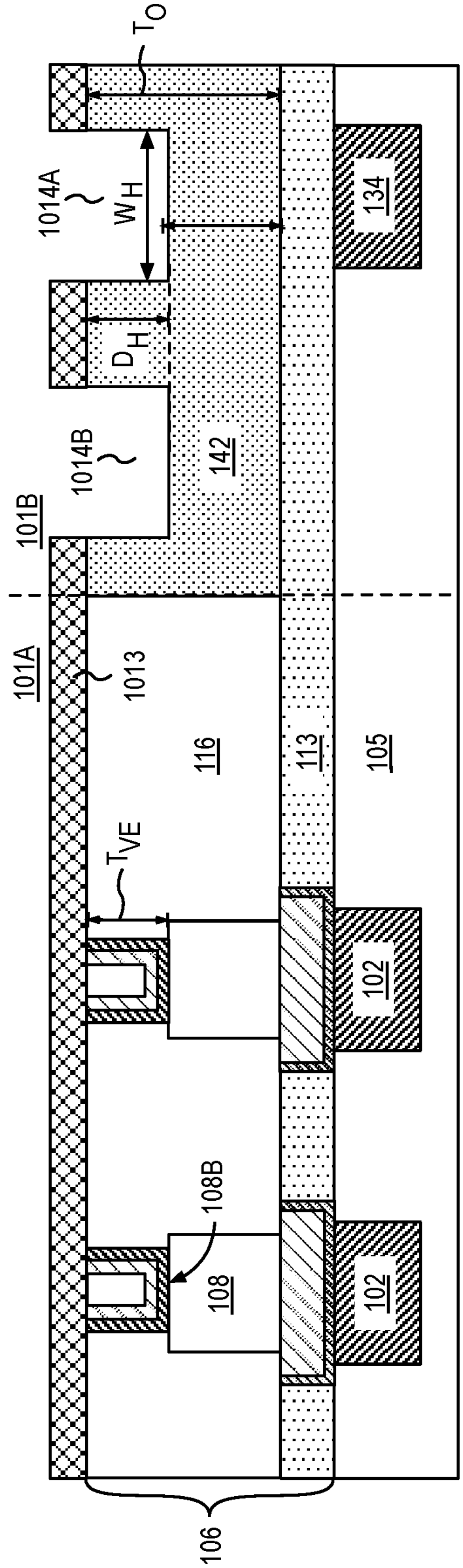
FIG. 10E is a cross-sectional illustration of the structure in FIG. 10D following the process to form a second mask on the first and second dielectrics, and form hanging trench openings in the third dielectric, in accordance with an embodiment of the present disclosure.

FIG. 10E is a cross-sectional illustration of the structure in FIG. 10D following the process to form mask 1013 on dielectrics 116 and 142, and on the via electrodes 118, and following the process to etch dielectric 142 to form hanging trench openings 1014A and 1014B in logic region 101B. Mask 1013 is designed to form an interconnect structure in logic region 101B. In an embodiment, mask 1013 is formed by a lithographic process and includes a photoresist material. In different embodiments, $D_H$ can be equal, less than or greater than $D_V$. In general $D_H$ may depend on interconnect circuitry within level 106.

In an embodiment, a plasma etch process is utilized to etch dielectric 142 through openings in mask 1013 to form hanging trench openings 1014A and 1014B. Dielectric 142 may be etched to a depth, $D_H$ and a width, $W_H$, that is determined by a thickness $T_O$, of dielectric 142 above the etch stop layer 113. DH is measured relative to an uppermost surface 142A. In embodiments, $D_H$ ranges between 10 nm and 50 nm and $W_H$ ranges between 10 nm and 200 nm. $W_H$ is determined by a width of interconnect vias to be formed within the trench. $D_H$ may be set by a height and width of a via to be formed within hanging trench opening 1014A. The height and width of a via is determined by a desired minimum line conductance of the via and a metal line to be formed within hanging trench opening 1014A.

Figure 10F:
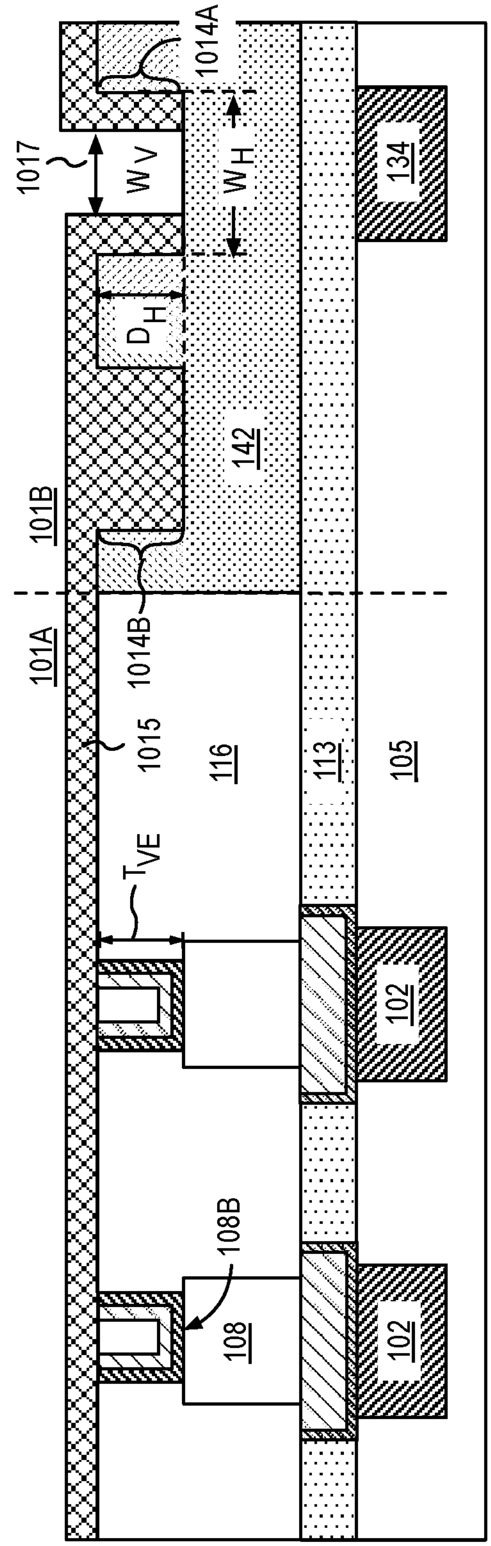
FIG. 10F is a cross-sectional illustration of the structure in FIG. 10E following the process to form a form a via mask within a hanging trench opening above a conductive interconnect in the logic region.

FIG. 10F is a cross-sectional illustration of the structure in FIG. 10E following the process to form a form a via mask 1015 within the hanging trench in logic region 101B. In an embodiment, mask utilized to form hanging trench openings 1014A and 1014B is removed and a via mask 1015 is formed. In an embodiment, via mask 1015 is formed by a lithographic process and includes a photoresist material. Via mask 1015 has an opening 1017 within hanging trench opening 1014A that is designed to enable etching dielectric 142 to form a via opening in a subsequent operation. The opening 1017 has a lateral thickness $W_V$. The opening may be symmetric about the hanging trench opening 1014A or offset. $W_V$ can range between 25%-75% of $W_H$.

Figure 10G:
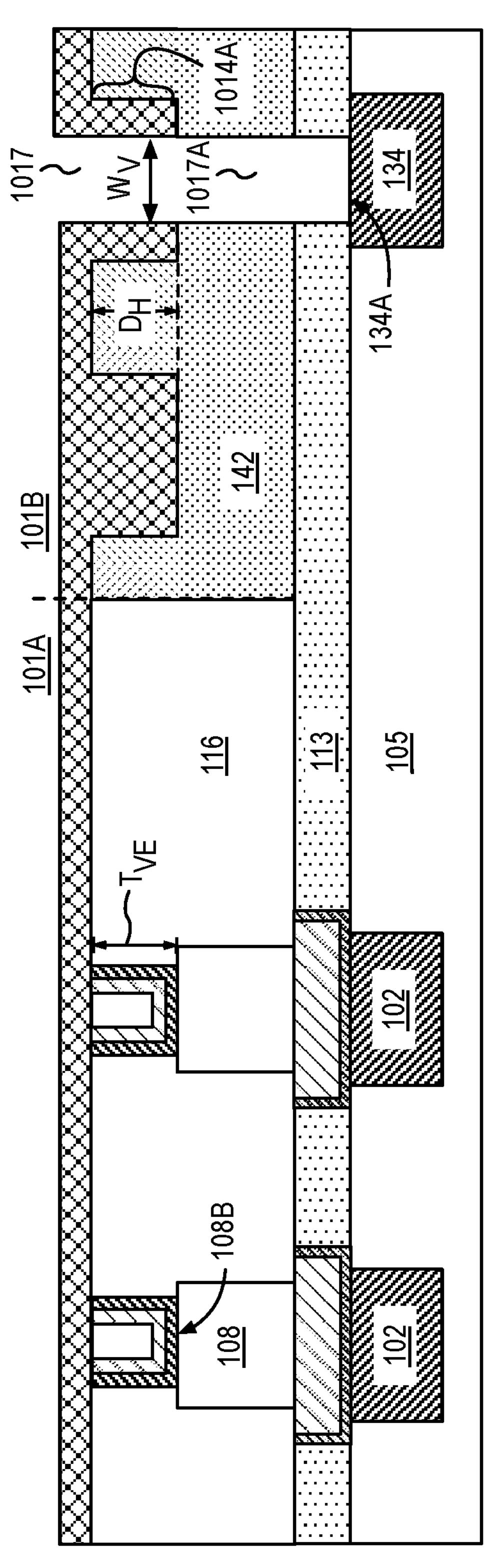
FIG. 10G is a cross-sectional illustration of the structure in FIG. 10F following the process to etch dielectric to form a via opening below a hanging trench opening in the logic region.

FIG. 10G is a cross-sectional illustration of the structure in FIG. 10F following the process to etch dielectric 142 to form a via opening 1017A below the hanging trench opening 1014A in logic region 101B. In an embodiment, a plasma etch process is utilized to form via opening 1017A by etching the dielectric 142 and etch stop layer 113. In an embodiment, the dielectric 142 is first etched and the etch is halted after exposing etch stop layer 113. The plasma etch process is continued with a different chemistry to etch stop layer 113. An advantage of the process methodology outlined herein, is that etch stop layer 113 has a thickness, $T_L$, that is determined by a deposition process and by the formation of electrode structure 112 in memory region 101A. Formation of via opening 1017A within etch stop layer 113 can be targeted and tuned by fixing a thickness of the etch stop layer 113 to a desired thickness. In the illustrative embodiment, the formation of via opening 1017A exposes an uppermost surface 134A of conductive interconnect 134. The via opening 1017A may have a first slope within dielectric 142 and a second slope within etch stop layer 113 due to a difference in material between the dielectric 142 and etch stop layer 113.

Figure 10H:
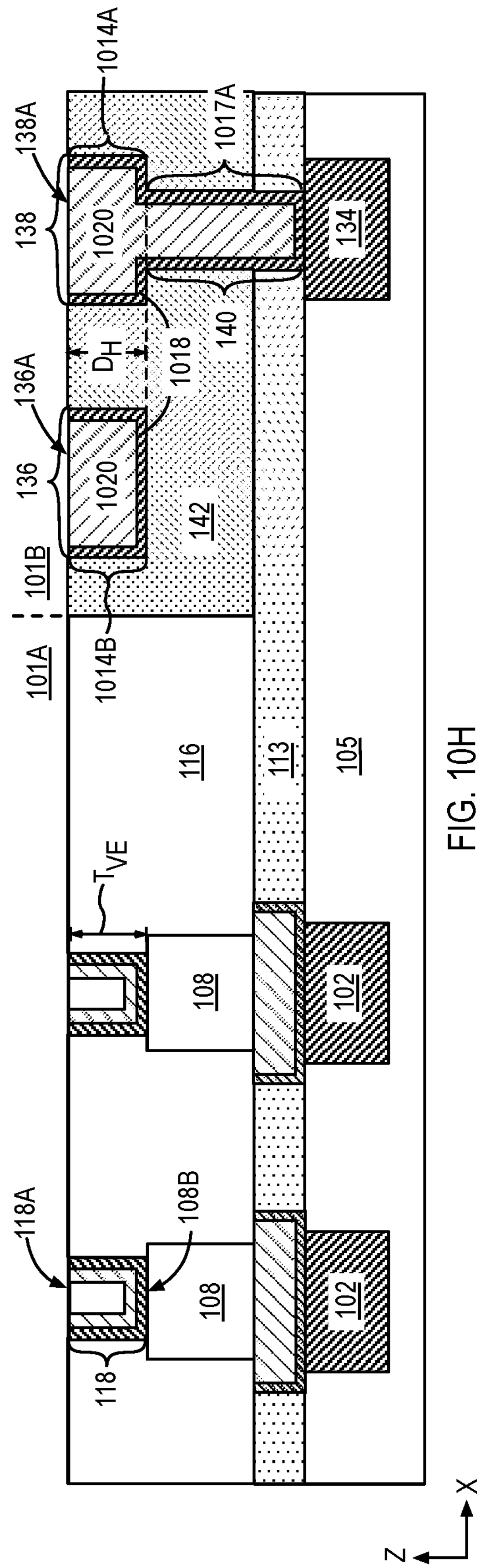
FIG. 10H is a cross-sectional illustration of the structure in FIG. 10G following the process to remove mask utilized to form via opening within the hanging trench and deposit a conductive material into the openings to form a via structure, and metal lines in the hanging trench openings.

FIG. 10H is a cross-sectional illustration of the structure in FIG. 10G following the process to remove mask utilized to form via opening within the hanging trench opening 1014A and deposit a conductive material into the openings to form via structure 140, and metal lines 136. Mask utilized to form via opening 1017A is removed and a conductive material is deposited into the hanging trench openings 1014A and 1014B and via opening 1017A. In an embodiment, depositing the conductive material includes depositing a liner layer 1018 in the via opening 1017A, hanging trench opening 1014A, and 1014B. In some such embodiments, the liner layer 1018 is also deposited on uppermost surface 134A of the conductive interconnect 134, on sidewalls of etch stop layer 113, dielectric 142, on uppermost surface 142A and on surfaces of via electrodes 118. A fill material 1020 is deposited on the liner layer 1018. In some embodiments, fill material 1020 includes copper, tungsten, nickel or cobalt, and liner layer 1018 includes ruthenium tantalum, or nitrides of tantalum or titanium. In other embodiments where no liner is implemented a fill metal or a conductive material is directly deposited on uppermost surface 134A of the conductive interconnect 134, on sidewalls of etch stop layer 113, dielectric 142, on uppermost surface 142A and on surfaces of via electrodes 118.

A planarization process may be utilized to remove an excess conductive material deposited on dielectric 142 and on via electrodes 118. In an embodiment, the planarization process includes a chemical mechanical polish (CMP) process. The CMP process isolates metal lines 136 and 138 within hanging trench openings 1014A and 1014B. Via structure 140 is formed at the same time as metal line 138. The liner layer is contiguous between via structure 140 and metal line 138 and fill material 1020 extends continuously from metal line 138 to via structure 140.

In the illustrative embodiment, uppermost surfaces 118A of via electrode 118 and uppermost surfaces 136A, 138A of metal line are co-planar or substantially co-planar after the CMP process.

In general, via electrodes 118 may be fabricated before or after fabrication of via structure 140 and metal line 138. The method described in association with FIGS. 8A-F can be performed so as to fabricate via structure 140 and metal line 138 prior to fabrication of via 116, as is described herein.

In some embodiments, the memory device 108 may be taller such that the via structure 140 is confined to level 106 and metal lines 136 and 138 are on a level above level 106. In some such embodiments, the via electrodes may be fabricated before via structure 140 and metal lines 136 and 138 or after. In some such embodiment, via structure 140 may not be formed within a hanging trench opening 1014A.

Figure 11A:
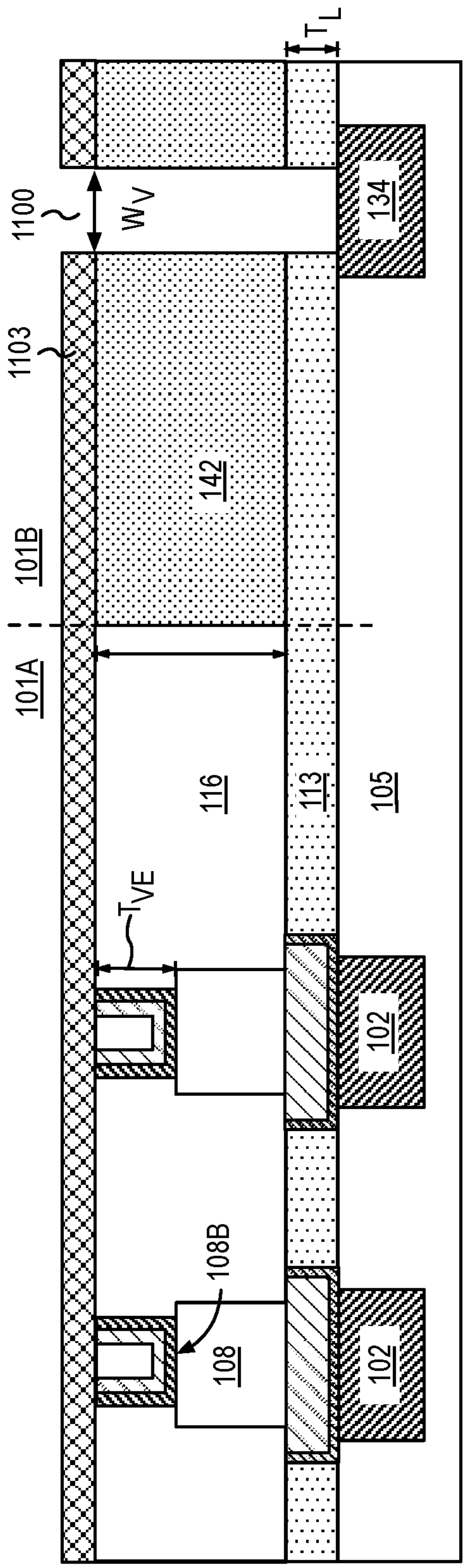
FIG. 11A is a cross-sectional illustration of the structure in FIG. 10D following the process to form a via electrode on the memory device, in accordance with an embodiment of the present disclosure.

FIG. 11A is a cross-sectional illustration of the structure in FIG. 10D following the process to form via electrodes 118, in accordance with an embodiment of the present disclosure. After formation of via electrodes 118, an opening 1100 is formed in the dielectric 142. An opening 1100 is formed by forming a mask 1103 on the dielectric 116 and 142, and on the via electrodes 118. In an embodiment, opening 1100 is formed by etching the dielectric 142 and the etch stop layer 113 and exposing conductive interconnect 134. Opening 1100 has a width, $W_{VE}$ that may be substantially the same as width of via structure 140 (FIG. 10H).

Figure 11B:
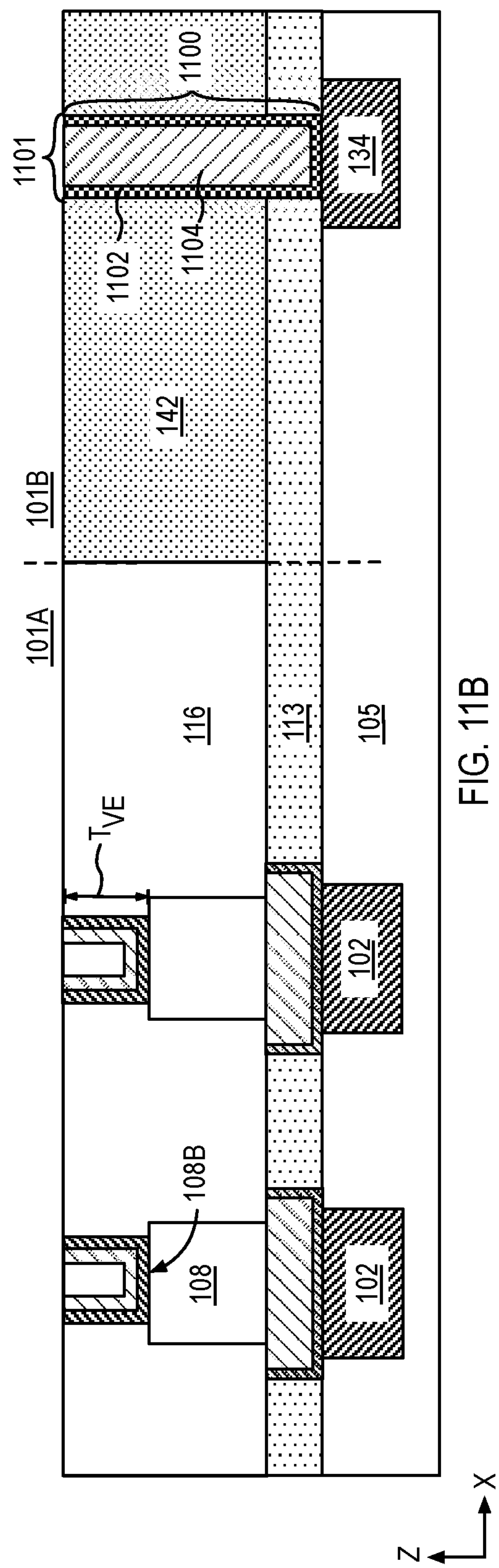
FIG. 11B is a cross-sectional illustration of the structure in FIG. 11A following the process to form a via structure in the logic region, in accordance with an embodiment of the present disclosure.

FIG. 11B is a cross-sectional illustration of the structure in FIG. 11A following the process to form via structure 1101. The process further includes depositing a liner layer 1102 in the opening 1100, on the conductive interconnect 134, on sidewalls of dielectric 142 and of sidewalls of etch stop layer 113 and on the conductive interconnect 134. A fill material 1104 may then deposited on the liner layer 1102. A planarization is performed after the deposition process. In some embodiments, liner layer 1102 includes a material that is the same or substantially the same as the material of the liner layer 1018. In some embodiments, fill material 1104 includes a material that is the same or substantially the same as the material of the fill material 1020. Liner layer 1102 and fill material 1104 may be formed by a substantially identical process utilized to form liner layer 1018 and fill material 1020 described in association with FIG. 10H.

Figure 11C:
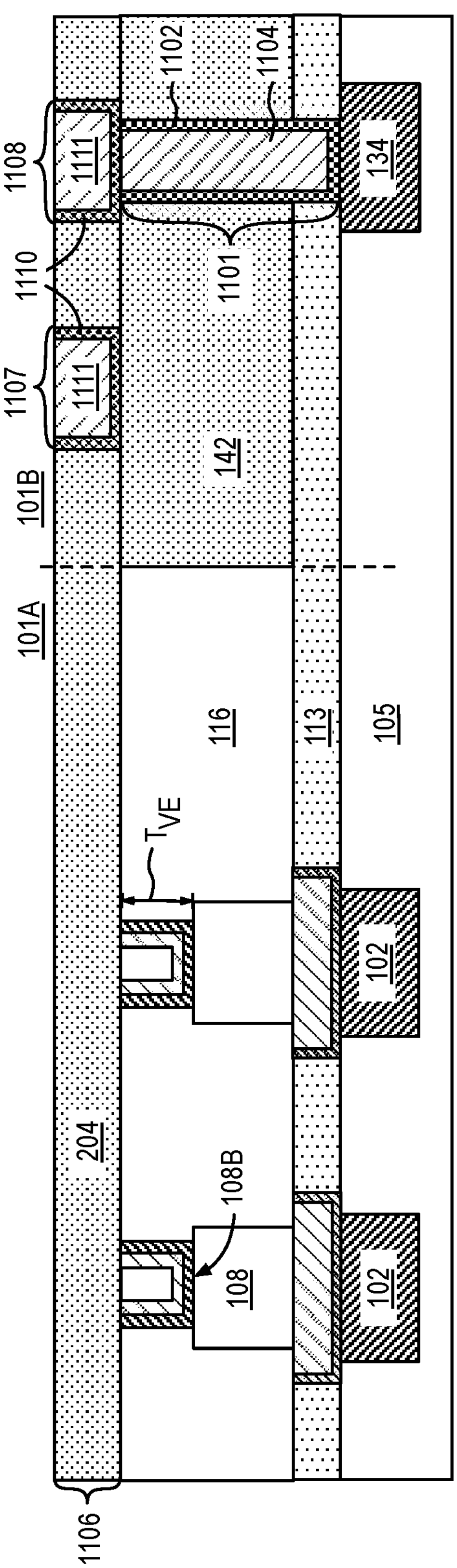
FIG. 11C is a cross-sectional illustration of the structure in FIG. 11B following the process to deposit a fourth dielectric on the second and third dielectric.

FIG. 11C is a cross-sectional illustration of the structure in FIG. 11B following the process to deposit a dielectric 204 to form a level 1106. The level 1106 is the same as level 202 described in association with FIG. 2. In an embodiment, the dielectric 204 includes a material that is the same or substantially the same as the material of the dielectric 142 and is deposited to a thickness desirable to form electrodes in the memory region and metal lines in the logic region. In other embodiments dielectric 204 includes a material that is different from dielectric 142. In some embodiments, dielectric 204 includes a substantially similar base material as dielectric 142, for example, silicon and oxygen, but includes various concentrations of one or more of carbon or nitrogen. In other embodiments, dielectric 204 includes a substantially similar base material as dielectric 142, for example, silicon and oxygen, but includes various concentrations of carbon but excludes nitrogen. In yet other embodiments, dielectric 204 includes a substantially similar base material as dielectric 142, for example, silicon and oxygen but where the materials have different densities. It is to be appreciated that dielectric 204 includes a material that can be deposited at lower temperatures and have a lower film density than dielectric 116. Dielectric 204 may not be required to provide a diffusion barrier capability like dielectric 116. The conductive hydrogen barrier 120 within via electrode 118 permits a dielectric 204 having a higher porosity film with a low film density to be deposited instead of another dielectric similar to dielectric 116. Additionally, depositing a material with lower film density can facilitate a single deposition over the logic and memory regions 101B and 101A, respectively. No further etching and removing of a dielectric material from the logic region is required, eliminating further fabrication process operations and reducing cost. In an embodiment, a plurality of openings are formed simultaneously in the dielectric 204. Metal lines 1107 and 1108 are formed within the openings formed in the dielectric 204 in the logic region. In the illustrative embodiment, in contrast to metal line 138, metal line 1108 includes a liner layer 1110 that is directly above and laterally on an uppermost surface of fill material 1104, and in contact with liner layer 1102. As shown, fill metal 1111 may be discontinuous from the fill material 1104. The liner layer 1110 provides adhesion for fill metal 1111. The deposition and planarization processes utilized to form metal lines 1107 and 1108 are substantially the same as the deposition and planarization processes utilized to fabricate via structure 208.

In some embodiments, liner layer 1110 and fill metal 1111 includes a material that is the same or substantially the same as the material of the liner layer 1102 and fill material 1104. Depending on a width of metal lines 1107 and 1108, liner layer 1110 may be thicker than liner layer 1102 and may include a material that is different from liner layer 1102. In some embodiments, liner layer 1110 may have a thickness that is less than 5 nm and any reduction in electrical conductance may be negligible.

Figure 11D:
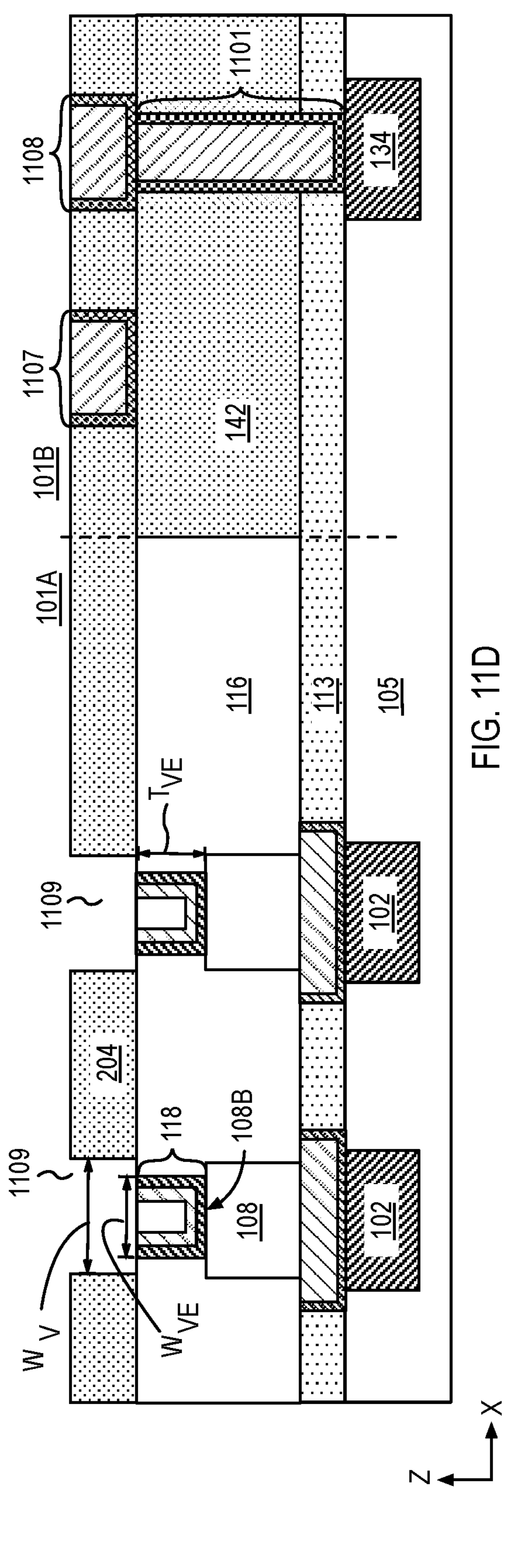
FIG. 11D is a cross-sectional illustration of the structure in FIG. 11C following the process to form openings to form electrodes in the memory region and metal lines in the logic region.

FIG. 11D is a cross-sectional illustration of the structure in FIG. 11C following the process to form openings 1109 to form electrodes in the memory region 101A. In the illustrative embodiment, openings 1109 are formed in the dielectric 204. Openings 1109 expose the via electrodes 118. Openings 1109 may be formed by forming a mask on the dielectric 204 and patterning the dielectric 204 in the memory region 101A. In the illustrative method embodiments, openings 1109 may be smaller than, substantially the same size as or larger the via electrodes 118. This method also offers an advantage over methods that simultaneously form openings 1109 and a via opening for via electrode 118. Misalignments between opening 1109 and via electrode 118, by up to 50% of $W_{VE}$ may be acceptable. Openings 1109 have a lateral thickness, $W_V$. In embodiments, where the openings 1109 are larger than via electrodes 118, i.e., $W_V$ greater than $W_{VE}$, dielectric 116 is also exposed while forming openings 1109, as shown.

Figure 11E:
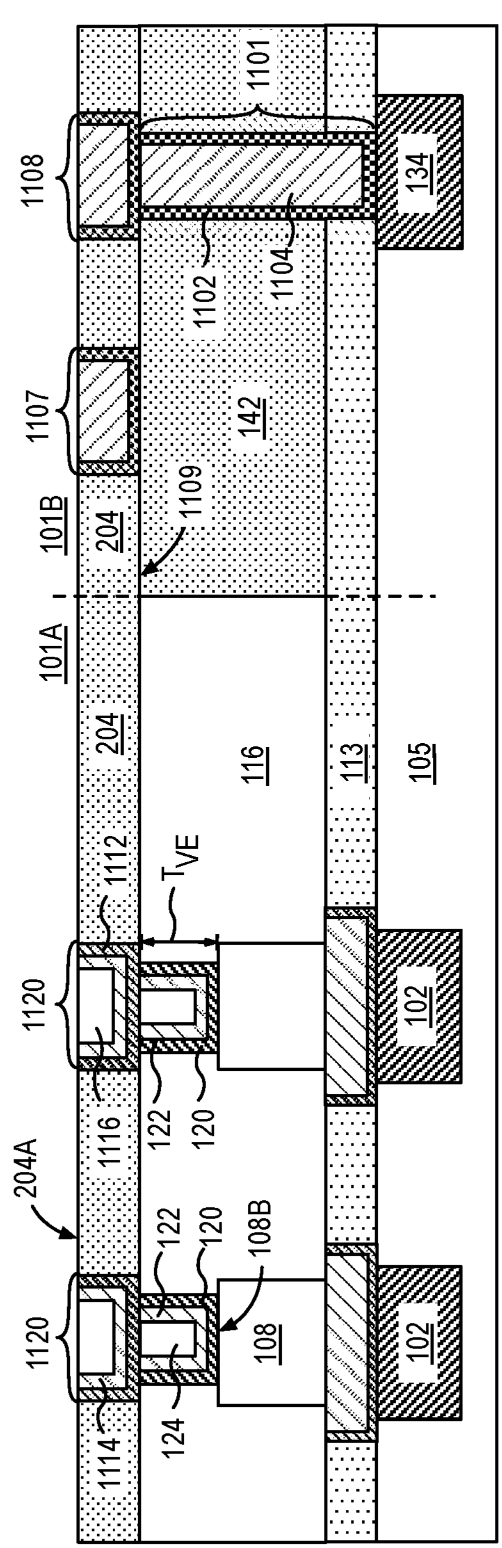
FIG. 11E is a cross-sectional illustration of the structure in FIG. 11D following the process to form an electrode on the via electrode.

FIG. 11E is a cross-sectional illustration of the structure in FIG. 11D following the process to form an electrode 1120 on each of the via electrodes 118. Electrode 120 may be a trench electrode 1120. In the illustrative embodiment, a conductive hydrogen barrier 1112 is blanket deposited on the surface of the via electrode 118, on portions of the dielectric 116, on sidewalls of dielectric 204 and on an uppermost surface 204A of the dielectric 204 and on the metal lines 136 and 1108. The conductive hydrogen barrier 1112 may be deposited by an atomic deposition layer process that provides for substantially uniform deposition on via electrode 118 as well as on sidewalls of dielectric 204. In the illustrative embodiment, the conductive hydrogen barrier 1112 extends over and is in contact with the conductive hydrogen barrier 120, liner layer 122 and conductive fill material 124.

The deposition process continues with the formation of a liner layer 1114 in the openings 1109 on the conductive hydrogen barrier 1112. A fill metal 1116 is then deposited on the liner layer 1114 in openings 1109. A planarization process includes a CMP process that is performed to remove the fill metal 1116, the liner layer 1114 and the conductive hydrogen barrier 1112 from on or above the uppermost surface 204A. In an embodiment, the CMP process forms an electrode 1120 on via electrode 118. In various embodiments, conductive hydrogen barrier 1112 includes a material that is the same or substantially the same as the material of the conductive hydrogen barrier 114; liner layer 1114 includes a material that is the same or substantially the same as the material of the liner layer 122, and conductive fill metal 1116 includes a material that is the same or substantially the same as the material of the conductive fill material 124. As shown, electrode 1120 has an uppermost surface 1120A that is substantially planar. The surface 1120A can be co-planar or substantially co-planar with uppermost surface 1108A of the metal line 1108.

The metal lines 1107 and 1108, and electrodes 1120 are fabricated independently of a thickness requirement for the memory device and offers process flexibility. The electrode 1120 may be substantially similar to a contact electrode 206, that is shaped in a trench, depicted in FIGS. 4A and 4B that couple a plurality of memory devices along the y-direction. In some such embodiments, the trench electrode 1120 couples a memory device such as memory device 302 on a plane behind a plane of the memory device 108.

Figure 11F:
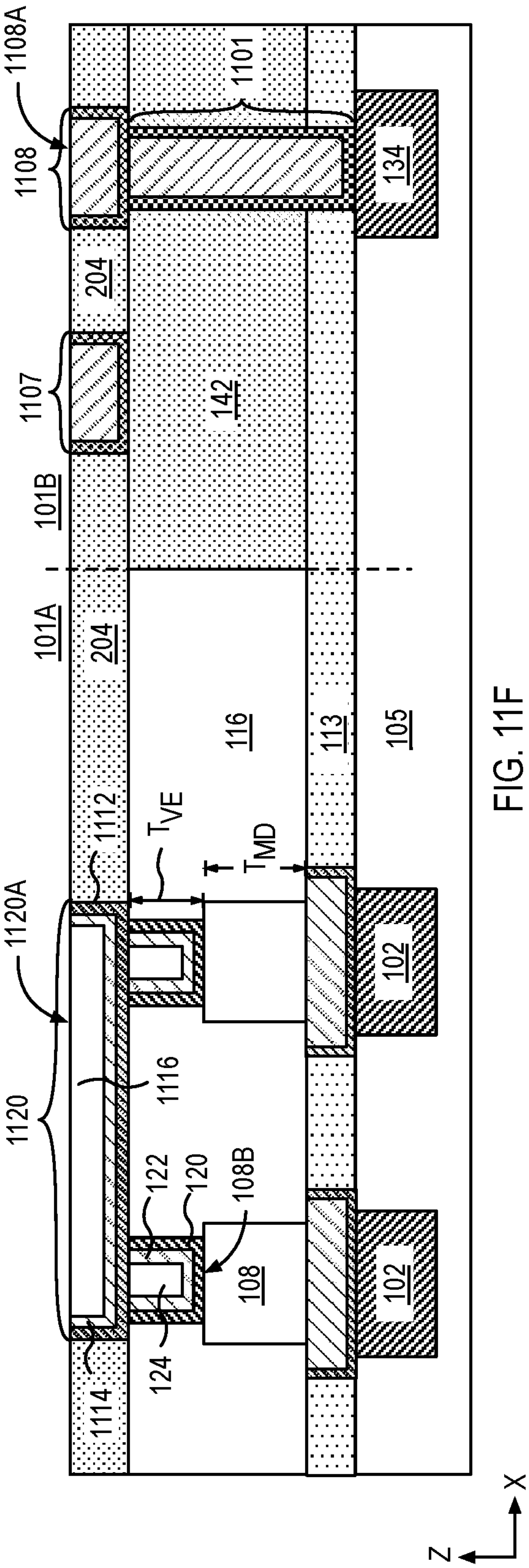
FIG. 11F is a cross-sectional illustration of the structure in FIG. 11D following the process to form a trench electrode to couple a plurality of via electrodes.

In other embodiments, electrode 1120 is a trench electrode 1120 that couples two or more memory devices 108 along the x-direction as illustrated in FIG. 11F (trench electrode 1120 may also be a contact electrode). The surface 1120A can be co-planar or substantially co-planar with uppermost surface 1108A of the metal line 1108 as shown.

In some such embodiments, the conductive hydrogen barrier 1112 also extends on dielectric 116 between adjacent memory devices 108. As shown, liner layer 1114 and fill metal 1116 also extend over dielectric 116.

In some embodiments, the via structure 1101, metal lines 1107 and 1108 may be fabricated prior to formation of the via electrodes 118 and electrodes 1120. In some such embodiments, the opening for electrode 1120 is made prior to forming an opening for a via electrode. The process is substantially similar to the process described in association with FIGS. 10F-G.

Figure 12A:
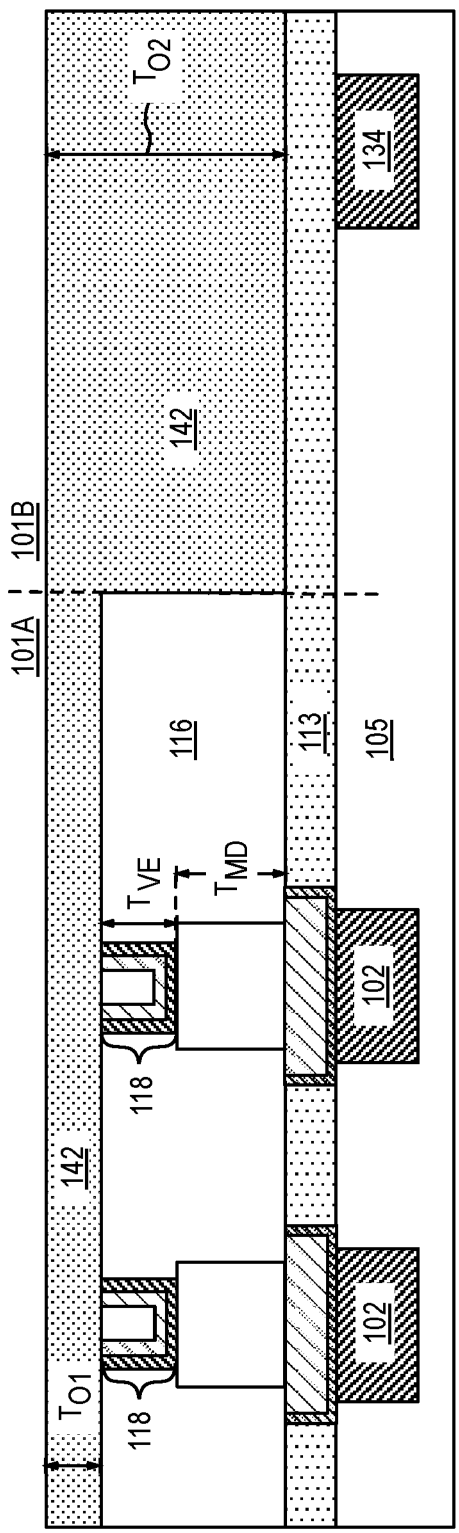
FIG. 12A is a cross-sectional illustration of the structure in FIG. 10D following the process to planarize the third dielectric, in accordance with an embodiment of the present disclosure.

In some embodiments, where the combined height of memory device 108 and via electrode 118, ($T_{MD}$+$T_{VE}$) is substantially equal to a height of via structure 208, the dielectric 142 may not be planarized to a level of the uppermost surface 116A of dielectric 116 in the memory region 101A. In some such embodiments, dielectric 142 extends over dielectric 116 in the memory region 101A, as illustrated in FIG. 12A. FIG. 12A is a cross-sectional illustration of the structure in FIG. 10D following the process to planarize dielectric 142. In an embodiment, the planarization process leaves a thickness, $T_{O1}$ of dielectric 142 above dielectric 116 that is sufficient to fabricate electrodes above the via electrodes 118 and metal lines above a via in the logic region. Vertical thickness, $T_{O2}$ is equal to vertical thickness of a via and a thickness of metal lines to be fabricated in the logic region 101B.

Figure 12B:
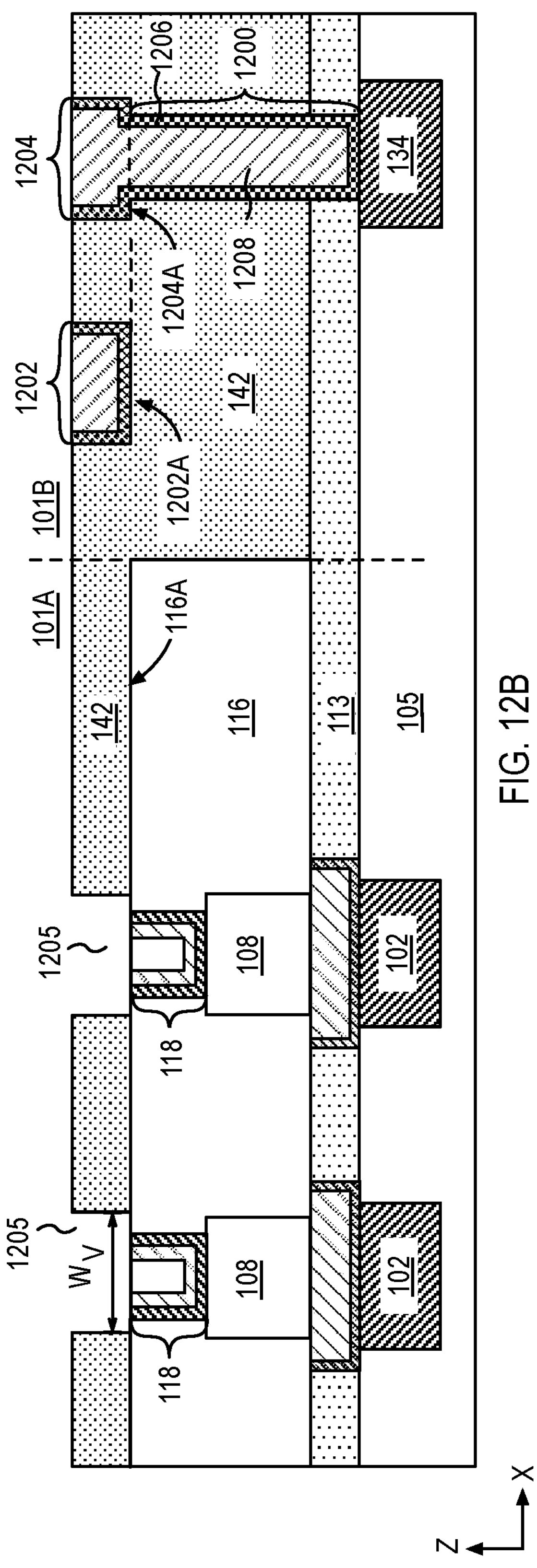
FIG. 12B is a cross-sectional illustration of the structure in FIG. 12A following the process to form a via structure, and metal lines in the logic region, in accordance with an embodiment of the present disclosure.

FIG. 12B is a cross-sectional illustration of the structure in FIG. 12A following the process to form via structure 1200, and metal lines 1202 and 1204. In an embodiment, the process utilized to form via structure 1200, and metal lines 1202 and 1204 includes a process that is the same or substantially the same as the process utilized to form via structure 140, and metal lines 136 and 138 (described in association with FIGS. 10E-10H), in accordance with an embodiment of the present disclosure. In the illustrative embodiment, the via structure 1200 includes a liner layer 1206 and a fill material 1208 on liner layer 1206. In some embodiments, liner layer 1206 includes a material that is the same or substantially the same as the material of the liner layer 1018. In some embodiments, fill material 1208 includes a material that is the same or substantially the same as the material of the fill material 1020. In an embodiment, the materials utilized to form via structure 1200, and metal lines 1202 and 1204 include materials that are the same or substantially the same as the materials utilized to form via structure 140, and metal lines 136 and 138, (described in association with FIGS. 10E-10H).

It is to be appreciated that lower most surface 1202A of metal line 1202 and lower most surface 1204A of metal line 1204 can be at a level that is below the uppermost surface 116A of dielectric 116. A plasma etch process utilized to form hanging trenches to form metal lines may be targeted to approximately achieve a desired depth in dielectric 142. In some embodiments, lower most surface 1202A of metal line 1202 and lower most surface 1204A of metal line 1204 can be at a level that is at the uppermost surface 116A of dielectric 116, as shown. In other embodiments, lower most surface 1202A of metal line 1202 and lower most surface 1204A of metal line 1204 can be at a level that is above the uppermost surface 116A of dielectric 116.

After formation of via structure 1200, and metal lines 1202 and 1204, the process is continued to form openings 1205 in the dielectric 142 in the memory region. The process utilized to form openings may be the same or substantially the same as process utilized to form openings 1109 (described in association with FIG. 11D), in accordance with an embodiment of the present disclosure.

FIG. 12C is a cross-sectional illustration of the structure in FIG. 12B following the process to form an electrode 1120 on a respective via electrode 118. In an embodiment, the process utilized to form electrodes 1120 is described in association with FIGS. 11D-11E.

In some embodiments, via and one or more metal lines in the logic region may be fabricated first and then via electrodes may be fabricated in the memory region. FIG. 13A is a cross-sectional illustration of the structure in FIG. 11C, in an embodiment where via electrodes are not yet fabricated above a respective memory device 108.

Figure 13B:
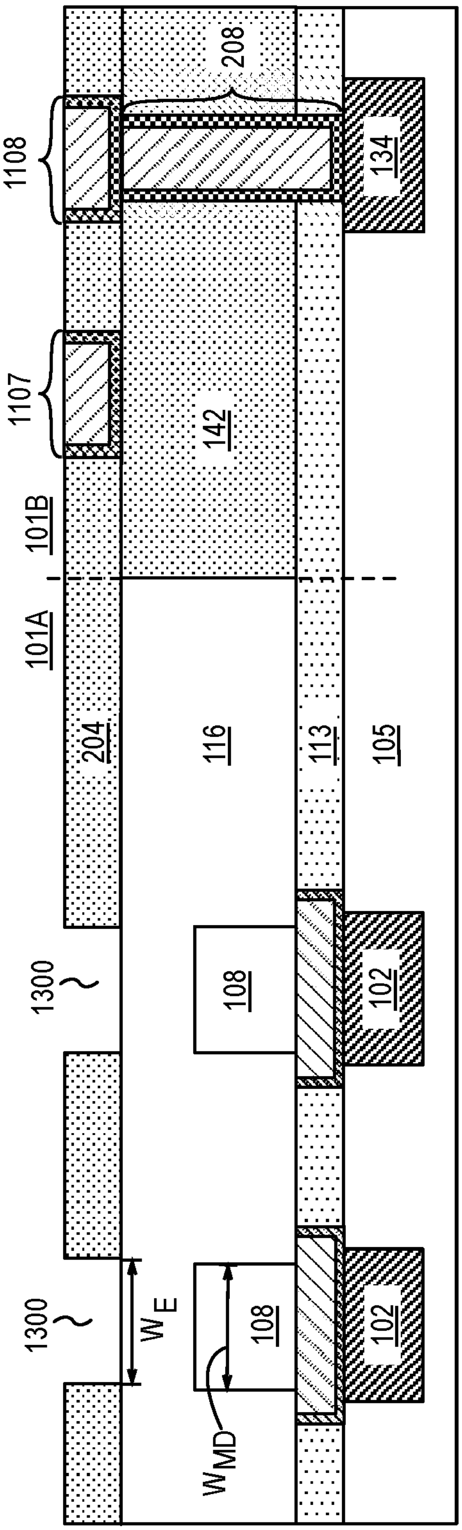
FIG. 13B is a cross-sectional illustration of an embodiment of the structure in FIG. 13A following the formation of trench openings in the fourth dielectric above a respective memory device.

FIG. 13B is a cross-sectional illustration of an embodiment of the structure in FIG. 13A following the formation of trench openings 1300 in the dielectric 204 above a respective memory device 108. The trench openings 1300 may be made by forming a mask on the dielectric 204 and etching the dielectric 204. Depending on the material of dielectric 116, dielectric 116 may act as an etch stop while etching to form openings 1300. The openings 1300 have a width, $W_E$. $W_E$ may be greater than or less than $W_{MD}$. Depending on embodiment, openings 1300 may be a trench openings 1300 or via openings 1300. A trench opening 1300 may couple two or more memory devices such as memory device 108 and memory device 302 depicted in FIG. 4A.

Figure 13C:
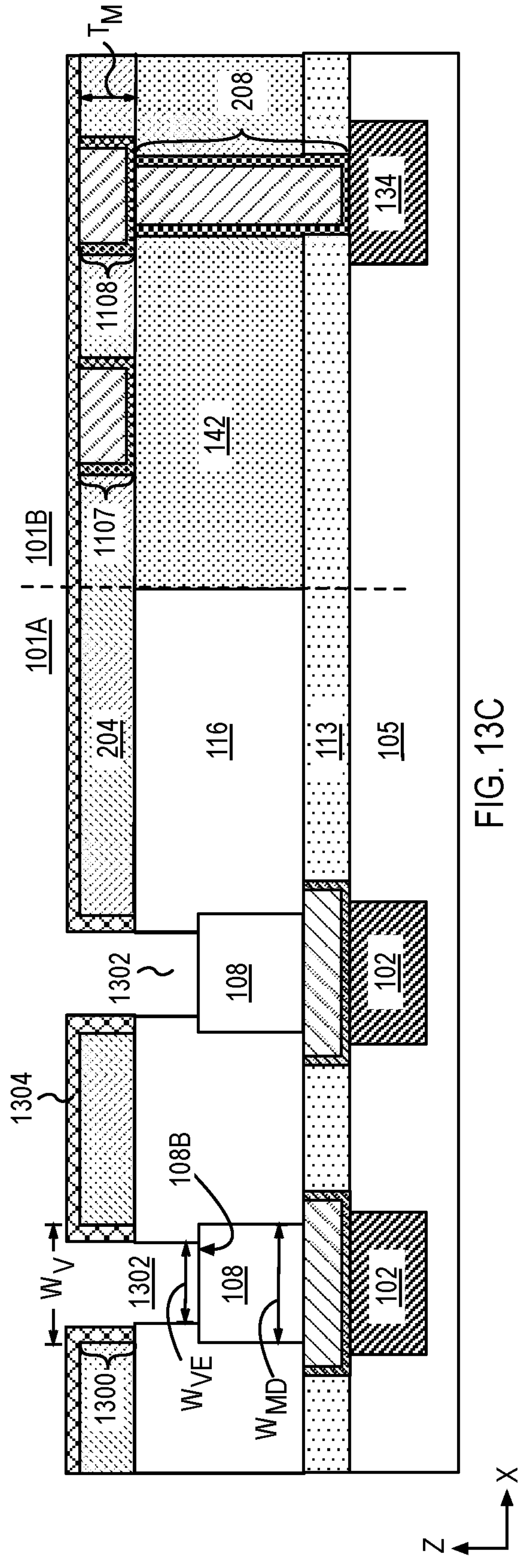
FIG. 13C is a cross-sectional illustration of the structure in FIG. 13B following the process to etch the second dielectric to form a via opening below the trench opening in the memory region.

FIG. 13C is a cross-sectional illustration of the structure in FIG. 13B following the process to etch dielectric 116 to form a via opening 1302 below the trench opening 1300 in memory region 101A. In an embodiment, mask 1304 is formed on the dielectric 204 and on metal lines 1107 and 1108, and on dielectric 204 by a lithographic process. Mask 1304 may include a photoresist material. Mask 1304 has an opening within hanging trench opening 1300 that is designed to enable etching the dielectric 116 to form a via opening. In an embodiment, the dielectric 116 is etched by a plasma etch process. The etch process is halted after uppermost surface 108B of the memory device 108 is exposed. Via opening 1302 has a lateral thickness $W_{VE}$. In the method illustrated herein, $W_V$ is at least equal to or greater than $W_{VE}$. In such examples, $W_{VE}$ may be greater than or less than $W_{MD}$. In the illustrative embodiment, $W_{VE}$ is less than $W_{MD}$. In some such embodiments, the uppermost surface 108B is designed to protected by a combination of conductive and insulative hydrogen barrier materials.

Figure 13D:
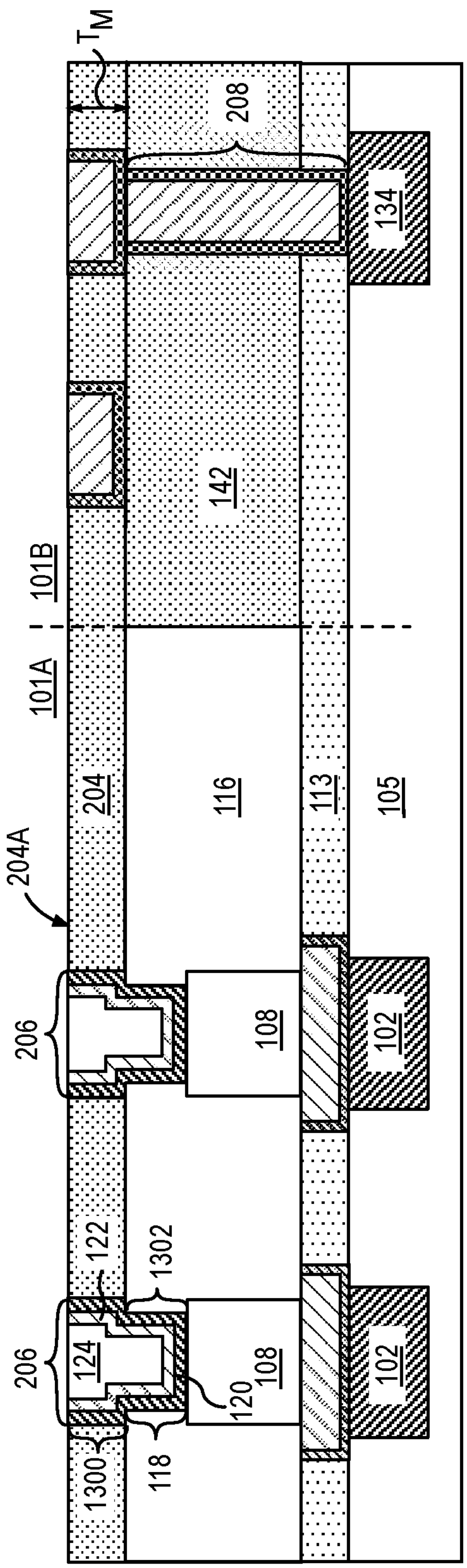
FIG. 13D is a cross-sectional illustration of the structure in FIG. 13C following the process to fabricate a contact electrode on the via electrode, above a respective memory device.

FIG. 13D is a cross-sectional illustration of the structure in FIG. 13C following the process to fabricate a contact electrode 206 on the via electrode 118, above a respective memory device 108. In an embodiment, the mask utilized to form via openings 1302 may be removed by a plasma ashing or a wet chemical dissolution method. In the illustrative embodiment, electrode 118 and contact electrode 206 may be formed by single deposition process for each layer of material required. in accordance with embodiments of the present disclosure, conductive hydrogen barrier 120 is blanket deposited into the openings 1300, and 1302 on the memory device 108, on sidewalls of dielectric 116, and dielectric 204 and on uppermost surface 204A. The conductive hydrogen barrier 120 is contiguous within the openings 1300 and 1302, as shown. The conductive hydrogen barrier 120 includes a material that is most compatible with the dielectric 116 so that an interface between the conductive hydrogen barrier 120 and the dielectric 116 is not a source of dislocations. In the illustrative embodiment, material of liner layer 122 is blanket deposited in the openings 1300 and 1302 on the conductive hydrogen barrier 120. A layer of conductive fill material 124 is deposited into the remaining portions of openings 1300 and 1302 on the material of liner layer 122.

In embodiments, the material of conductive hydrogen barrier 120, material of the liner layer 122 and layer of conductive fill material 124 are deposited by an ALD, PVD or a sputter deposition process. In an embodiment, the planarization process includes a chemical mechanical planarization (CMP) process. In an embodiment, the CMP process removes the excess layer of conductive fill material 124, material of liner layer 122 and conductive hydrogen barrier 120 from an uppermost surface 204A of dielectric 204. The planarization process isolates the conductive hydrogen barrier 120, conductive fill material 124, liner layer 122 and conductive hydrogen barrier 114 from each via electrode 118. The CMP process may also reduce the, as deposited, thickness of the dielectric 204.

Figure 14A:
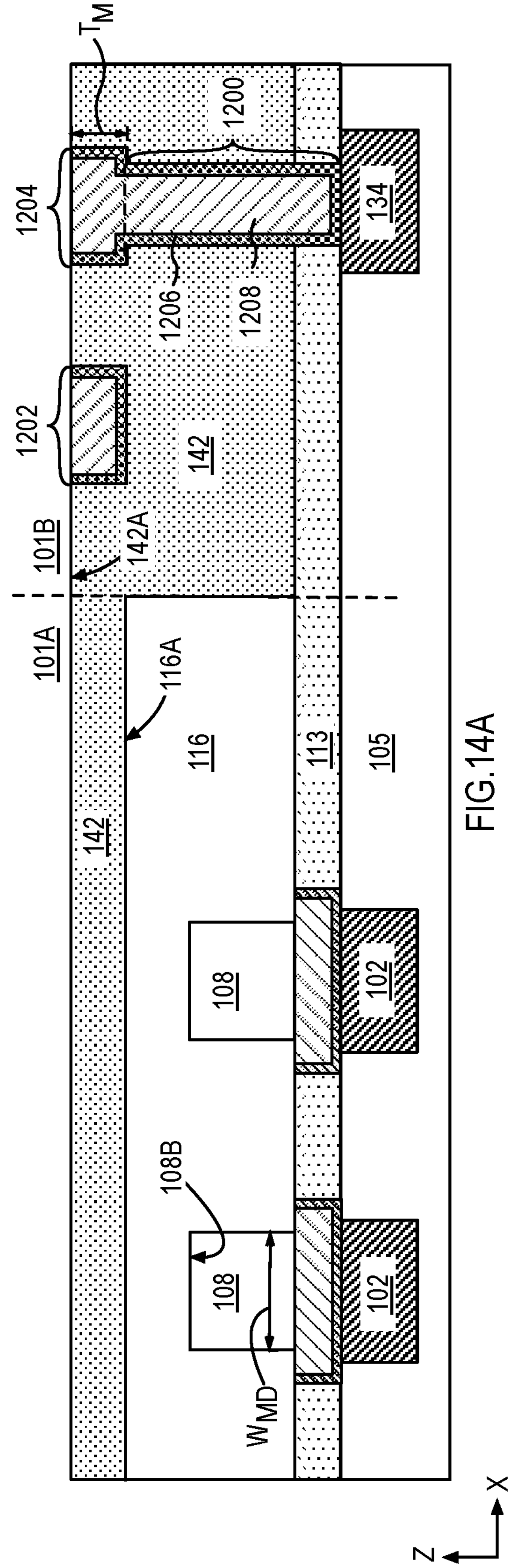
FIG. 14A is an illustrative embodiment of the structure in FIG. 12B, prior to the formation of via electrodes above memory device.

FIG. 14A is an illustrative embodiment of the structure in FIG. 12B, prior to the formation of via electrodes 118 above memory device 108. In the illustrative embodiment, metal lines 1202 and 1204 and via structure 1200 are fabricated by a method that is the same or substantially the same as the method described in association with FIG. 12B. In the illustrative embodiment, metal lines 1202 and 1204 and via structure 1200 are fabricated by a method that is the same or substantially the same as the method described in association with FIG. 12B.

In an embodiment, the metal lines 1202 and 1204 have a vertical thickness $T_M$, relative to a relative to uppermost surface 142A. Portions of the metal lines 1202 and 1204 may extend below uppermost surface 116A due to the etch process utilized to form hanging trench openings.

FIG. 14B is an illustrative embodiment of the structure in FIG. 14A, following the process to form a plurality of openings 1400 and 1402. In an embodiment, the method utilized to form openings 1400 and 1402 is the same or substantially the same as the method utilized to form openings 1300 and 1302 described in association with FIGS. 13B and 13C. A mask 1403 may be utilized to mask portions of openings 1400 and form openings 1402.

FIG. 14C is a cross-sectional illustration of the structure in FIG. 14B following the process to fabricate via electrode 118 and contact electrode 206. In an embodiment, via electrode 118 and contact electrode 206 are formed by a method that is the same or substantially the same as the method described in association with FIG. 13D.

In other embodiments, a single via opening may be made in the dielectrics 116 and 204 above each memory device 108. The operation to make a single via electrode is described in association with FIGS. 15A-15B. A single via electrode may be desirable when the height, $T_V$, of via structure 208 is comparable to the height, $T_{MD}$ of memory device 108. A single via electrode can also provide flexibility to couple different memory devices as will be shown in FIGS. 15C-15D.

Figure 15A:
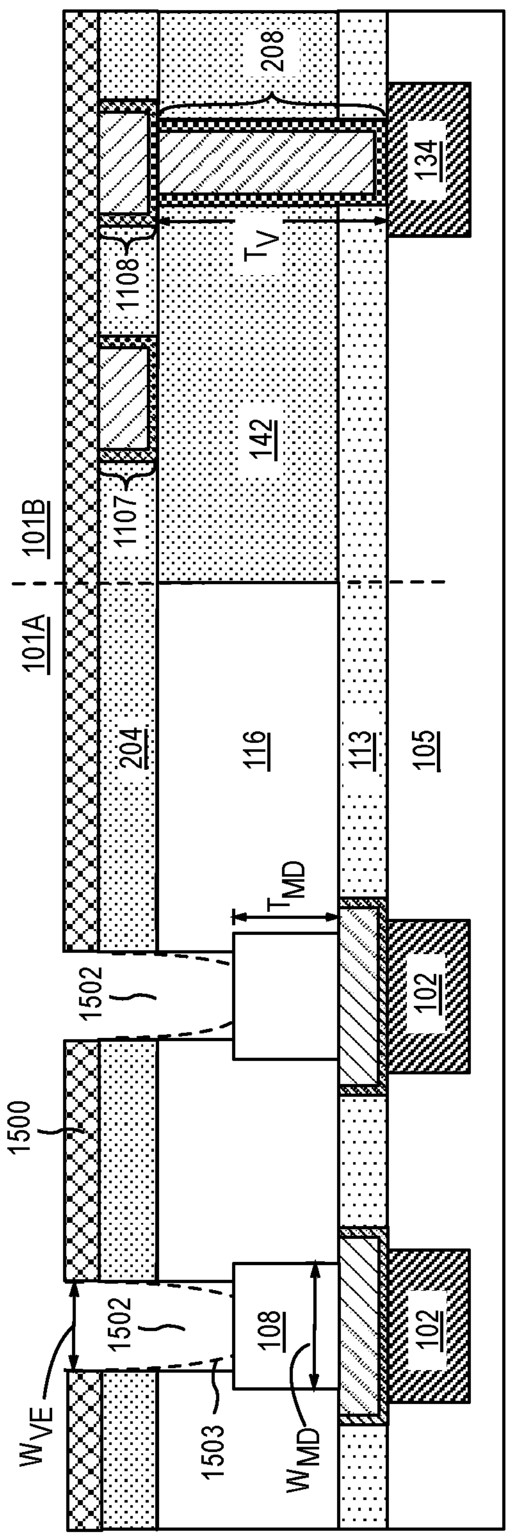
FIG. 15A is a cross-sectional illustration of the structure in FIG. 11E, in an embodiment where via electrodes and electrodes on top of via electrodes are not yet fabricated.

FIG. 15A is a cross-sectional illustration of the structure in FIG. 11E, in an embodiment where via electrodes and electrodes on top of via electrodes are yet to be fabricated.

In some embodiments, an opened is formed in dielectrics 204 and 116 at the same time after fabrication of metal lines 1107 and 1108 and via structure 208. In an embodiment, a mask 1500 is formed on the dielectric 204 and on the of metal lines 1107 and 1108. A plasma etch process is utilized to etch dielectric 204 through openings in the mask 1500 to form opening 1502. The plasma etch process may be continued to etch dielectric 116, after etching dielectric 204. In the illustrative embodiment, the opening 1502, have a substantially uniform width, $W_{VE}$ in both materials, dielectric 204 and dielectric 116. In other embodiments, there may be some taper in the dielectric 116 and dielectric 204 as indicated by dashed lines 1503. The sidewalls of openings may be tapered defined by a single taper angle or be gradually tapered.

Figure 15B:
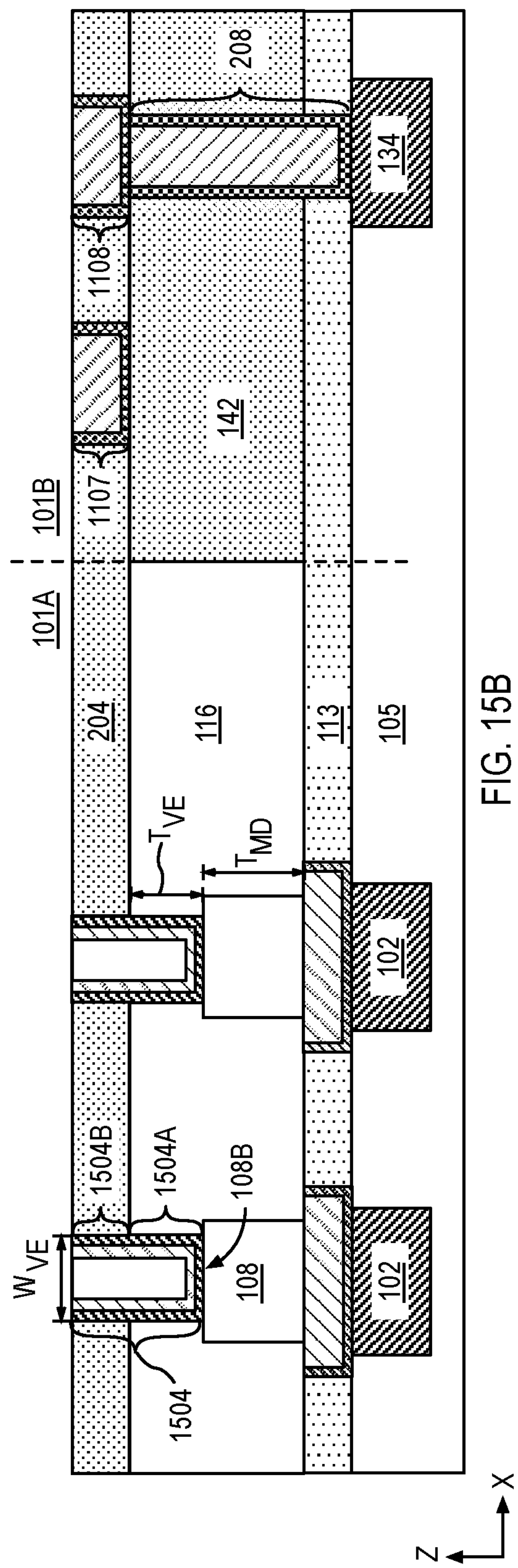
FIG. 15B is a cross-sectional illustration of the structure in FIG. 15A following the process to form via electrode having a first portion within the second dielectric a second portion within the fourth dielectric, in accordance with an embodiment of the present disclosure.

FIG. 15B is a cross-sectional illustration of the structure in FIG. 15A following the process to form via electrode 118 having a first portion within the dielectric 116 having a high film density a second portion within dielectric 204 having a low film density in accordance with an embodiment of the present disclosure. In an embodiment, the process to form via electrode 1504 is the same or substantially the same as formation of contact electrode 206 and via 118 (described in association with FIG. 12C). In the illustrative embodiment, via electrode 1504 does not extend beyond a periphery of the memory device 108 and includes a first portion 1504A adjacent to dielectric 116 and a second portion 1504B adjacent to dielectric 204. In an embodiment, portion 1504B has a height $T_{VE}$. The portion of opening 1502 that is within dielectric 204 has a same or substantially the same plan view profile as the opening 1502 that is within dielectric 116. In exemplary embodiments, unlike contact electrode 206, portion 1504B does not extend along the y-axis in FIG. 15B.

Figure 15C:
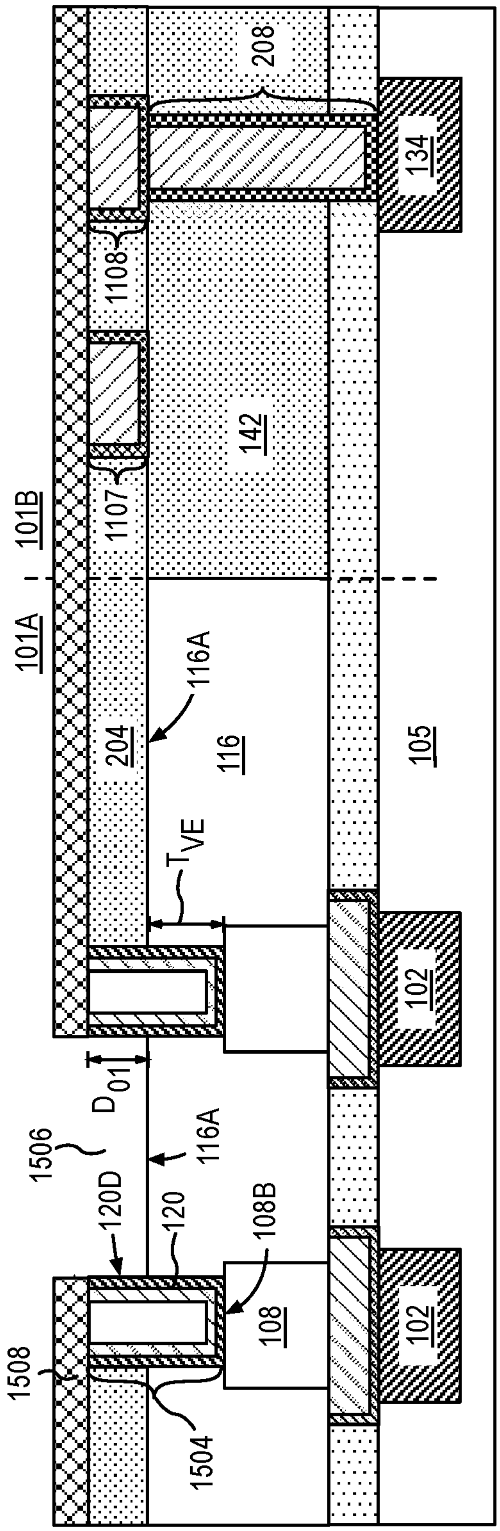
FIG. 15C is a cross-sectional illustration of the structure in FIG. 15B following the process to form an opening between adjacent via electrodes that are spaced apart along an x-direction.

FIG. 15C is a cross-sectional illustration of the structure in FIG. 15B following the process to form an opening 1506 between adjacent via electrodes 1504 that are spaced apart along the x-direction. In an embodiment, a mask 1508 is formed on the dielectric 204, on the metal lines 1107 and 1108. As shown the mask includes an opening where the dielectric 204 is to be removed. A plasma etch process is utilized to remove the dielectric 204 from the opening in the mask 1508. In an embodiment, the dielectric 204 is etched selectively, by the plasma etch process, with respect to the materials of the via electrode 1504 and dielectric 116. The plasma etch process utilized may selectively remove the dielectric 204 with respect to conductive hydrogen barrier 120 because of the differences in material. In some embodiments, the dielectric 116 may be reduced below uppermost surface 116A. In other embodiments, the mask 1508 can be a hardmask, and a wet chemical process can be utilized to recess dielectric 204 selectively against materials of via electrode 1504. In some embodiments a combination of plasma etch and wet chemical etch is utilized to remove dielectric 204 effectively from sidewalls 120D to provide a sufficient surface area for contact with a conductive bridge to be formed.

Figure 15D:
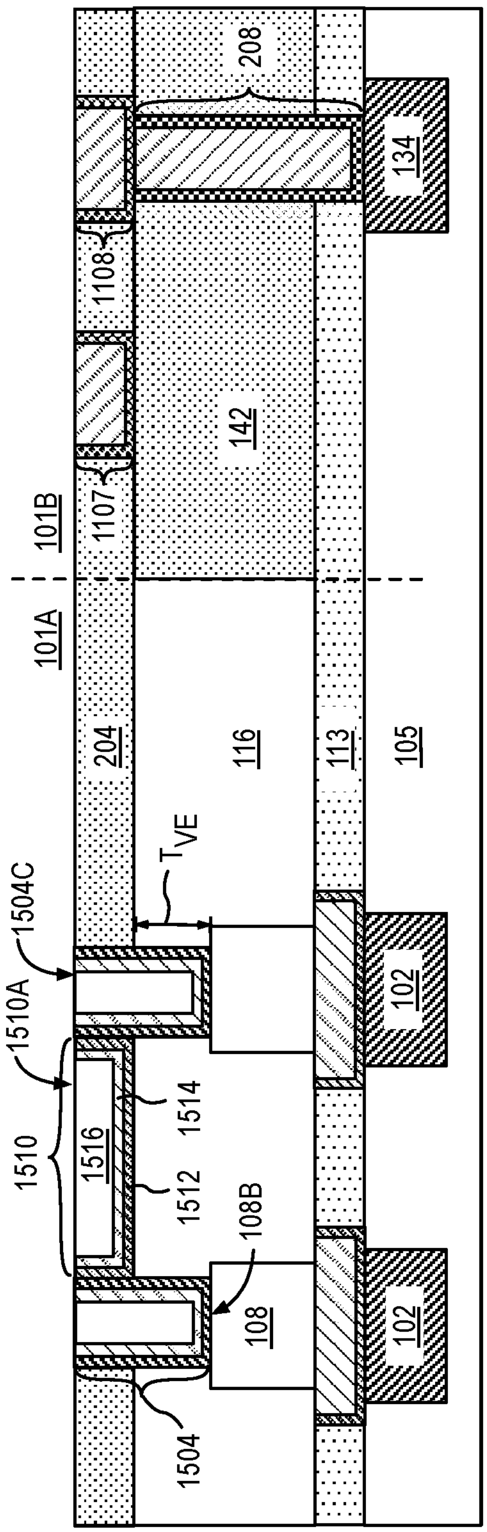
FIG. 15D is a cross-sectional illustration of the structure in FIG. 15C following the process to form a conductive bridge between adjacent via electrodes. In the illustrative embodiment, the process utilized to form the conductive bridge includes materials and processes utilized to fabricate via electrode, described above.

FIG. 15D is a cross-sectional illustration of the structure in FIG. 15C following the process to form a conductive bridge 1510 between adjacent via electrodes 1504. In the illustrative embodiment, the process utilized to form the conductive bridge 1510 includes materials and processes utilized to fabricate via electrode 1504, described above. In the illustrative embodiment, a conductive hydrogen barrier 1512 is first blanket deposited into the opening 1506, on the dielectric 204, against outer sidewalls of conductive hydrogen barrier 120, on uppermost surface 1504C of via electrode 1504, uppermost surfaces of metal line 1107 and 1108. The deposition process continues with deposition of a liner layer 1514 on the conductive hydrogen barrier 1512, followed by deposition of a fill material 1516. There are numerous advantages in forming a conductive bridge 1510 after formation of the via electrode 1504 where upper most surfaces 1510A are co-planar or substantially co-planar with uppermost surface 1504C of via electrode 1504. A conductive bridge 1510 can be inserted between any two or more adjacent memory devices 108 after the via electrodes are fabricated. Conductive bridge 1510 offers integration flexibility to choose two or more memory devices 108 to be connected by defining the layout of mask 1508. Secondly, the materials included in the conductive bridge 1510 can be chosen independently of the materials of the via electrode 1504. While, in the illustrative embodiment, conductive bridge 1510 includes conductive hydrogen barrier 1512, and the liner layer 1514, in other embodiments, the conductive hydrogen barrier 1512, and the liner layer 1514 may be absent. The conductive hydrogen barrier 120 and dielectric 116 in themselves offer adequate protection against hydrogen diffusion toward memory device 108.

Figure 16C:
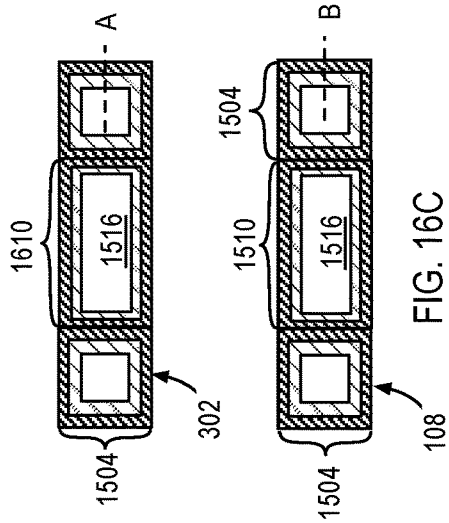
FIG. 16C is a plan view of the structure in FIG. 15D, in accordance with an embodiment of the present disclosure.
Figure 16B:
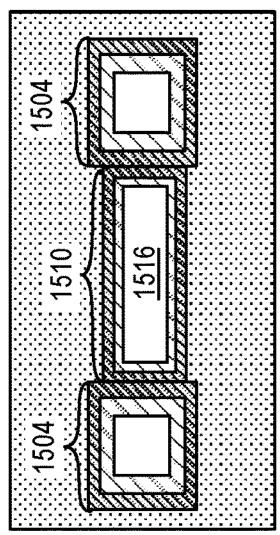
FIG. 16B is a plan view of the structure in FIG. 15D, in accordance with an embodiment of the present disclosure.
Figure 16A:
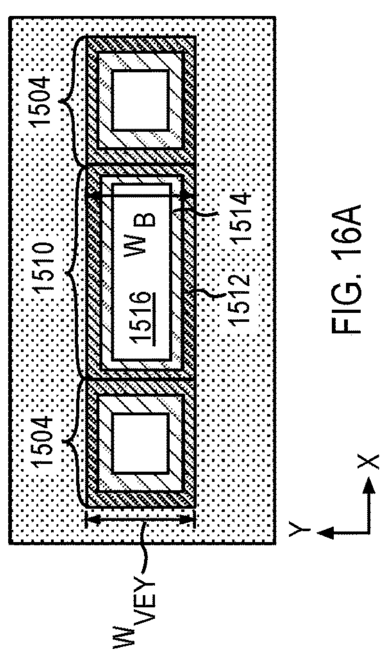
FIG. 16A is a plan view of the structure in FIG. 15D, in accordance with an embodiment of the present disclosure.

FIGS. 16A-C depict various plan view embodiments of one or more conductive bridges.

FIG. 16A is a plan view of the structure in FIG. 15D, in accordance with an embodiment of the present disclosure. In the illustrative embodiment, via electrode 1504 and the conductive bridge have substantially rectangular plan view profiles. The conductive bridge 1510 has a width, $W_B$ (along the y direction) and the via electrode 1504 has a width, $W_{VEY}$. $W_B$ may be greater than, less than or equal to $W_{MDY}$. In the illustrative embodiment, $W_B$ is substantially equal to $W_{VEY}$. $W_B$ may be less than $W_{VEY}$ as shown in FIG. 16B with as long as $W_B$ is sufficiently wide to enable a minimum current conductance. The memory devices 108 are not illustrated for clarity.

In other configurations via electrode 1504 may be present on a plane A, behind plane B, as shown in the plan-view illustration of FIG. 16C. A pair of via electrodes 1504 are coupled above a memory device 302 (hidden under via electrode 1504). In some such embodiments, a conductive bridge 1610 maybe further implemented to couple a pair of via electrodes 1504 on the plane A. Conductive bridge 1610 may be oriented parallel to conductive bridge 1510. The flexibility to implement conductive bridges 1610 and 1510 is particularly advantageous when conductive bridges 1610 and 1510 have a substantially similar plan view shape and size. A substantially similar plan view size can minimize variations in depths, Doi, of openings that are filled with material of conductive bridges 1510 and 1610 (such as opening 1506 in FIG. 15C). In other embodiments, conductive bridges that are oriented perpendicular to conductive bridge 1510 or 1610 may also be formed sequentially or simultaneously. Formation of perpendicularly oriented conductive bridge provides enhanced flexibility to couple arbitrary numbers of memory devices. Such flexibility can be exercised by changing mask design instead of process flow.

FIG. 17C is an embodiment of the structure in FIG. 7A, where $W_{CI}$ is less than $W_O$, and surface 105B of dielectric 105 may be recessed relative to an uppermost surface 105A (which is covered by the etch stop layer 113). The photoresist mask 702 is removed in the illustration for clarity. A recess in the dielectric 105 may occur when there is a loss of selectivity or where there is limited selectivity between the material of the etch stop layer 113 and the dielectric 105. In some such embodiments, sidewalls 102A of the conductive interconnect 102 are exposed after forming opening 701.

Figure 17B:
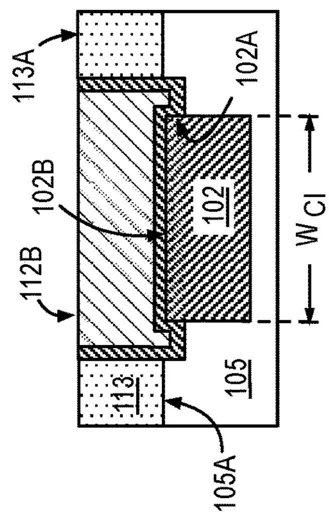
FIG. 17B is a cross-sectional illustration of the structure in FIG. 17A following the process to form an electrode structure having a portion below an uppermost surface of the conductive interconnect, in accordance with an embodiment of the present disclosure
Figure 17A:
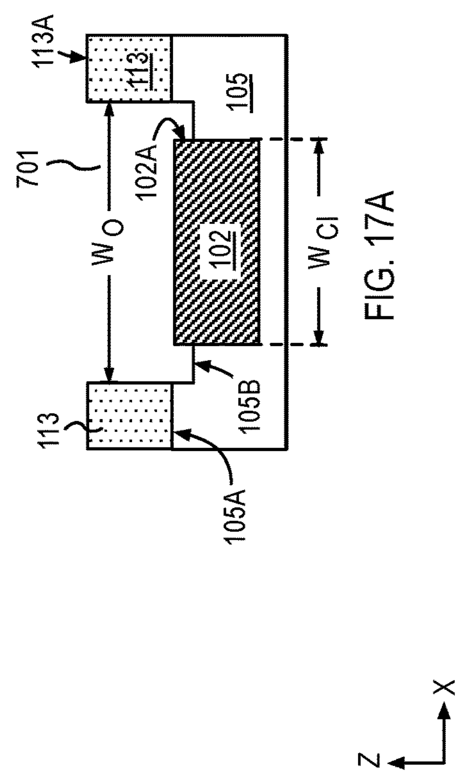
FIG. 17A is an embodiment of the structure in FIG. 7A, where a surface of the first dielectric may be recessed relative to an uppermost surface of the conductive interconnect, in accordance with an embodiment of the present disclosure.

FIG. 17B is a cross-sectional illustration of the structure in FIG. 17A following the process to form an electrode structure 112 having a portion below an uppermost surface 102B of the conductive interconnect 102. In the illustrative embodiment, the conductive hydrogen barrier 114 is formed on the recessed surface 105B, on a portion of sidewall 102A, and on uppermost surface 102B of conductive interconnect 102. The conductive hydrogen barrier 114 is formed below uppermost surface 102B. Depending on $W_O$, portions of conductive fill material 115 may above or below uppermost surface 102B.

Figure 18A:
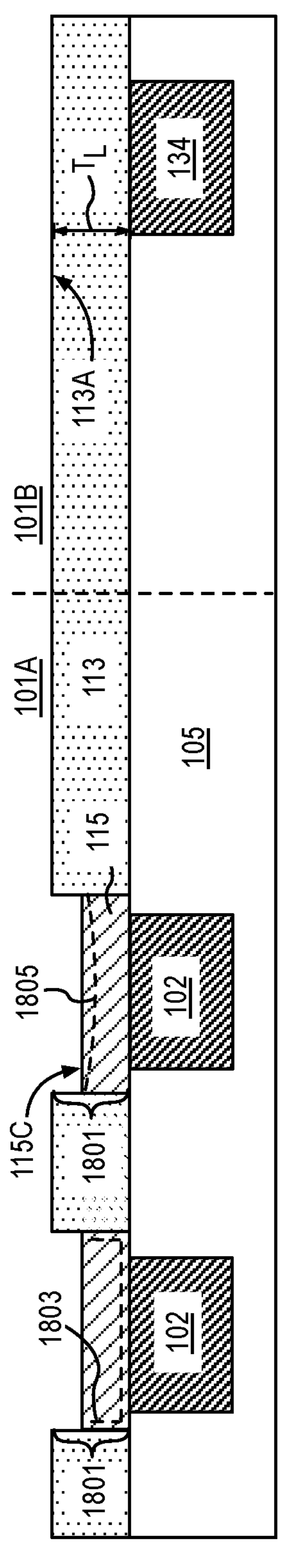
FIG. 18A is a cross-sectional illustration of the structure in FIG. 7A following the formation of conductive fill material within openings, in accordance with an embodiment of the present disclosure.
Figure 18B:
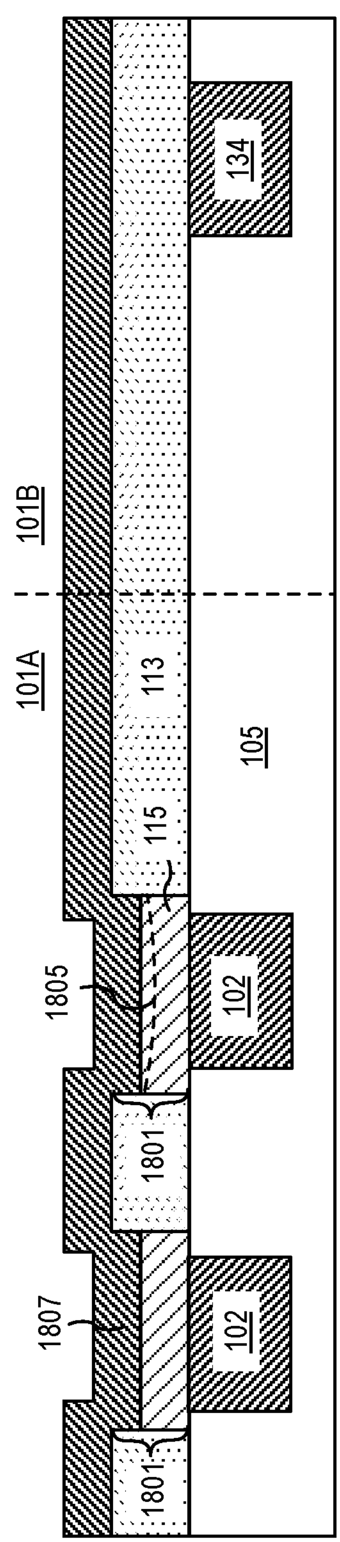
FIG. 18B is a cross-sectional illustration of the structure in FIG. 18A following the process to deposit a conductive hydrogen barrier layer on the conductive fill material.
Figure 18C:
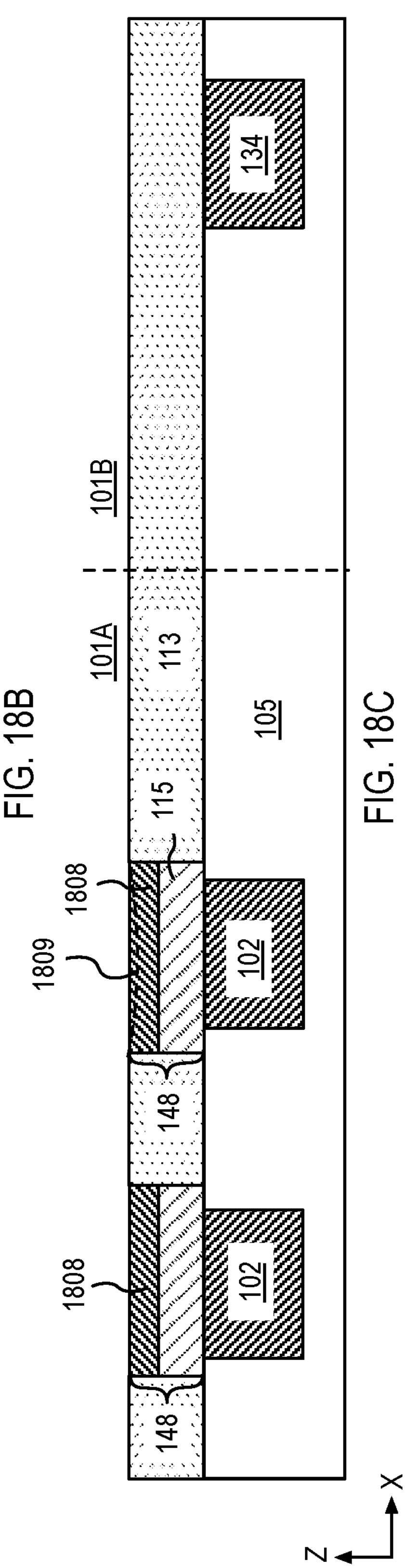
FIG. 18C is a cross-sectional illustration of the structure in FIG. 18B following the process to form a conductive hydrogen barrier on the conductive fill material.

FIG. 18A-C are cross-sectional illustrations depicting a method to fabricate an electrode structure having a conductive hydrogen barrier above a fill metal.

FIG. 18A is a cross-sectional illustration of the structure in FIG. 7A following the formation of conductive fill material within openings 1801, in accordance with an embodiment of the present disclosure. In an embodiment, conductive fill material 115 is blanket deposited into the opening 1801, and on the etch stop layer 113. Portions of the conductive fill material 115 on the etch stop layer 113 are removed by a planarization process leaving the conductive fill material 115 within the openings 1801. In an embodiment, a wet chemical process is utilized to recess the conductive fill material 115 below the uppermost surface 113A. In an embodiment, level of recess of conductive fill material 115 relative to uppermost surface 113A will depend on $T_L$ and on a desired thickness of the conductive hydrogen barrier to be formed. In some embodiments, the conductive fill material 115 is recessed relative to uppermost surface 113A by up to half of $T_L$. In some embodiments, uppermost surface 115C of the conductive fill material 115 is concaved due to wet chemical recess as indicated by dashed lines 1805. In an embodiment, a liner layer, indicated by dashed lines 1803 may be deposited into each opening 1801 prior to deposition of the conductive fill material 115. The liner layer may be recessed at the same time as the conductive fill material 115, prior to or after recessing the conductive fill material 115.

FIG. 18B is a cross-sectional illustration of the structure in FIG. 18A following the process to deposit a conductive hydrogen barrier material 1807 in each opening 1801. In an embodiment, the materials implemented, and process utilized to deposit conductive hydrogen barrier material 1807 is the same or substantially the same as the material implemented and process utilized to deposit conductive hydrogen barrier material 800, as described in association with FIG. 8A.

FIG. 18C is a cross-sectional illustration of the structure in FIG. 18B following the process to form a conductive hydrogen barrier 1808 on the conductive fill material 115. A planarization process may be utilized to remove an excess conductive hydrogen barrier material 1807 deposited on etch stop layer 113. In an embodiment, the planarization process includes a chemical mechanical polish (CMP) process. The CMP process forms conductive hydrogen barrier 1808 within each opening 1801. In some embodiments, an uppermost surface 1808A of the conductive hydrogen barrier layer 1808 is curved as indicated by dashed lines 1809. A curved surface can result from dishing during the CMP process. It is to be appreciated that when a material layer stack for the formation of memory device is deposited, a lowermost layer in the material layer stack may follow the contour of the curved surface. A curved surface can change a vertical thickness (height) of the conductive hydrogen barrier 1808 across the electrode structure 112. However, changes in thickness is not substantial to materially affect hydrogen barrier properties of the conductive hydrogen barrier 1808. The conductive hydrogen barrier 1808 includes a material that is the same or substantially the same as the material of the conductive hydrogen barrier layer 114.

In the illustrative embodiment, the electrode structure 112 includes a conductive hydrogen barrier 1808 above the conductive fill material 115, where the conductive hydrogen barrier 1808 prevents hydrogen from diffusing towards a memory device to be formed above. Depending on embodiments, the electrode structure 112 has a width that can be greater than or less than a width of a memory device to be formed on electrode structure 112. In either embodiment, conductive hydrogen barrier 1808 can effectively prevent hydrogen from diffusing towards the memory device.

Figure 19A:
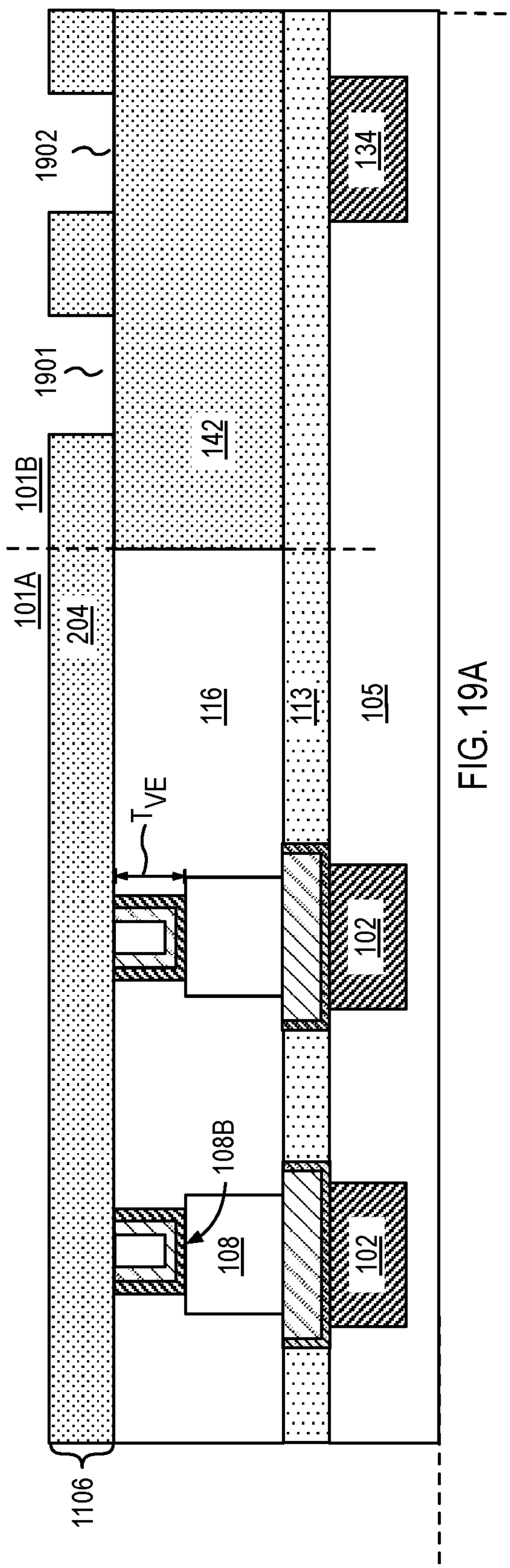
FIG. 19A is a cross-sectional illustration of the structure in FIG. 10D following the process to deposit the fourth dielectric on the second and the third dielectric and following the process to form hanging trench openings in the fourth dielectric in the logic region, in accordance with an embodiment of the present disclosure.

FIG. 19A is a cross-sectional illustration of the structure in FIG. 10D following the process to deposit dielectric 204 to form a level 1106. Material composition of dielectric 204 and method to deposit dielectric 204 has been described above. In an embodiment, a plurality of hanging trench openings 1901 and 1902 are formed simultaneously in the dielectric 204 in the logic region as shown. In an embodiment, a mask is formed on dielectric 204 and a plasma etch process is utilized to form hanging trench openings 1901 and 1902. In the illustrative embodiment, the etch process is halted after dielectric 142 is exposed.

Figure 19B:
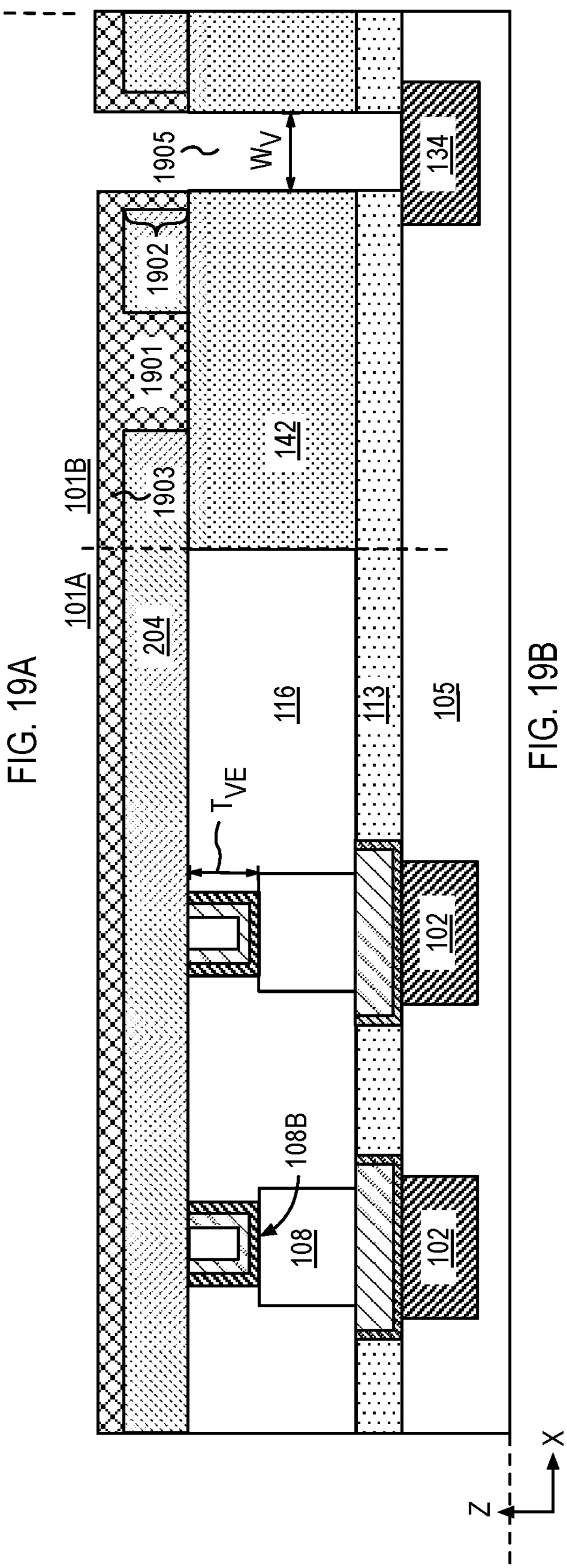
FIG. 19B is a cross-sectional illustration of the structure in FIG. 19A following the formation of a via opening within a hanging trench opening, in accordance with an embodiment of the present disclosure.

FIG. 19B is a cross-sectional illustration of the structure in FIG. 19A following the formation of a via opening 1905 within hanging trench opening 1902, in accordance with an embodiment of the present disclosure. In an embodiment, a lithography process is utilized to form a mask 1903 on the dielectric 204. The dielectric 142 is etched to form via 1905 that exposes conductive interconnect 134.

Figure 19C:
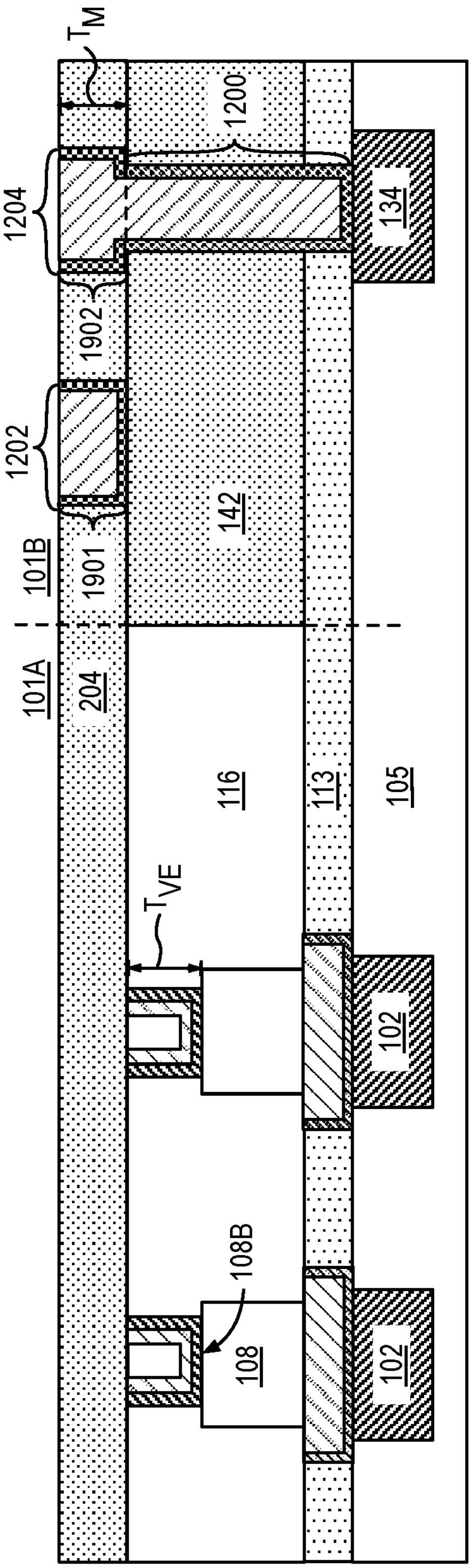
FIG. 19C is a cross-sectional illustration of the structure in FIG. 19A following the process to form a via structure in the via opening, and metal lines in the hanging trench openings.

FIG. 19C is a cross-sectional illustration of the structure in FIG. 19A following the process to form via structure 1200, and metal lines 1202 and 1204. The method to form via structure 1200, and metal lines 1202 and 1204 described above in association with FIGS. 10E-10H.

Figure 19D:
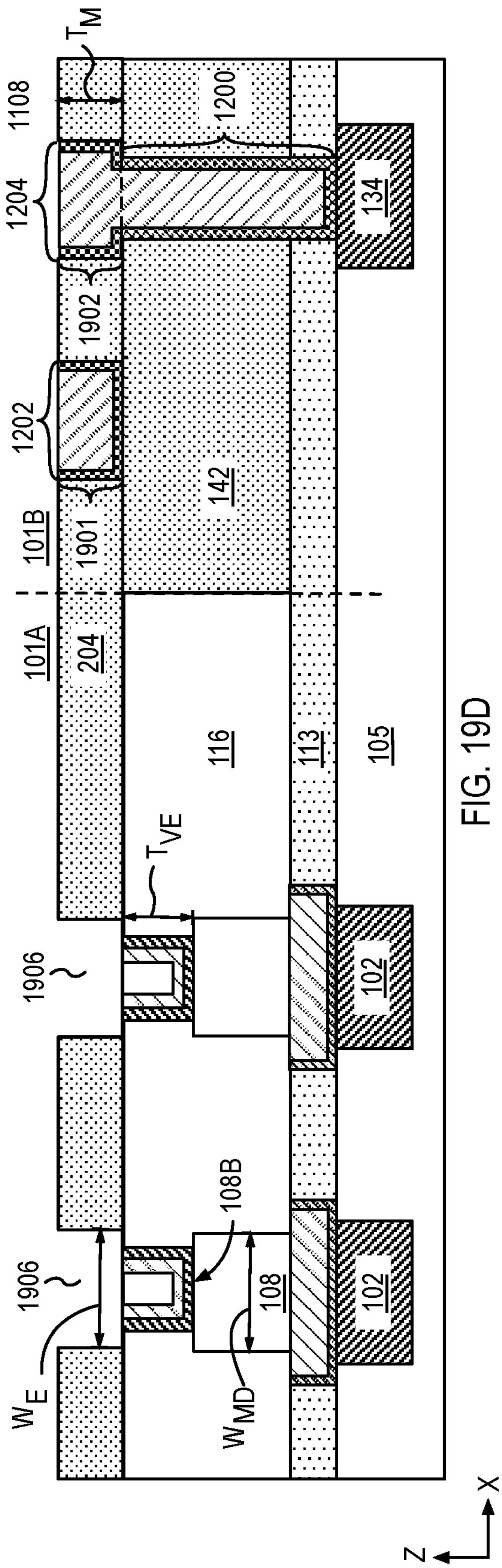
FIG. 19D is a cross-sectional illustration of the structure in FIG. 19C following the formation of openings in the fourth dielectric above a respective memory device.

FIG. 19D is a cross-sectional illustration of the structure in FIG. 19C following the formation of openings 1906 in the dielectric 204 above a respective memory device 108. The openings 1906 may be made by forming a mask on the dielectric 204 and etching the dielectric 204. Depending on the material of dielectric 116, dielectric 116 may act as an etch stop while etching to form openings 1906. The openings 1906 have a width, $W_E$. $W_E$ may be greater than or less than $W_{MD}$. Depending on embodiment, openings 1906 may be trench openings 1906 or via openings 1906. A trench opening 1906 may couple two or more memory devices such as memory device 108 and memory device 302 as depicted in FIG. 4A.

Figure 19E:
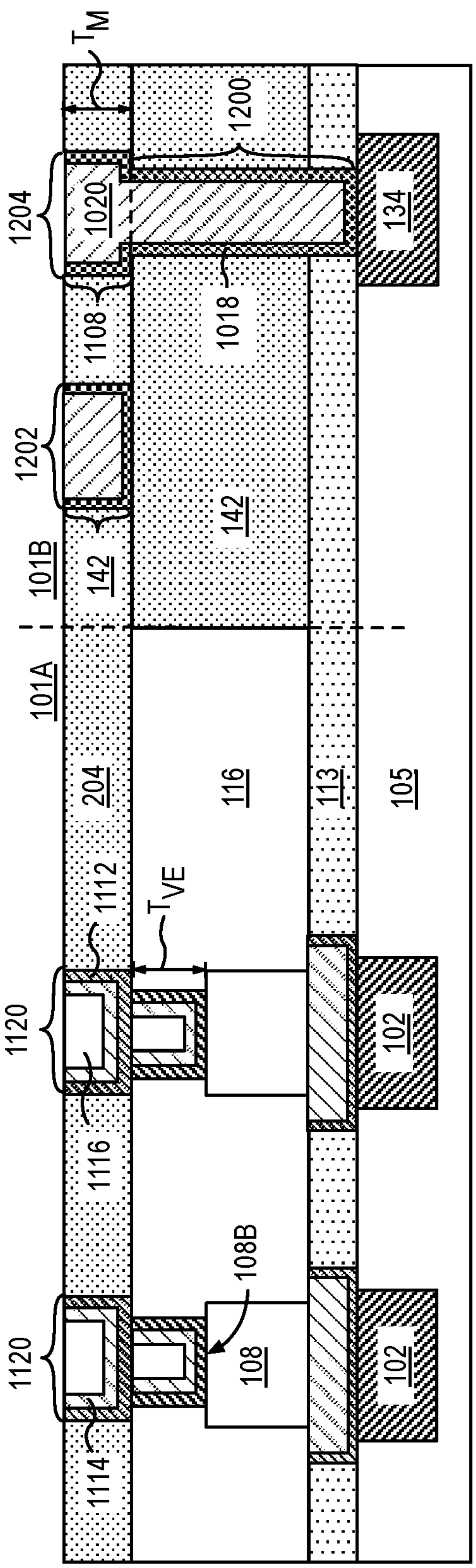
FIG. 19E is a cross-sectional illustration of the structure in FIG. 19D following the process to form an electrode on respective via electrodes.

FIG. 19E is a cross-sectional illustration of the structure in FIG. 19D following the process to form an electrode 1120 on respective via electrodes 118. In an embodiment, the process utilized to form electrodes 1120 is described in association with FIGS. 11D-11E.

In some embodiments, electrodes 1120 and metal lines 1202 and 1204 may be co-fabricated. However, in some such embodiments, electrodes 1120 and metal lines 1202 and 1204 may all include a same material. In some such embodiments, simultaneous fabrication necessitates that electrodes 1120, metal lines 1202 and 1204, and via structure 1200 can all include a conductive hydrogen barrier material or completely exclude the conductive hydrogen barrier material.

Figure 20A:
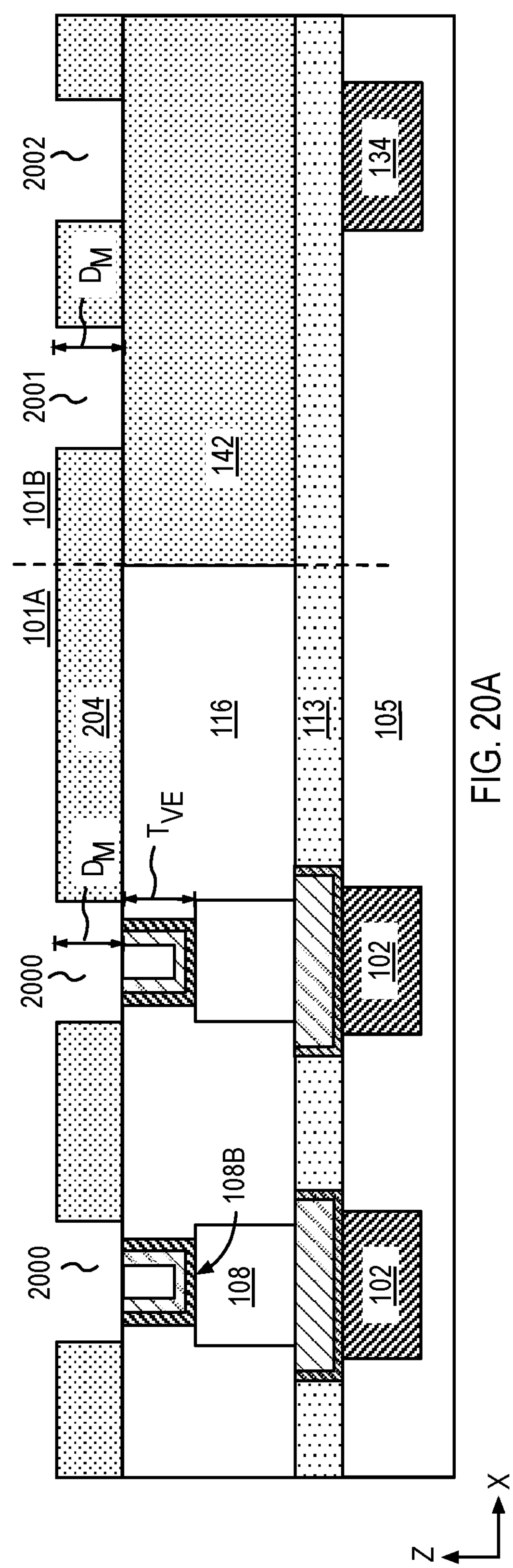
FIG. 20A is a cross-sectional illustration of the structure in FIG. 10D following the process to deposit the fourth dielectric and form a plurality of openings in the fourth dielectric.

FIG. 20A is a cross-sectional illustration of the structure in FIG. 10D following the process to deposit dielectric 204 and form a plurality of openings in the dielectric 204. In an embodiment, openings 2000, 2001, and 2002 are formed simultaneously by masking the dielectric 204 and utilizing a plasma etch process to etch dielectric 204. The dept, $D_M$, of each opening 2000, 2001 and 2002 is substantially the same. In some embodiments, $D_M$ may be different by less than 5% depending on a relative width of each opening. $D_M$ can also be different based on the similarity between materials of dielectric 204 and dielectric 142. If there is etch selectivity between dielectric 142 and 204 because of differences in etch rates, then then $D_M$ may be substantially the same.

Figure 20B:
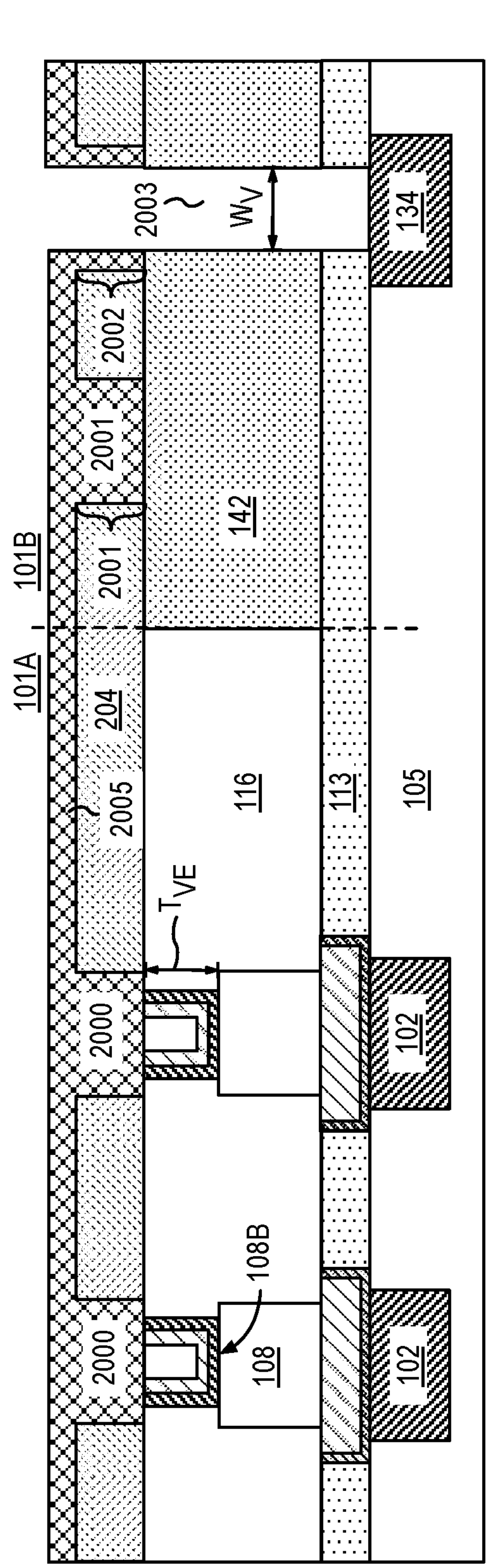
FIG. 20B is a cross-sectional illustration of the structure in FIG. 20A following the process to form a via opening within a hanging trench opening.

FIG. 20B is a cross-sectional illustration of the structure in FIG. 20A following the process to form a via opening 2003 within opening 2002. In an embodiment, the process to form via opening 2003 is substantially the same as the process utilized to form via opening 1905 described in association with FIG. 19B. In the illustrative embodiment, mask 2005 also covers openings 2000.

Figure 20C:
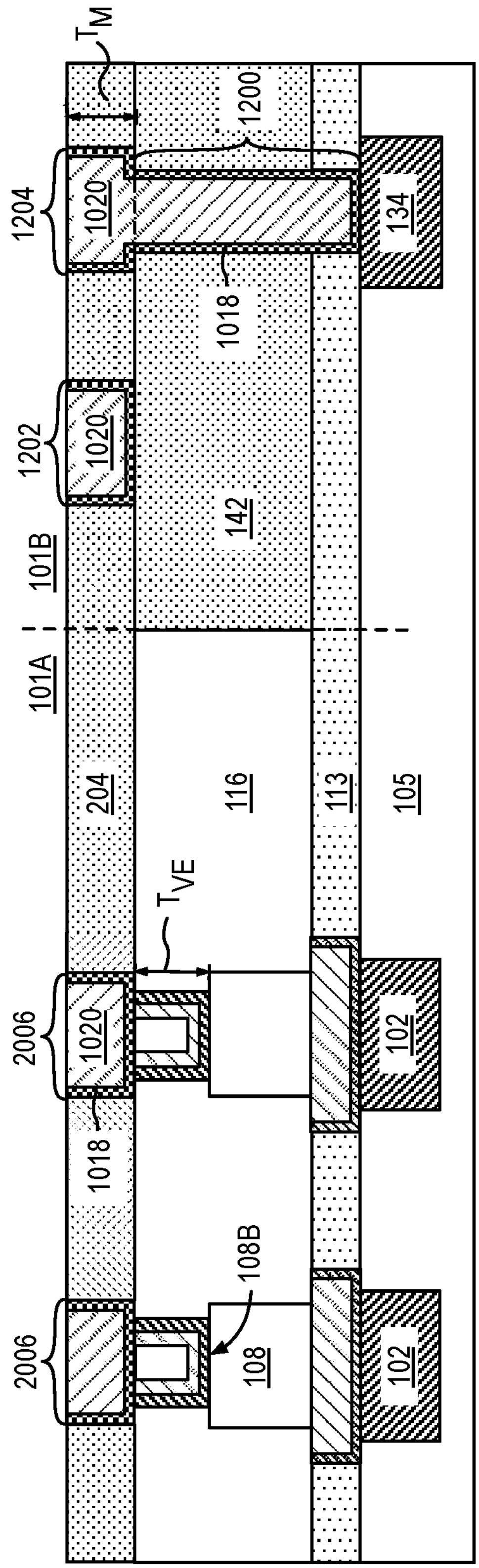
FIG. 20C is a cross-sectional illustration of the structure in FIG. 20B following the process to form an electrode above a respective via electrode, and a via structure and metal lines in the logic region.

FIG. 20C is a cross-sectional illustration of the structure in FIG. 20B following the process to form electrodes 2006, via structure 1200 and metal lines 1202 and 1204. In the illustrative embodiment, the mask 2005 (FIG. 20B) is removed and a liner layer 1018 is deposited into via opening 2003, and in openings 2000, 2001 and 2002, and on dielectric 204. A fill material 1020 is deposited on the liner layer 1018. A planarization process may be performed to remove the liner layer 1018 from above dielectric 204 and fill metal from above the liner layer 1018 outside of openings 2000, 2001 and 2002. The planarization process forms metal lines 1202 and 1204, via structure 1200, and electrodes 2006 above each via electrode 118. It is to be appreciated that electrodes 2006 may not have a conductive hydrogen barrier layer in contrast to the other examples described above. However, a lack of conductive hydrogen barrier layer in the electrodes 2006 does not materially impact memory device 108 performance because the uppermost surface 108B of memory device 108 is protected by an insulative and a conductive hydrogen barrier material.

Figure 21A:
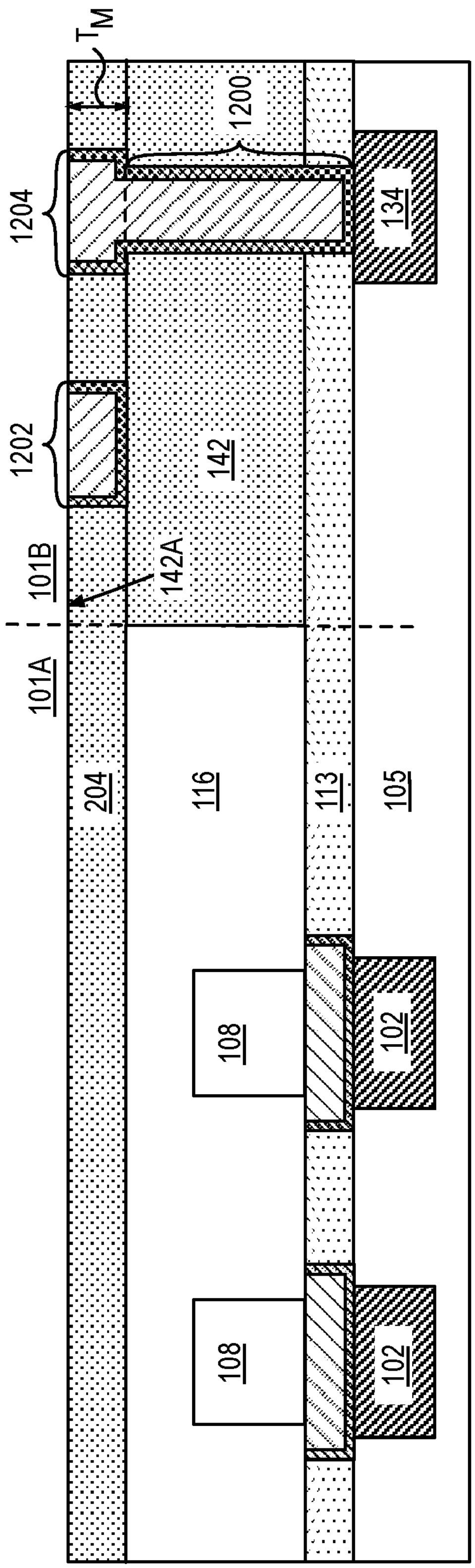
FIG. 21A is an illustrative embodiment of the structure in FIG. 13A, where metal lines and via structure in the logic region are fabricated by a method described in association with FIGS. 19A, 19B and 19C.

FIG. 21A is an illustrative embodiment of the structure in FIG. 13A, where metal lines 1202, 1204 and via structure 1200 are fabricated by a method described in association with FIGS. 19A, 19B and 19C.

Figure 21B:
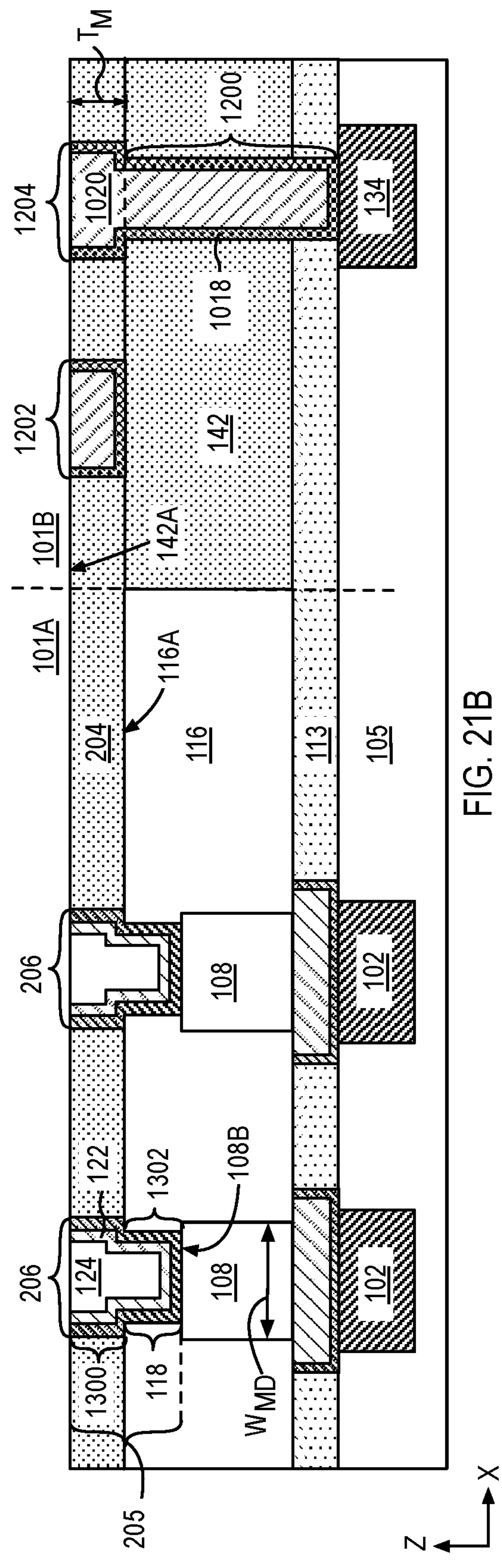
FIG. 21B is a cross-sectional illustration of the structure in FIG. 21A following the process to form electrode structure described in association with FIGS. 13A-13D.

FIG. 21B is a cross-sectional illustration of the structure in FIG. 21A following the process to form electrode structure 205. In an embodiment, the process to form electrode structure 205 is described in association with FIGS. 13A-13D.

In some embodiments, as described above in association in FIG. 1J, the device structure 100E includes a high density spacer directly adjacent to the memory device 108. FIGS. 22A-D are cross-sectional illustration of a sequence of operations that depict an evolution of the structure in FIG. 8D to the structure in FIG. 1J.

FIG. 22A is a cross-sectional illustration of the structure in FIG. 8D following the process to deposit encapsulation layer 152. The process utilized to deposit encapsulation layer 152 depends on the material utilized, on a height of memory device 108, as well as on the relative spacing between adjacent memory devices 108. In exemplary embodiments, the deposition process utilized to deposit encapsulation layer 152 does not include hydrogen or ammonia containing chemicals to prevent hydrogen exposure to layers within memory device 108.

In an embodiment, the encapsulation layer 152 includes an insulator material. The insulator material includes a transition metal and oxygen, such as, but not limited to $Al_xO_y$, $HfO_x$, $AlSiO_x$, $ZrO_x$, or $TiO_x$. Materials such as $Al_xO_y$, $HfO_x$, $AlSiO_x$, $ZrO_x$, or $TiO_x$ can be deposited without a hydrogen or ammonia containing chemical precursor in an ALD deposition process. An ALD process may be advantageous when an aspect ratio between adjacent memory devices 108 is greater than 1:1. An aspect ratio is a ratio between height of memory device 108 to a spacing between adjacent memory devices 108, i.e., $T_{MD}$:$S_M$. The encapsulation layer 152 may be deposited to a thickness in the range of 0.5 nm-10 nm. However, when $S_M$ is approximately in the range of 20 nm, encapsulation layer 152 may be deposited to a thickness of less than 5 nm. An ALD process can provide a substantially conformal thickness on sidewalls 108A, as shown. In some embodiments, a PVD deposition process does not conformally deposit the encapsulation layer 152 with a uniform thickness $T_{EC}$. In some such embodiments, portions of the encapsulation layer 152 adjacent to uppermost surface 108B is wider (illustrated by dashed lines 2201) than portions adjacent to lowermost surface 108C.

In other embodiments when the aspect ratio is less than 1:1, a physical vapor deposition (PVD) process may be utilized. In some such embodiments, encapsulation layer 152 can include materials such as compounds of nitrogen and a transition metal such as, but not limited to AlN, ZrN, and HfN, or compounds of Si and O and one or more of Al, Hf or Ta, such as, but not limited to, AlSiOx, HfSiOx and TaSiOx. A PVD process may not provide a substantially conformal deposition on sidewalls 108A. A thickness of approximately 2 nm may be sufficient to prevent hydrogen transport through an encapsulation layer 152 that is deposited with a material density of at least 90%.

In the illustrative embodiment, the encapsulation layer 152 is blanket deposited in the memory region 101A and in the logic region 101B.

FIG. 22B is a cross-sectional illustration of the structure in FIG. 22A following the process to form via openings 2200 in a dielectric 116 and in the encapsulation layer 152. In the illustrative embodiment, a dielectric 116 is deposited on the encapsulation layer 152. The dielectric may be deposited by an ALD, PVD, CVD process. The deposition process and materials of dielectric 116 are described above. In exemplary embodiments, dielectric 116 may include a material other than a material of the encapsulation layer 152. When an encapsulation layer 152 is first deposited on sidewalls 108A, dielectric 116 can include a material that is deposited in the presence of a hydrogen or an ammonia precursor. In some such embodiments, dielectric 116 can include an insulative high density material such as, but not limited to, AlxOy, HfOx, ZrOx, TaOx, TiOx, AlSiOx, HfSiOx, TaSiOx, AlN, ZrN, or HfN.

In the illustrative embodiment, the encapsulation layer 152 is blanket deposited in the memory region 101A and in the logic region 101B and the dielectric 116 is blanket deposited on the encapsulation layer 152. In other embodiments, the encapsulation layer 152 may be removed from the logic region 101B prior to deposition of the dielectric 116.

After deposition of dielectric 116, a mask 2202 is formed on dielectric 116. A plasma etch process may be utilized to form via openings 2200 in the dielectric 116. The plasma etch removes portions of the dielectric 116 through the mask 2202 and further etches a portion of the encapsulation layer 152 as shown.

Figure 22C:
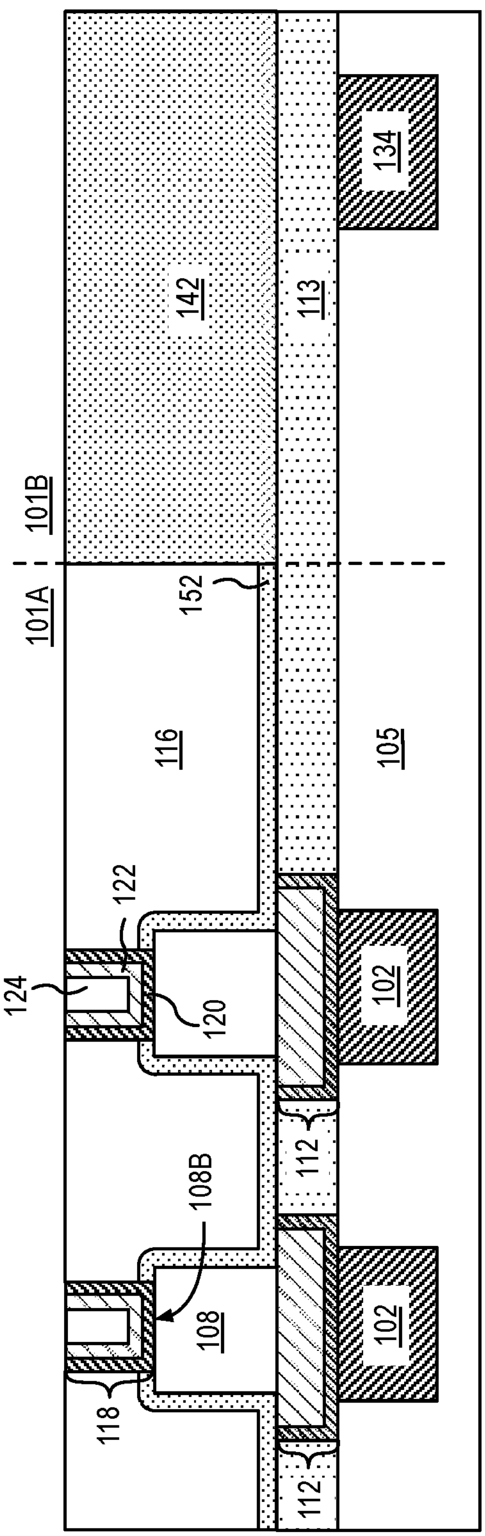
FIG. 22C is a cross-sectional illustration of the structure in FIG. 22B following the process to form via electrodes in the memory region.

FIG. 22C is a cross-sectional illustration of the structure in FIG. 22B following the process to form via electrodes 118. The deposition process utilized to deposit the conductive hydrogen barrier 114, liner layer 122 and conductive fill material 124 is substantially the same as the method described in association with FIG. 10B. In the illustrative embodiment, conductive hydrogen barrier 120 is deposited on uppermost surface 108B, adjacent to encapsulation layer 152, and adjacent to dielectric 116 in via openings 2200. In some embodiments, where via opening 2200 is wider than memory device 108, encapsulation layer 152 on uppermost surface 108B is etched (as illustrated by dashed lines 2204). In some such embodiments, the encapsulation layer 152 may also be recessed on sidewalls 108A and conductive hydrogen barrier 120 may be deposited on a top portion of sidewall 108A (as described in association with FIG. 1D). After deposition, a planarization process is utilized (as described in association with FIG. 10B) to form via electrode 118 on each memory device 108.

The dielectric 116 may be replaced by dielectric 142 in the logic region 101B (as described in association with FIGS. 10C-10D). In the illustrative embodiment, dielectric 142 is blanket deposited on the etch stop layer 113. In exemplary embodiments, the encapsulation layer 152 is removed from the logic region 101B prior to deposition of the dielectric 142. The removal of encapsulation layer 152 from logic region 101B is desirable to remove a high density film (greater than 90% film density). Depending on materials a high density film may have a high dielectric constant (such above 4) and can cause electrical degradation in interconnect operation due to higher charge storage capability.

Figure 22D:
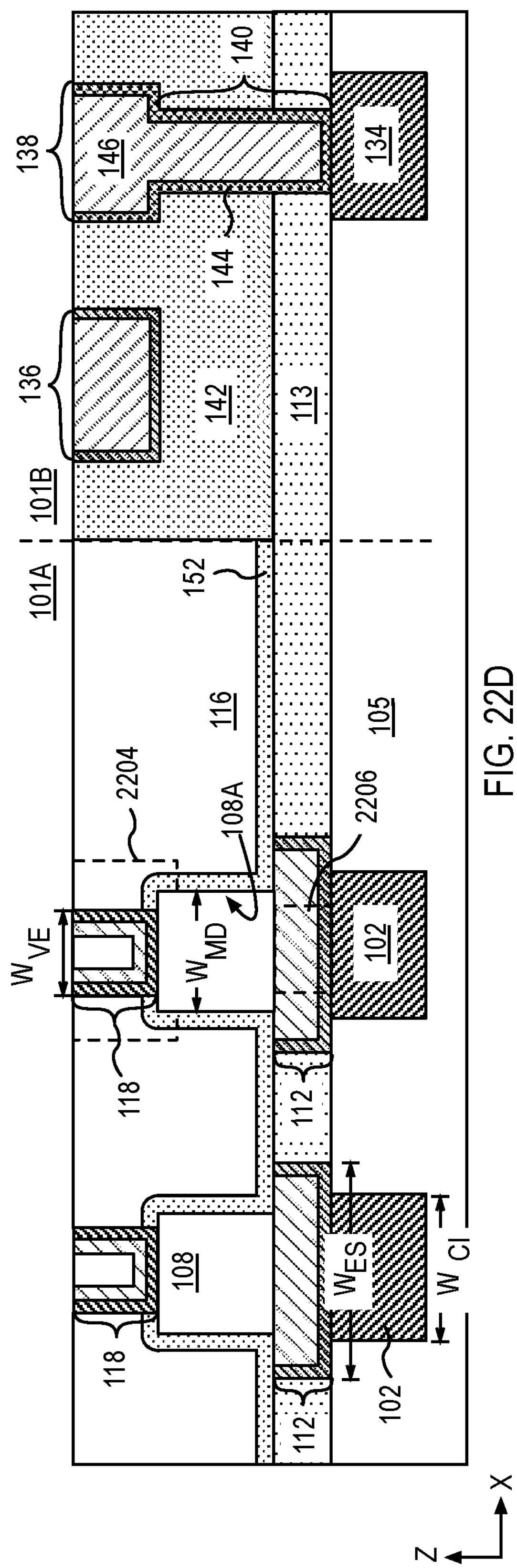
FIG. 22D is a cross-sectional illustration of the structure in FIG. 22C following the process to form via structure and metal lines in the logic region.

FIG. 22D is a cross-sectional illustration of the structure in FIG. 22C following the process to form via structure 140 and metal lines 136 and 138. The process to form via structure 140 and metal lines 136 and 138 is the same or substantially the same as described in association with FIGS. 10E-10H. In the illustrative embodiment, formation of an opening to form via structure 140 includes further etching through encapsulation layer 152 and additionally depositing liner layer 144 adjacent to encapsulation layer 152.

The encapsulation layer 152 has been discussed herein, in a structural embodiment, where metal lines 136 and 138 are also formed at a same level as via electrode 118. In other embodiments, encapsulation layer 152 may be formed in combination with various different electrode structures, such as electrode structure 148. In yet other embodiments, encapsulation layer 152 may be formed in combination with dielectric 204, 142 and 116.

In some embodiments, lateral thickness, $W_{VE}$ of via electrode 118 is greater than $W_{MD}$. In some such embodiments via electrode 118 is on an entire uppermost surface 108B. In further some such embodiments, the etch utilized to form opening to form via electrode 118 can etch portions of dielectric 116 below uppermost surface 108B. The via electrode 118 can extend below uppermost surface 108B and on sidewalls 108A as indicated by dashed box 2204.

While electrode structure 112 is illustrated in FIGS. 10A-15A, and in 19A-22D, electrode structure 112 can be replaced in embodiments by electrode structure 148, described in association with FIGS. 1H and 18C.

Figure 23:
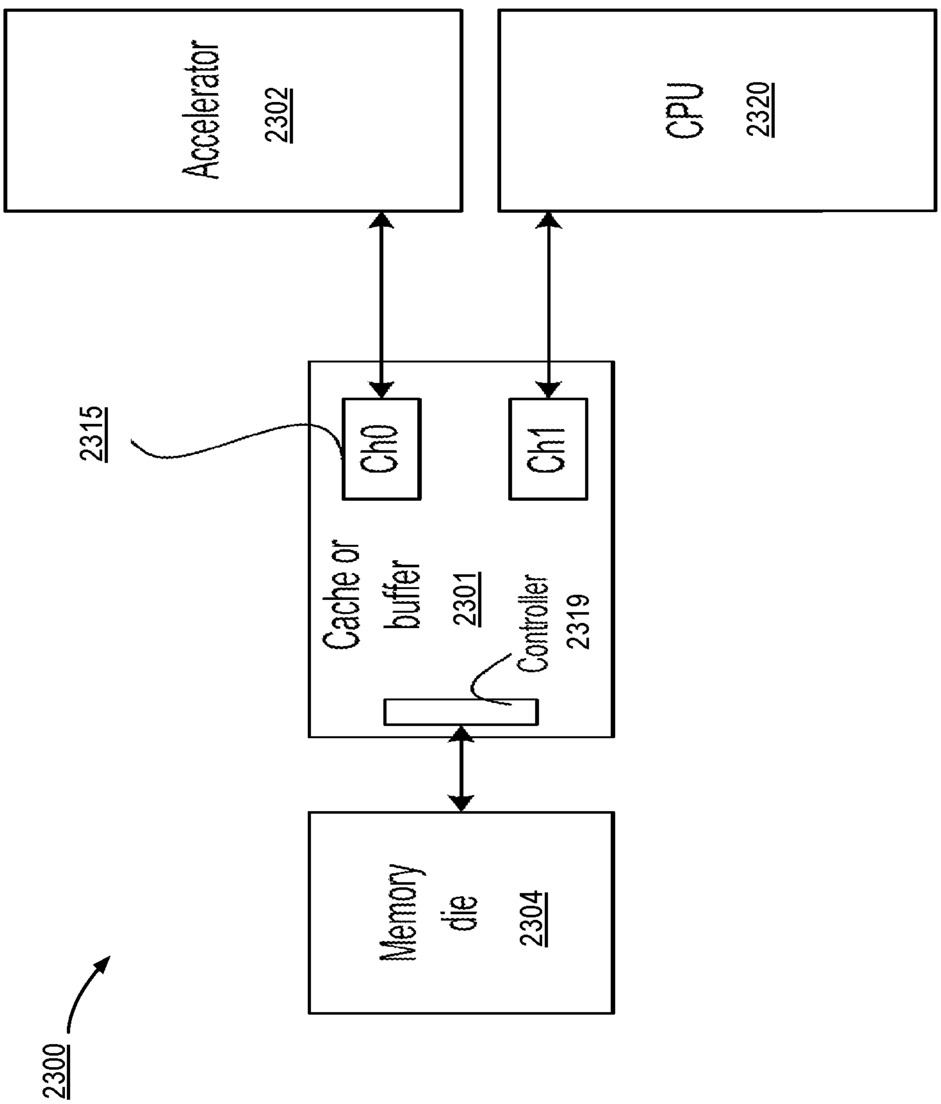
FIG. 23 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.
Figure 24:
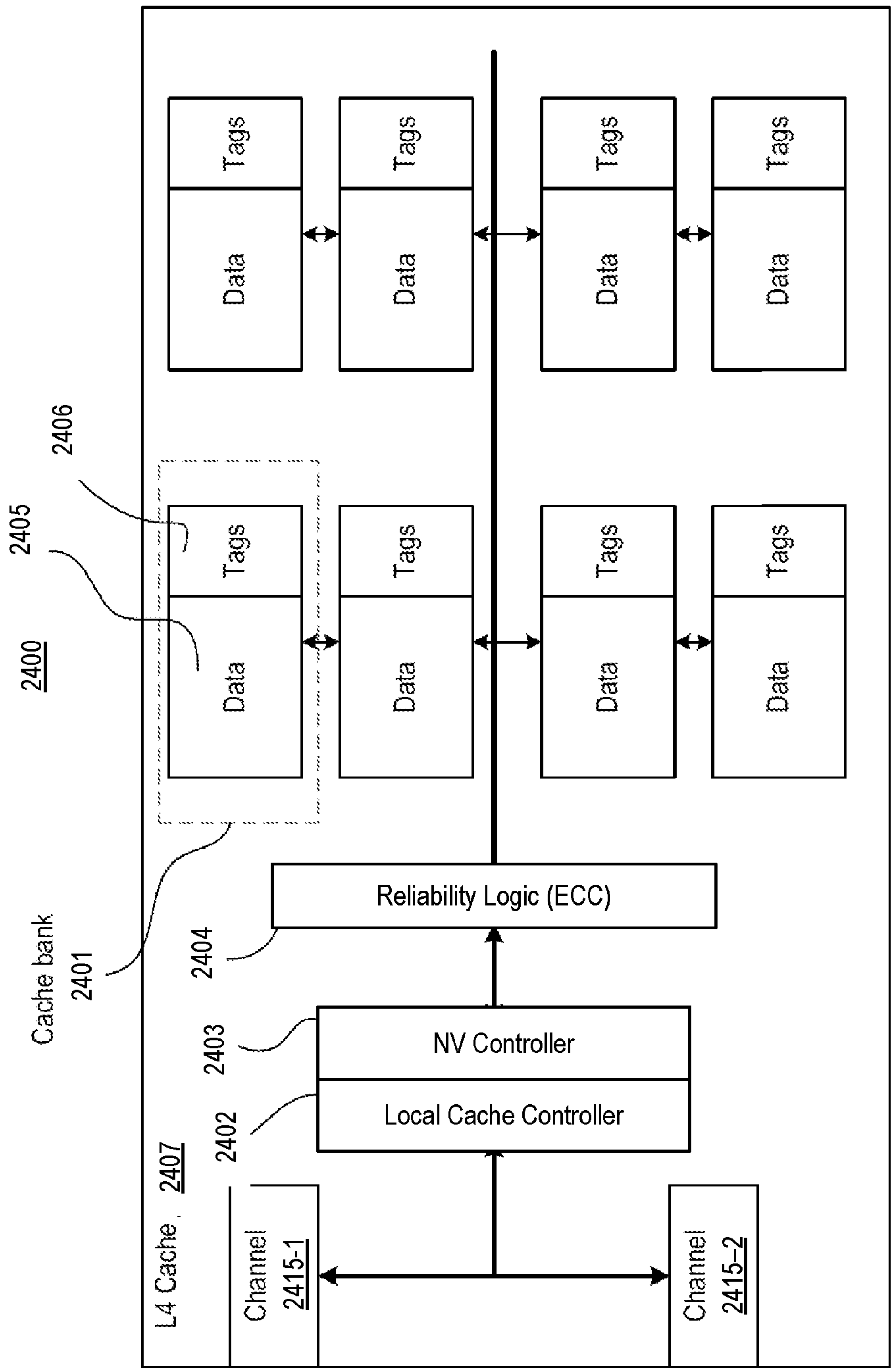
FIG. 24 illustrates an architecture of the coherent cache or memory-side buffer chiplet with multiple controllers and multiple cache banks, in accordance with some embodiments.

FIG. 23 illustrates computing architecture 2300 with a coherent cache or memory-side buffer chiplet that includes a memory controller, wherein the coherent cache or memory-side buffer chiplet is coupled to an accelerator, a processor, and a memory, in accordance with some embodiments. Computing architecture 2300 comprises coherent cache or memory-side buffer chiplet 2301, accelerator 2302 (e.g., inference chip), processor (e.g., central processing unit CPU 2320), and memory die 2304. In some embodiments, coherent cache or memory-side buffer chiplet 2301 comprises at least two channels 2315 which are configured to connect with accelerator 2302 and CPU 2320. In some embodiments, coherent cache or memory-side buffer chiplet 2301 comprises I/O and controller 2319 to manage data traffic with memory die 2404. By moving controller 2319 from CPU 2320 to coherent cache or memory-side buffer chiplet 2301, cost in terms of power and die area for CPU 2320 is reduced. In some embodiments, coherent cache or memory-side buffer chiplet 2301 is a cache memory that comprises ferroelectric memory cells. For example, coherent cache or memory-side buffer chiplet 2301 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation FIG. 24 illustrates architecture 2400 of the coherent cache or memory-side buffer chiplet (e.g., 2407) with multiple controllers and multiple cache banks, in accordance with some embodiments. In some embodiments, architecture 2400 comprises channels (e.g., ch0 2415-1 and ch1 2415-2), cache banks 2401, local cache controller 2402, non-volatile (NV) controller 2403, and reliability logic 2404. Coherent cache or memory-side buffer chiplet 2407 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2401 includes data bank 2405 (e.g., comprising memory cells) and associated tags 2406. In some embodiments, data bank 2405 comprises ferroelectric memory cells. In some embodiments, data bank 2405 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2405 includes ferroelectric memory, it uses NV controller 2403 and a stronger reliability logic (e.g., error correction code) for security compared to non-ferroelectric memory for data bank 2405.

When data bank 2405 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 2406 may be coupled with each physical line. Tag 2406 may comprise some address bits, sufficient to uniquely identify which address currently occupies the physical line coupled with the tag.

In some embodiments, cache controller 2402 could be used to control state transitions required for cache look ups such as comparing requested addresses with tags stored in the tags 2406 and identifying a candidate for replacement (replacement algorithm) when a cache miss occurs. In addition, the cache controller could be tasked with initializing the cache when the cache powers on. When FE memory of data bank 2405, which retains state across power cycles, is used, cache controller 2402 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2402 would skip locations marked thus when initializing memory.

In some embodiments, reliability logic 2404 performs error correction to the data. Any suitable error correction scheme (e.g., with error correction code (ECC)) may be used by reliability logic 2404. In some embodiments, NV controller 2403 is provided to explicitly clear the cache when using a non-volatile memory, such as FM memory for data bank 2405. NV controller 2403 may include an NV bit which indicates cache lines that should not be cleared but are expected to retain their contents across power cycles. The functions of NV controller 2403 can be combined in cache controller 2402, or vice versa.

Figure 25:
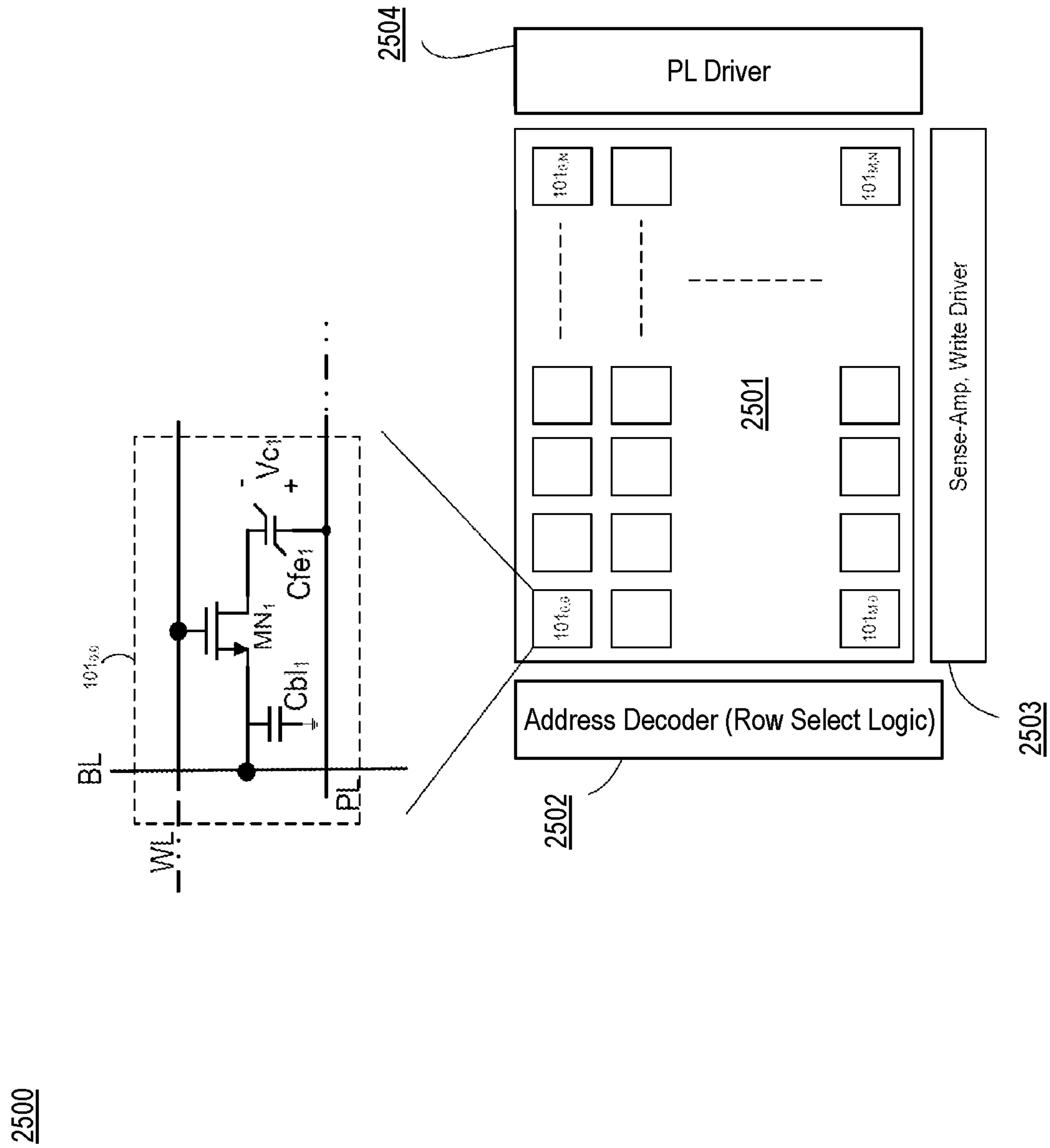
FIG. 25 illustrates an apparatus comprising memory and corresponding logic, wherein the memory comprises ferroelectric (FE) memory bit-cells, in accordance with some embodiments.

FIG. 25 illustrates apparatus 2500 comprising memory and corresponding logic, wherein the memory comprises ferroelectric (FE) memory bit-cells, in accordance with some embodiments. Apparatus 2500 comprises M×N memory array 2501 of bit-cells, logic circuitry 2502 for address decoding, sense amplifier and write drivers 2503, and plate-line (PL) driver 2504. Logic circuitry 2502 comprises address decoders for selecting a row of bit-cells and/or a particular bit-cell from M×N memory array 2501, where M and N are integers of same or different values. Logic circuitry 2502 comprises sense-amplifiers for reading the values from the selected bit-cell, while write drivers are used to write a particular value to a selected bit-cell. Here, a schematic of FE bit-cell $\mathbf{2501}_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $\mathbf{2501}_{0,0}$ comprises a word-line (WL), a plate-line (PL), a bit-line (BL), a complementary bit-line (BLB), and two half bit-cells $\mathbf{2501}_{0,0\_A}$ and $\mathbf{2501}_{0,0\_B}$. In some embodiments, bit-cell $\mathbf{2501}_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CB1_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 26:
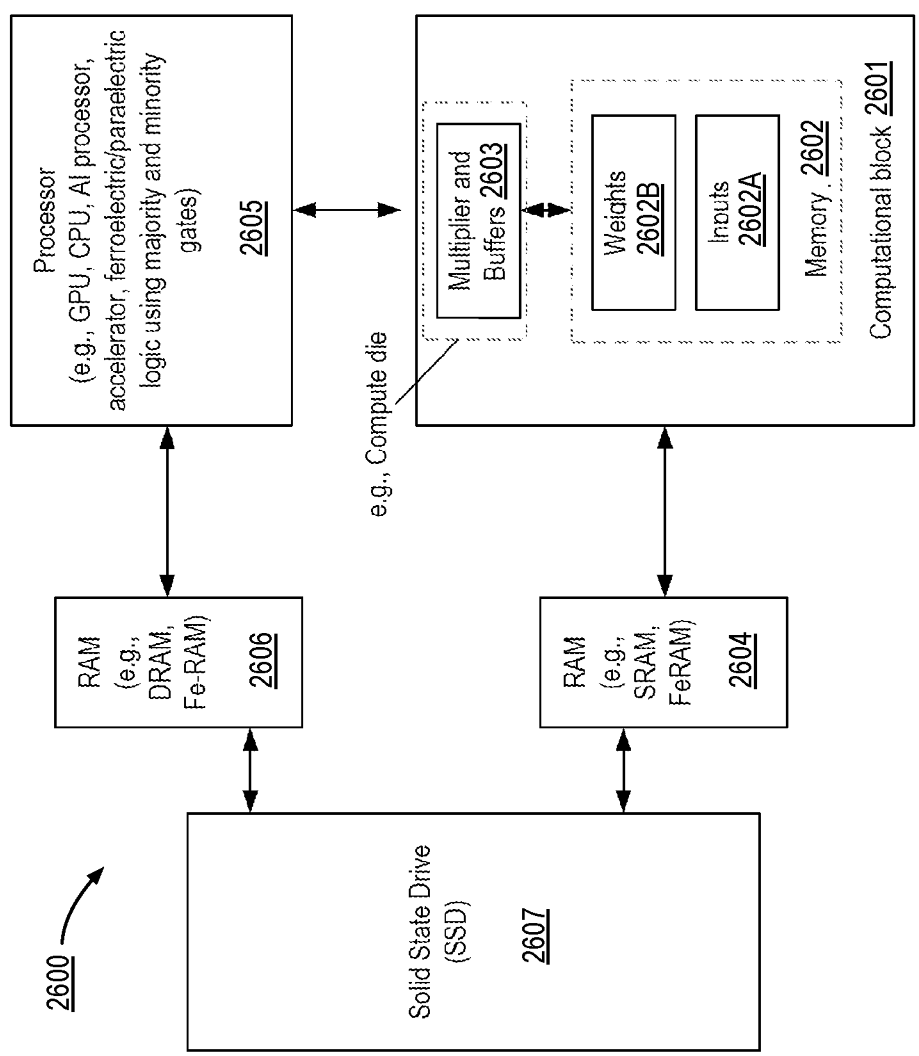
FIG. 26 illustrates a high-level architecture of an artificial intelligence (AI) machine comprising a compute die positioned on top of a memory die, in accordance with some embodiments.

FIG. 26 illustrates a high-level architecture of an artificial intelligence (AI) machine 2600 comprising a compute die positioned on top of a memory die, in accordance with some embodiments. AI machine 2600 comprises computational block 2601 or processor having memory 2602 such as random-access memory (RAM) 2602 and compute die 2603; first random-access memory 2604 (e.g., static RAM (SRAM), ferroelectric or paraelectric RAM (FeRAM), ferroelectric or paraelectric static random-access memory (FeSRAM)), main processor 2605, second random-access memory 2606 (dynamic RAM (DRAM), FeRAM), and solid-state memory or drive (SSD) 2607. In some embodiments, some or all components of AI machine 2600 are packaged in a single package forming a system-on-chip (SoC). The SoC can be configured as a logic-on-logic configuration, which can be in a 3D configuration or a 2.5D configuration.

In some embodiments, computational block 2601 is packaged in a single package and then coupled to main processor 2605 and memories 2604, 2606, and 2607 on a printed circuit board (PCB). In some embodiments, computational block 2601 is configured as a logic-on-logic configuration, which can be in a 3D configuration or a 2.5D configuration. In some embodiments, computational block 2601 comprises a special purpose compute die 2603 or microprocessor. For example, compute die 2603 is a compute chiplet that performs a function of an accelerator or inference. In some embodiments, RAM 2602 is DRAM which forms a special memory/cache for the special purpose compute die 2603. The DRAM can be embedded DRAM (eDRAM) such as 1T-1C (one transistor and one capacitor) based memories. In some embodiments, RAM 2602 is ferroelectric or paraelectric RAM (Fe-RAM).

In some embodiments, compute die 2603 is specialized for applications such as Artificial Intelligence, graph processing, and algorithms for data processing. In some embodiments, compute die 2603 further has logic computational blocks, for example, for multipliers and buffers, a special data memory block (e.g., buffers) comprising DRAM, FeRAM, or a combination of them. In some embodiments, RAM 2602 has weights and inputs stored in-order to improve the computational efficiency. The interconnects between main processor 2605 (also referred to as special purpose processor), First RAM 2604 and compute die 2603 are optimized for high bandwidth and low latency. The architecture of FIG. 26 allows efficient packaging to lower the energy, power, or cost and provides for ultra-high bandwidth between RAM 2602 and compute die 2603 of computational block 2601.

In some embodiments, RAM 2602 is partitioned to store input data (or data to be processed) 2602A and weights 2602B. In some embodiments, input data 2602A is stored in a separate memory (e.g., a separate memory die) and weights 2602B are stored in a separate memory (e.g., separate memory die).

In some embodiments, computational logic or compute die 2603 comprises matrix multiplier, adder, concatenation logic, buffers, and combinational logic. In various embodiments, compute die 2603 performs multiplication operation on input data 2602A and weight 2602B. In some embodiments, weights 2602B are fixed weights. For example, main processor 2605 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2602. In various embodiments, the input data 2602A, that is to be analyzed using a trained model, is processed by computational block 2601 with computed weights 2602B to generate an output (e.g., a classification result).

In some embodiments, First RAM 2604 is ferroelectric or paraelectric based SRAM. For example, a six transistor (6T) SRAM bit-cells having ferroelectric or paraelectric transistors are used to implement a non-volatile FeSRAM. In some embodiments, SSD 2607 comprises NAND flash cells. In some embodiments, SSD 2607 comprises NOR flash cells. In some embodiments, SSD 2607 comprises multi-threshold NAND flash cells.

In various embodiments, the non-volatility of FeRAM is used to introduce new features such as security, functional safety, and faster reboot time of AI machine 2600. The non-volatile FeRAM is a low power RAM that provides fast access to data and weights. First RAM 2604 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2600 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material. Perovskites can be suitably doped to achieve a spontaneous distortion in a range of 0.3 to 2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: Al(1−x)Sc(x)N, Ga(1−x)Sc(x)N, Al(1−x)Y(x)N or Al(1−x−y)Mg(x)Nb(y)N, HfO2 doped with one of: Al, Ca, Ce, Dy, Er, Gd, Ge, La, Sc, Si, Sr, Sn, or Y. In some embodiments, the FE material includes one or more of: Bismuth ferrite (BFO), or BFO with doping material.

In some embodiments, the FE material includes Bismuth ferrite (BFO), BFO with a doping material where in the doping material is one of Lanthanum, or any element from the lanthanide series of the periodic table. In some embodiments, the FE material includes a relaxor ferro-electric includes one of Barium Titanium-Bismuth Zinc Niobium Tantalum (BT-BZNT) or Barium Titanium-Barium Strontium Titanium (BT-BST). Hf(1−x)ExOy In some embodiments, the FE material includes Hafnium oxides of the form, Hf(1−x)Ex Oy where E can be Al, Ca, Ce, Dy, Er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF). In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials SnTiO3 (STO), respectively, and LaAlO3 (LAO) and STO, respectively. For example, a super lattice of [PTO/STO]n or [LAO/STO]n, where 'n' is between 1 to 2600. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O.

The method of forming the structures described herein are applicable to various logic embodiments. For example, the FeRAM devices or capacitive structures formed herein can be used to forming other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Figure 27:
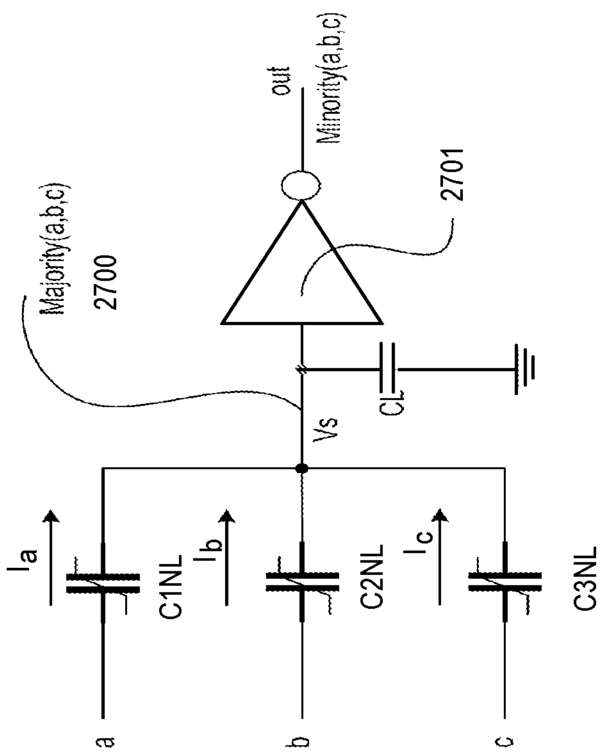
FIG. 27 illustrates a 3-input majority gate using non-linear input capacitors, in accordance with some embodiments.

FIG. 27 illustrates 3-input majority gate 2700 using non-linear input capacitors, in accordance with some embodiments. In some embodiments, 3-input majority gate 2700 comprises non-linear input capacitors C**1*n*1, C2*n*1, and C3*n*1 that receives digital signals a, b, and c, respectively. Here, signal names and node names are interchangeably used. For example, 'a' refers to node 'a' or signal 'a' depending on the context of the sentence. One end or terminal of capacitor C1*n*1 is coupled to node a while the other end of capacitor C1*n*1 is coupled to summing node Vs. The same is true for other non-linear capacitors C2*n*1 and C3*n*1 as shown. In some embodiments, 3-input majority gate 2700 comprises a driver circuitry 2701. In this example, driver circuitry 2701 is an inverter. In other embodiments, other types of driver circuitries can be used such as NAND gate, NOR gate, multiplexer, buffer, and other logic gates. The majority function is performed at summing node Vs as Majority(a,b,c). In this example, since driver circuitry 2701** is an inverter, minority function is performed at output "out" as Minority(a,b,c).

In some embodiments, in addition to the gate capacitance of driver circuitry 2701, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfOx, ABO3 perovskites, nitrides, oxy-fluorides, oxides, etc. A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, or La-substituted PbTiO3. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C**1*n*1, C2*n*1, and C3*n*1** comprise non-linear polar material. In some embodiments, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and '0' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O27, LaNiO3, and ReO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where ‘A’ is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1−x)Sc(x)N, Ga(1−x)Sc(x)N, Al(1−x)Y(x)N or Al(1−x−y)Mg(x)Nb(y)N, where “x” and “y” are fractions, HfO2 doped with one of: Al, Ca, Ce, Dy, Er, Gd, Ge, La, Sc, Si, Sr, Sn, or Y. In some embodiments, the FE material includes Bismuth ferrite (BFO) or BFO with doping material.

In some embodiments, the FE material includes Bismuth ferrite (BFO), BFO with a doping material where in the doping material is one of Lanthanum, or any element from the lanthanide series of the periodic table. In some embodiments, the FE material includes a relaxor ferroelectric including one of Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf(1−x) ExOy where E can be Al, Ca, Ce, Dy, Er, Gd, Ge, La, Sc, Si, Sr, Sn, or Y. In some embodiments, FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node Vs produces a voltage and current that is the output of the majority gate 2700. Any suitable driver circuitry 2701 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

The majority function is performed at the summing node Vs, and the resulting voltage is projected on to capacitance of driver circuitry 2701. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 2700. Any suitable driver circuitry 2701 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 27 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2700 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2701 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1,x_2, \ldots x_n)=V_{C_1,C_2, \ldots C_n} f(x_1,x_2, \ldots x_n) \wedge x_1^{C_1} \wedge x_2^{C_2} \wedge x_3^{C_3} \ldots \wedge x_n^{C_n}$$

where $C_i$ is either 0 or 1. When $C_i$ is 1, $x_i^{C_i}=x_i$ (the input is used in its original form). When $C_i$ is 0, $x_i^{C_i}=\overline{x_i}$ (the input is used in its inverted form). The first level of logic is represented by at most $2^n$ AND gates (Δ), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 28:
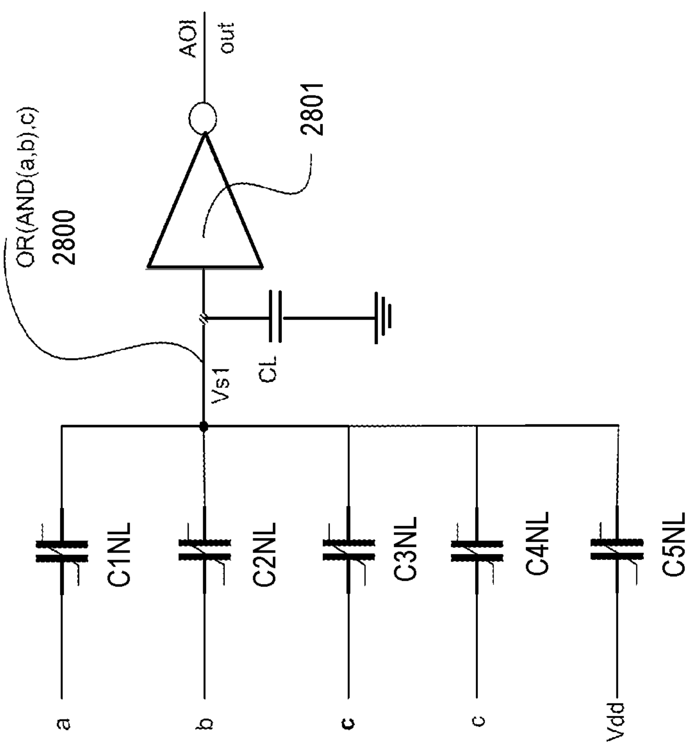
FIG. 28 illustrates a complex logic gate implemented using a 5-input majority gate, in accordance with some embodiments.

FIG. 28 illustrates complex logic gate 2800 implemented using a 5-input majority gate, in accordance with some embodiments. In some embodiments, an AOI (and-or-invert) logic comprises a 5-input majority gate. The 5-input majority gate includes non-linear capacitors C**1*n*1, C2*n*1, C3*n*1, C4*n*1, and C5*n*1 and driving circuitry 2801 coupled as shown. In various embodiments, two of the non-linear capacitors receives the same input. Here, capacitors C3*n*1 and C4*n*1 receive input 'c'. In various embodiments, C5*n*1 is coupled to Vdd to produce an OR function at node Vs, where the OR function is OR(AND(a,b),c). In some embodiments, other logic gates can be realized by changing Vdd to ground for capacitor C5*n*1**, and/or changing other inputs.

Following examples are provided that illustrate the various embodiments. The examples can be combined with other examples. As such, various embodiments can be combined with other embodiments without changing the scope of the invention.

Example 1: A device comprising: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is less than the first lateral thickness; a second dielectric spanning the first region and on the etch stop layer, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 2: The device of example 1, wherein the second dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN.

Example 3: The device of example 1, wherein the third dielectric comprises $SiO_2$, SiOC, SiC or $SiO_2$ doped with F.

Example 4: The device of example 1, wherein the etch stop layer comprises silicon and one or more of nitrogen and carbon and the second dielectric does not comprise silicon nitride.

Example 5: The device of example 1, wherein the first conductive hydrogen barrier layer and the second conductive hydrogen barrier layer comprise TiAlN, with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide (ZO) or METGLAS series of alloys.

Example 6: The device of example 1, wherein the first conductive hydrogen barrier layer and the second conductive hydrogen barrier layer comprise different materials.

Example 7: The device of example 1, wherein the first conductive hydrogen barrier layer and the second conductive hydrogen barrier layer comprise a thickness of least 1 nm.

Example 8: The device of example 1, wherein the first conductive hydrogen barrier layer laterally surrounds the first conductive fill material, and wherein the memory device is not in contact with the first conductive hydrogen barrier layer.

Example 9: The device of example 1, wherein the first conductive hydrogen barrier layer laterally surrounds the first conductive fill material, and wherein a portion of the first conductive hydrogen barrier layer and a portion of the first conductive fill material are in contact with a lower most surface of the memory device.

Example 10: The device of example 1, wherein the electrode structure further comprises a first liner layer directly between the first conductive hydrogen barrier layer and the first conductive fill material and wherein the first liner layer comprises a material that is different from a material of the first conductive hydrogen barrier layer.

Example 11: The device of example 1, wherein the via electrode further comprises a second liner layer between the second conductive hydrogen barrier layer and the second conductive fill material, and wherein the second liner layer comprises a material that is different from a material of the second conductive hydrogen barrier layer.

Example 12: The device of example 1, wherein the etch stop layer comprises a first vertical thickness that is equal to a second vertical thickness of the electrode structure.

Example 13: The device of example 1, wherein the third conductive interconnect has a lower most surface that is below an uppermost surface of the memory device.

Example 14: The device of example 1, wherein the second conductive hydrogen barrier layer extends on an entire uppermost surface of the memory device.

Example 15: The device of example 1, wherein the second conductive hydrogen barrier layer further extends below the uppermost surface and on to a portion of a sidewall of a top electrode of the memory device.

Example 16: The device of example 1, wherein the memory device comprises a curved uppermost surface, and wherein the second conductive hydrogen barrier layer extends over an entire curved uppermost surface.

Example 17: The device of example 1, wherein the via electrode is not symmetric about the memory device.

Example 18: The device of example 1, wherein the first conductive interconnect has a third lateral thickness that is smaller than the first lateral thickness.

Example 19: The device of example 18, wherein first conductive hydrogen barrier layer extends over an uppermost surface of the first conductive interconnect and below the uppermost surface on a top portion of a sidewall of the first conductive interconnect.

Example 20: The device of example 1, wherein the third conductive interconnect has a lower most surface that is above an uppermost surface of the memory device.

Example 21: The device of example 1, wherein the third conductive interconnect has a lower most surface that is below an uppermost surface of the memory device.

Example 22: The device of example 1, wherein the via structure comprises an upper portion and a lower portion, wherein the lower portion is adjacent to the etch stop layer and the upper portion is adjacent to the third dielectric.

Example 23: The device of example 1, wherein the ferroelectric material comprises one of: bismuth ferrite (BFO), BFO with a doping material where in the doping material is one of lanthanum, or elements from lanthanide series of periodic table; lead zirconium titanate (PZT), or PZT with a doping material, wherein the doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf(1−x)ExOy, where E includes one of: Al, Ca, Ce, Dy, Er, Gd, Ge, La, Sc, Si, Sr, Sn, Zr, or Y, where "x" and "y" are fractions; Al(1−x)Sc(x)N, Ga(1−x)Sc(x)N, Al(1−x)Y(x)N or Al(1−x−y)Mg(x)Nb(y)N, where "x" and "y" are fractions; HfO2 doped with one of: Al, Ca, Ce, Dy, Er, Gd, Ge, La, Sc, Si, Sr, Sn, or Y, wherein 'x' is a fraction; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100.

Example 24: The device of example 1, wherein the paraelectric material comprises SrTiO3, Ba(x)Sr(y)TiO3 (where x is −0.05, and y is 0.95), HfZrO2, Hf—Si—O, or La-substituted PbTiO3.

Example 25: The device of example 1, wherein the first conductive material comprises an uppermost surface that is concaved, and wherein the memory device comprises a lower most surface that is substantially matched with the uppermost surface of the first conductive material.

Example 26: The device of example 1, wherein a portion of the first conductive material not covered by the memory device is recessed below an uppermost surface of the first conductive material and wherein the second dielectric extends below a lowermost surface of the memory device.

Example 27: The device of example 1, wherein the first conductive material comprises a first surface in contact with the memory device, and a second surface not covered by the memory device, wherein the second surface is tapered to decrease in thickness away from the memory device.

Example 28: A device comprising: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is greater than the first lateral thickness; a second dielectric spanning the first region and on the etch stop layer, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 29: The device of example 27, wherein the first conductive hydrogen barrier layer and the second conductive hydrogen barrier layer comprise TiAlN, with >30 atomic percent AlN, TaN with >30 atomic percent N, TiSiN with >20 atomic percent SiN, TaC, TiC, WC, WN, carbonitrides of Ta, Ti or W, TiO, $Ti_2O$, $WO_3$, $SnO_2$, ITO, IGZO, zince oxide (ZO) or METGLAS series of alloys.

Example 30: The device of example 27, wherein the memory device is in contact with the first conductive hydrogen barrier layer and the first conductive fill material, and wherein the memory device covers the electrode structure.

Example 31: The device of example 27, wherein the via electrode further comprises a liner layer between the second conductive hydrogen barrier layer and the second conductive fill material, wherein the liner layer comprises a material that is different from a material of the second conductive hydrogen barrier layer.

Example 32: The device of example 27, wherein the memory device is in contact with the first conductive hydrogen barrier layer and the first conductive material, and wherein the memory device covers the electrode structure.

Example 33: The device of example 27, wherein the first conductive hydrogen barrier layer laterally surrounds the first conductive material, and wherein a portion of the first conductive hydrogen barrier layer and a portion of the first conductive material are in contact with a lower most surface of the memory device.

Example 34: The device of example 27, wherein the first conductive material comprises an uppermost surface that is concaved, and wherein the memory device comprises a lower most surface that is substantially matched with the uppermost surface of the first conductive material.

Example 35: The device of example 27, wherein the memory device further extends on to an uppermost surface of the etch stop layer, and wherein a portion of the etch stop layer not covered by the memory device is recessed below an uppermost surface of the etch stop layer and wherein the second dielectric extends below a lowermost surface of the memory device.

Example 36: The device of example 27, wherein the etch stop layer comprises a first surface in contact with the memory device, and a second surface not covered by the memory device, wherein the second surface is tapered to decrease in thickness away from the memory device.

Example 37: The device of example 27, wherein the second dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN and wherein the third dielectric comprises $SiO_2$, SiOC, SiC or $SiO_2$ doped with F.

Example 38: A system comprising: a processor; a communication interface communicatively coupled to the processor; and a memory coupled to the processor, wherein the memory comprises: bit-cells, wherein one of the bit-cells includes: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is less than the first lateral thickness; a second dielectric spanning the first region and on the etch stop layer, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 1a: A device comprising: a first region comprising: a first conductive interconnect within a first dielectric in a first level; a second level above the first level, the second level comprising: an electrode structure on the first conductive interconnect, the electrode structure comprising: a first conductive material; and a first conductive hydrogen barrier layer on the first conductive material, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is less than the first lateral thickness; a second dielectric spanning the first region, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a lateral portion in contact with the memory device; substantially vertical portions directly adjacent to the second dielectric; and a conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 2a: The device of example 1a, wherein the via electrode further comprises a second liner layer between the second conductive hydrogen barrier layer and the conductive fill material, wherein the second liner layer comprises a material that is different from a material of the second conductive hydrogen barrier layer.

Example 3a: The device of example 1a, wherein the lateral portion of the second conductive hydrogen barrier layer is on a first portion of an uppermost surface of the memory device, and wherein the second dielectric is on a second portion of an uppermost surface of the memory device and directly adjacent to sidewalls of the memory device and wherein the lateral portion is directly between the second dielectric.

Example 4a: The device of example 1a, wherein the second conductive hydrogen barrier layer extends on an entire uppermost surface of the memory device.

Example 5a: The device of example 1a, wherein the second conductive hydrogen barrier layer further extends below the uppermost surface and on to a portion of a sidewall of a top electrode of the memory device.

Example 6a: A device comprising: a first region comprising: a first conductive interconnect within a first dielectric in a first level; a second level above the first level, the second level comprising: an electrode structure on the first conductive interconnect, the electrode structure comprising: a first conductive material; and a first conductive hydrogen barrier layer on the first conductive material, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is greater than the first lateral thickness; a second dielectric spanning the first region, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a lateral portion in contact with the memory device; substantially vertical portions directly adjacent to the second dielectric; and a conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 7a: A device comprising: a first conductive interconnect; an electrode structure on the first conductive interconnect, the electrode structure comprising: a first conductive material; and a first conductive hydrogen barrier layer on the first conductive material; an etch stop layer comprising an insulator, the etch stop layer laterally surrounding the electrode structure; a memory device on least a portion of the electrode structure, the memory device comprising a ferroelectric material or a paraelectric material; a second dielectric spanning the first region, the second dielectric comprising an amorphous, greater than 90% film density hydrogen barrier material, wherein the hydrogen barrier material further comprises a transition metal, and wherein the memory device is directly adjacent to and embedded within the second dielectric; a via electrode on at least a portion of the memory device, the via electrode comprising: a second conductive hydrogen barrier layer comprising a lateral portion in contact with the memory device and substantially vertical portions directly adjacent to the second dielectric; and a conductive fill material adjacent to the second conductive hydrogen barrier layer.

Example 1b; A device comprising a first region, the first region comprising a first conductive interconnect within a first dielectric in a first level; a second level above the first level, the second level comprising: an electrode structure on the first conductive interconnect, the electrode structure comprising a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is less than the first lateral thickness; an encapsulation layer comprising a first amorphous, greater than 90% film density hydrogen barrier material directly on a sidewall of the memory device; a second dielectric spanning the first region, the second dielectric comprising a second amorphous, greater than 90% film density hydrogen barrier material adjacent the encapsulation layer; a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric and the encapsulation layer, wherein the third dielectric comprises a less than 90% film density material, wherein the third dielectric laterally surrounds a portion of the via structure.

Example 2b: The device of example 1b, wherein the encapsulation layer comprises $Al_xO_y$, $HfO_x$, $AlSiO_x$, $ZrO_x$, $TiO_x$, $AlSiO_X$, $HfSiO_X$, $TaSiO_X$, AlN, ZrN, or HfN, and wherein the encapsulation layer comprises a material that is different from a material of the second dielectric.

Example 3b: The device of example 1b, wherein the encapsulation layer comprises a thickness of less than 5 nm.

Example 4b: The device of example 1b, wherein the encapsulation layer comprises a thickness adjacent to an uppermost surface of the memory device that is greater than a thickness adjacent to a lowermost surface of the memory device.

Example 5b: The device of example 1b, wherein the via electrode comprises a third lateral thickness that is less than the second lateral thickness and wherein an uppermost surface of the memory device comprises a first surface portion and a second surface portion, wherein the encapsulation layer is further on a first surface portion wherein the via electrode is on the second surface portion.

Example 6b: The device of example 1b, wherein the via electrode comprises a third lateral thickness that is greater than the second lateral thickness and wherein the via electrode covers an uppermost surface of the memory device.

Example 7b: The device of example 6b, wherein the via electrode further extends below the uppermost surface of the memory device and wherein the via electrode is on a portion of the encapsulation layer.

Example 8b: The device of example 6b, wherein the encapsulation layer is in contact with the first conductive hydrogen barrier layer and wherein the encapsulation layer is further on an uppermost surface of the first conductive fill material.

Example 9b: A device comprising: a first region comprising: a first conductive interconnect within a first dielectric in a first level; and a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is greater than the first lateral thickness; an encapsulation layer comprising a first amorphous, greater than 90% film density hydrogen barrier material directly on a sidewall of the memory device; a second dielectric spanning the first region, the second dielectric comprising a second amorphous, greater than 90% film density hydrogen barrier material adjacent the encapsulation layer; a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; and a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric, wherein the third dielectric comprises a less than 90% film density material, wherein the third dielectric laterally surrounds a portion of the via structure.

Example 10b: The device of example 9b, wherein the encapsulation layer is on the etch stop layer but not in contact with the first conductive hydrogen barrier layer or the first conductive fill material.

Example 11b: The device of example 9b, wherein the via electrode comprises a third lateral thickness that is greater than the second lateral thickness, wherein the via electrode covers an uppermost surface of the memory device, wherein the via electrode further extends below the uppermost surface of the memory device and wherein the via electrode is on a portion of the encapsulation layer.

Example 12b: A system comprises a processor; a communication interface communicatively coupled to the processor; and a memory coupled to the processor, wherein the memory comprises: bit-cells, wherein one of the bit-cells includes a first region comprising a first conductive interconnect within a first dielectric in a first level; a second level above the first level, the second level comprising: an electrode structure on the first conductive interconnect, the electrode structure comprising a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a memory device comprising a ferroelectric material or a paraelectric material on least a portion of the electrode structure, the memory device further comprising a second lateral thickness, wherein the second lateral thickness is less than the first lateral thickness; an encapsulation layer comprising a first amorphous, greater than 90% film density hydrogen barrier material directly on a sidewall of the memory device; a second dielectric spanning the first region, the second dielectric comprising a second amorphous, greater than 90% film density hydrogen barrier material adjacent the encapsulation layer; a via electrode on at least a portion of the memory device, the via electrode comprising: a second conductive hydrogen barrier layer comprising a lateral portion in contact with the memory device; substantially vertical portions directly adjacent to the second dielectric; and a second conductive fill material adjacent to the second conductive hydrogen barrier layer; a second region adjacent to the first region, the second region comprising: a second conductive interconnect within the first level; the second level further comprising: a third conductive interconnect; a via structure coupled between the second conductive interconnect and the third conductive interconnect; and a third dielectric on the etch stop layer, the third dielectric directly adjacent to the second dielectric and the encapsulation layer, wherein the third dielectric comprises a less than 90% film density material, wherein the third dielectric laterally surrounds a portion of the via structure.

Example 1c: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; depositing a first conductive hydrogen barrier layer in the first opening; and depositing a first conductive material on the first conductive hydrogen barrier layer; forming a memory device by depositing a material layer stack comprising a ferroelectric material or a paraelectric material on the electrode structure and etching the material layer stack; depositing a second dielectric comprising an amorphous, greater than 90% film density hydrogen barrier material on the memory device and on the etch stop layer; forming a via electrode on the memory device by a second process comprising: forming a second opening in the second dielectric; depositing a second conductive hydrogen barrier layer on at least a portion of a first uppermost surface of the memory device in the second opening; and depositing a second conductive material on the second conductive hydrogen barrier layer; etching and removing the second dielectric from the adjacent logic region and depositing a third dielectric comprising a less than 90% film density material; forming a hanging trench over the second conductive interconnect; forming a third opening in the third dielectric and in the etch stop layer; and depositing a conductive material in the third opening and in the hanging trench to form a via structure on the second conductive interconnect and a metal line on the via structure.

Example 2c: The method of example 1c, wherein depositing the material layer stack comprises: depositing the ferroelectric material, comprising: one of bismuth ferrite (BFO), BFO with a first doping material where in the first doping material is one of lanthanum, or elements from lanthanide series of periodic table; lead zirconium titanate (PZT), or PZT with a second doping material, wherein the second doping material is one of La, Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: BaTiO3, PbTiO3, KNbO3, or NaTaO3; hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf(1−x)ExOy, where E includes one of: Al, Ca, Ce, Dy, Er, Gd, Ge, La, Sc, Si, Sr, Sn, Zr, or Y, where “x” and “y” are fractions; Al(1−x)Sc(x)N, Ga(1−x)Sc(x)N, Al(1−x)Y(x)N or Al(1−x−y)Mg(x)Nb(y)N, where “x” and “y” are fractions; HfO2 doped with one of: Al, Ca, Ce, Dy, Er, Gd, Ge, La, Sc, Si, Sr, Sn, or Y; or niobate type compounds LiNbO3, LiTaO3, lithium iron tantalum oxy fluoride, barium strontium niobate, sodium barium niobate, or potassium strontium niobate; or an improper ferroelectric material which includes one of: [PTO/STO]n or [LAO/STO]n, where ‘n’ is between 1 to 100; or depositing the paraelectric material comprising SrTiO3, Ba(x)Sr(y)TiO3 (where x is −0.05, and y is 0.95), HfZrO2, Hf—Si—O, or La-substituted PbTiO3.

Example 3c: The method of example 1c, wherein etching the first opening comprises forming the first opening with a first lateral thickness that is greater than a second lateral thickness of the first conductive interconnect, and wherein etching the material layer stack further comprises forming the memory device having a third lateral thickness that is less than the first lateral thickness.

Example 4c: The method of example 3c, wherein depositing the first conductive hydrogen barrier layer comprises utilizing a first atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion.

Example 5c: The method of example 4c, wherein depositing the first conductive hydrogen barrier layer comprises using the first atomic layer deposition process to deposit a material comprising TiAlN, with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide (ZO) or METGLAS series of alloys.

Example 6c: The method of example 5c, wherein forming the electrode structure further comprises performing a chemical mechanical planarization process to form the electrode structure that is substantially comprised of the first conductive material with a peripheral boundary comprising the first conductive hydrogen barrier layer, and wherein the first conductive material is planarized to form a second uppermost surface that is substantially co-planar with a third uppermost surface of the etch stop layer.

Example 7c: The method of example 1c, wherein depositing the second dielectric comprises utilizing a second atomic layer deposition process to deposit a material comprising a transition metal and oxygen, such as but not limited to $Al_XO_Y$, $HfO_X$, $ZrO_X$, TaOx or $TiO_X$.

Example 8c: The method of example 1c, wherein depositing the second dielectric comprises utilizing a plurality of processing operations where a first operation comprises utilizing a physical vapor deposition (PVD) process to deposit a material comprising a transition metal and oxygen, such as but not limited to $Al_XO_Y$, $HfO_X$, $ZrO_X$, $TaO_X$, $TiO_X$, AlSiOX, $HfSiO_X$, $TaSiO_X$, or a transition metal and nitrogen, such as, but not limited to AlN, ZrN, or HfN, wherein the PVD process deposits the second dielectric to a thickness of less than 5 nm, and further wherein the PVD process does not expose the memory device to hydrogen.

Example 9c: The method of example 8c, further comprises a third atomic layer deposition or a chemical vapor deposition process to deposit a material comprising $Al_XO_Y$, $HfO_X$, $ZrO_X$, $TaO_X$, $TiO_X$, AlSiOx, HfSiOx, $TaSiO_X$, AlN, ZrN, or HfN.

Example 10c: The method of example 1c, wherein forming the via electrode comprising forming an opening comprising a fourth lateral thickness that is less than a fifth lateral thickness of the memory device.

Example 11c: The method of example 1c, wherein forming the via electrode further comprises: forming an opening comprising a sixth lateral thickness that is greater than a seventh lateral thickness of the memory device; and overetching portions of the second dielectric below the first uppermost surface.

Example 12c: The method of example 1c, wherein depositing the second conductive hydrogen barrier layer comprises depositing on an entire first uppermost surface, and on sidewall of a top electrode of the memory device.

Example 13c: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; depositing a first conductive material in the first opening; depositing a first conductive hydrogen barrier layer on the first conductive material; planarizing the first conductive hydrogen barrier layer; forming a memory device by depositing a material layer stack comprising a ferroelectric material or a paraelectric material on the electrode structure and etching the material layer stack; depositing a second dielectric comprising an amorphous, greater than 90% film density hydrogen barrier material on the memory device and on the etch stop layer; forming a via electrode on the memory device by a second process comprising: forming a second opening in the second dielectric; depositing a second conductive hydrogen barrier layer on at least a portion of an uppermost surface of the memory device in the second opening; and depositing a second conductive material on the second conductive hydrogen barrier layer; etching and removing the second dielectric from the logic region and depositing a third dielectric comprising a less than 90% film density material; forming a hanging trench over the second conductive interconnect; forming a third opening in the third dielectric and in the etch stop layer; and depositing a conductive material in the third opening and in the hanging trench to form a via structure on the second conductive interconnect and a metal line on the via structure.

Example 14c: The method of example 1c, wherein depositing the first conductive hydrogen barrier layer comprises utilizing an atomic layer deposition process to blanket deposit the first conductive hydrogen barrier layer on the first conductive interconnect and on sidewalls of the etch stop layer to form a conductive hydrogen barrier layer having a lateral portion and substantially vertical portions, and wherein depositing the first conductive hydrogen barrier layer comprising using the atomic layer deposition process to deposit a material comprising TiAlN, with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide (ZO), or METGLAS series of alloys.

Example 15c: The method of example 13c, wherein etching the first opening comprises forming the first opening with a first lateral thickness that is less than a second lateral thickness of the first conductive interconnect, and wherein etching the material layer stack further comprises forming the memory device having a third lateral thickness that is greater than the first lateral thickness.

Example 16c: The method of example 13c, wherein etching the material layer stack further recesses the etch stop layer below an interface between the memory device and the etch stop layer, and wherein depositing the second dielectric further comprises depositing below the interface.

Example 17c: A method of fabricating a device structure, the method comprising: depositing an etch stop layer on a first conductive interconnect formed within a first dielectric in a memory region and on a second conductive interconnect formed within the first dielectric in an adjacent logic region; forming an electrode structure comprising a first conductive hydrogen barrier layer on the first conductive interconnect and a first conductive material on the first conductive hydrogen barrier layer; forming a memory device by depositing a material layer stack on the electrode structure and etching the material layer stack, wherein etching to form the memory device further comprises recessing portions of the first conductive material; depositing a second dielectric comprising an amorphous and greater than 90% film density hydrogen barrier material on the memory device; forming a via electrode comprising a second conductive hydrogen barrier layer on the memory device, wherein the second conductive hydrogen barrier layer is in contact with an uppermost surface of the memory device; etching and removing the second dielectric from the logic region and depositing a third dielectric comprising a less than 90% film density material; forming a hanging trench over the second conductive interconnect forming an opening in the third dielectric and in the etch stop layer; and depositing liner layer in the opening and in the hanging trench, the liner layer extending continuously from an uppermost surface of the second conductive interconnect to an uppermost surface of the third dielectric; depositing a fill metal in the opening and in the hanging trench on the liner layer; planarizing to remove the fill metal and the liner layer from above the third dielectric to form a via structure on the second conductive interconnect and a metal line on the via structure.

Example 18c: The method of example 17c, wherein recessing portions of the first conductive material forms a first surface of the first conductive material adjacent the memory device that is below an uppermost surface of the etch stop layer, and wherein depositing the second dielectric comprises utilizing an atomic layer deposition process to deposit a material comprising a transition metal and oxygen, such as but not limited to $Al_XO_Y$, $HfO_X$, $ZrO_X$, $TaO_X$ or $TiO_X$, wherein depositing the second dielectric further comprises depositing below an interface between the first conductive material and the memory device.

Example 1d: A device comprising: a first region comprising: a first conductive interconnect within a first dielectric in a first level; a second level above the first level, the second level comprising: an electrode structure on at least a portion of the first conductive interconnect, the electrode structure comprising: a first conductive hydrogen barrier layer; and a first conductive fill material adjacent to the first conductive hydrogen barrier layer; an insulator layer laterally surrounding the electrode structure; a memory device on least a portion of the electrode structure, the memory device comprising a ferroelectric material or a paraelectric material; a second dielectric spanning the first region, the second dielectric comprising an amorphous, greater than 90% film density hydrogen barrier material, wherein the memory device is directly adjacent to and embedded within the second dielectric; and a via electrode on at least a portion of the memory device, the via electrode comprising: a second conductive hydrogen barrier layer comprising a first lateral portion in contact with the memory device first substantially vertical portions directly adjacent to the second dielectric; and a second conductive fill material adjacent to the second conductive hydrogen barrier layer; and a third level above the second level, the third level comprising: a third dielectric comprising a first less than 90% film density material, wherein the third dielectric is on the second dielectric; and a contact electrode structure on the via electrode, the contact electrode structure comprising: a third conductive hydrogen barrier layer comprising a second lateral portion on the via electrode and second substantially vertical portions directly adjacent to the third dielectric; and a third conductive fill material adjacent to the second conductive hydrogen barrier layer; and a second region adjacent to the first region, the second region comprising: a fourth dielectric comprising a second less than 90% film density material on the insulator layer, the fourth dielectric directly adjacent to the second dielectric, a second conductive interconnect within the first dielectric in the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein a first portion of the via structure is adjacent to the insulator layer and a second portion of the via structure is adjacent to the fourth dielectric.

Example 2d: The device of example 1d, wherein the insulator layer comprises silicon and one or more of nitrogen and carbon and the second dielectric does not comprise silicon nitride.

Example 3d: The device of example 1d, wherein the contact electrode structure comprises a first lateral thickness that is greater than a second lateral thickness of the via electrode.

Example 4d: The device of example 1d, wherein the first conductive hydrogen barrier layer, the second conductive hydrogen barrier layer or the third conductive hydrogen barrier layer comprise TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys.

Example 5d: The device of example 4d, wherein the first conductive hydrogen barrier layer, the second conductive hydrogen barrier layer and the third conductive hydrogen barrier layer comprise different materials.

Example 6d: The device of example 1d, wherein the first conductive hydrogen barrier layer, the second conductive hydrogen barrier layer comprise a different material from a material of the third conductive hydrogen barrier layer.

Example 7d: The device of example 1d, wherein the electrode structure is a first electrode structure, wherein the memory device is a first memory device, wherein the via electrode is a first via electrode, and wherein the device further comprises: a fourth conductive interconnect on a first plane behind the first conductive interconnect on a second plane; a second memory device above the fourth conductive interconnect; a second electrode structure coupled between the second memory device and the fourth conductive interconnect, the second electrode structure comprising the first conductive hydrogen barrier layer; a second via electrode comprising the second conductive hydrogen barrier layer and the second conductive fill material, and wherein the contact electrode structure is further on and electrically coupled with the second via electrode.

Example 8d: The device of example 1d, wherein the third conductive hydrogen barrier layer extends on the second dielectric and is contact with the second conductive hydrogen barrier layer of the second via electrode, and wherein the third conductive fill material laterally extends over the second dielectric and over the second via electrode.

Example 9d: The device of example 1d, wherein the via structure comprises a first vertical thickness that is substantially equal to a sum of vertical thicknesses of the electrode structure, the memory device, and the via electrode.

Example 10d: A device comprising: a first region comprising: a first conductive interconnect within in a first level; a second level above the first level, the second level comprising: an electrode structure on at least a portion of the first conductive interconnect, the electrode structure comprising a first conductive hydrogen barrier layer and a first conductive fill material adjacent to the first conductive hydrogen barrier layer; an insulator layer laterally surrounding the electrode structure; a memory device on least a portion of the electrode structure, the memory device comprising a ferroelectric material or a paraelectric material; a first dielectric spanning the first region, the first dielectric comprising an amorphous, greater than 90% film density hydrogen barrier material, wherein the memory device is directly adjacent to and embedded within the first dielectric; and a via electrode on at least a portion of the memory device, the via electrode comprising: a second conductive hydrogen barrier layer comprising a first lateral portion on the memory device and first substantially vertical portions directly adjacent to the first dielectric; a first conductive fill material; and a first liner layer directly between the second conductive hydrogen barrier layer and the first conductive fill material; and a third level above the second level, the third level comprising: a second dielectric comprising a first less than 90% film density material on the first dielectric; and a contact electrode structure comprising: a second liner layer comprising a second lateral portion on the via electrode and second substantially vertical portions directly adjacent to the second dielectric; and a third conductive fill material adjacent to the second liner layer; a second region adjacent to the first region, the second region comprising: a third dielectric comprising a second less than 90% film density material directly adjacent to the first dielectric, the third dielectric on the insulator layer, and wherein the second dielectric extends laterally on the third dielectric; a second conductive interconnect within the first level; a third conductive interconnect within the third level; and a via structure within the second level, the via structure coupled between the second conductive interconnect and the third conductive interconnect, wherein the via structure and the third conductive interconnect comprise: a third liner layer adjacent to sidewalls of the third dielectric and the second dielectric, the third liner layer extending from an uppermost surface of the second conductive interconnect to an uppermost surface of the second dielectric; and a third conductive fill material continuously filling the via structure and the third conductive interconnect.

Example 11d: The device of example 10d, wherein the second liner layer and the third liner layer comprise a same material.

Example 12d: The device of example 10d, wherein the third conductive fill material and the third conductive fill material comprise a same material.

Example 13d: A device comprising: a first region comprising: a first conductive interconnect within a first dielectric in a first level; and a second level above the first level, the second level comprising: an electrode structure on at least a portion of the first conductive interconnect, the electrode structure comprising: a first conductive hydrogen barrier layer; and a first conductive fill material adjacent to the first conductive hydrogen barrier layer; an insulator layer laterally surrounding the electrode structure; a memory device on least a portion of the electrode structure, the memory device comprising a ferroelectric material or a paraelectric material; a second dielectric comprising an amorphous greater than 90% film density hydrogen barrier material, wherein the memory device is directly adjacent to and embedded within the second dielectric; a via electrode comprising: a second conductive hydrogen barrier layer comprising a first lateral portion on the memory device and first substantially vertical portions directly adjacent to the second dielectric; a first conductive fill material; and a first liner layer directly between the second conductive hydrogen barrier layer and the first conductive fill material; a second region adjacent to the first region, the second region comprising: a second conductive interconnect within the first level; a via structure on the second conductive interconnect, the via structure within the second level; a metal line within a third level, the metal line in contact with the via structure; a third dielectric comprising a less than 90% film density material on the insulator layer, wherein the via structure and the metal line are laterally surrounded by the third dielectric, the third dielectric laterally adjacent to and in contact with the second dielectric, wherein the third dielectric laterally extends on an uppermost surface of the second dielectric; and wherein the first region further comprises: a contact electrode structure on the via electrode, the contact electrode comprising: a third conductive hydrogen barrier layer comprising a lateral portion on the via electrode and vertical portions adjacent to the third dielectric; a second conductive fill material; and a second liner layer directly between the second conductive hydrogen barrier layer and the second conductive fill material.

Example 14d: The device of example 13d, the metal line has a lowermost surface that is at or below an uppermost surface of the via electrode.

Example 1e: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; depositing a first conductive hydrogen barrier layer in the first opening; and depositing a first conductive material on the first conductive hydrogen barrier layer; forming a memory device by depositing a material layer stack comprising a ferroelectric material or a paraelectric material on the electrode structure and etching the material layer stack; depositing a second dielectric comprising an amorphous, greater than 90% film density hydrogen barrier material on the memory device and on the etch stop layer; forming a via electrode on the memory device by a second process comprising: forming a second opening in the second dielectric; depositing a second conductive hydrogen barrier layer on at least a portion of a first uppermost surface of the memory device in the second opening; and depositing a second conductive material on the second conductive hydrogen barrier layer; etching and removing the second dielectric from the logic region and depositing a third dielectric comprising a less than 90% film density material; etching the third dielectric to form a via opening and exposing the second conductive interconnect; filling the via opening with a first one or more conductive materials; planarizing to form a via structure; depositing a fourth dielectric on the via electrode, on the second dielectric, on the third dielectric and on the via structure; forming a contact electrode by a third process, comprising: forming a third opening in the fourth dielectric and exposing the via electrode; depositing a third conductive hydrogen barrier layer on the via electrode in the third opening; depositing a second one or more conductive materials on the third conductive hydrogen barrier layer; and planarizing the second one or more conductive materials and the third conductive hydrogen barrier layer; forming a trench opening in the fourth dielectric and exposing the via structure; and depositing a third one or more conductive materials in the trench opening on the via structure to form a metal line.

Example 2e: The method of example 1e, wherein depositing the first conductive hydrogen barrier layer comprises utilizing an atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion, wherein depositing the first conductive hydrogen barrier layer comprising using an atomic layer deposition process to deposit a material comprising TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys.

Example 3e: The method of example 1e, wherein depositing the third dielectric further comprises depositing the third dielectric on a second uppermost surface of the second dielectric and performing a first planarization process to remove third dielectric from the second uppermost surface, wherein the first planarization process forms the second uppermost surface and a third uppermost surface of the third dielectric that are substantially co-planar.

Example 4e: The method of example 1e, wherein forming the first electrode structure further comprises performing a second planarization process to form the first conductive material comprising a substantially planar fourth uppermost surface, wherein the planar fourth uppermost surface is substantially co-planar with a fifth uppermost surface of the etch stop layer.

Example 5e: The method of example 1e, wherein the via electrode is a first via electrode, the memory device is a first memory device, wherein etching the material layer stack further comprises forming a second memory device on a first plane behind the first memory device on a second plane, and wherein the third process further comprises forming a second via electrode on the second memory device, wherein forming the third opening in the fourth dielectric further comprises forming a fifth opening and exposing the second via electrode, and wherein depositing the third conductive hydrogen barrier layer further comprises depositing on the second via electrode.

Example 6e: The method of example 5e, wherein depositing the third one or more conductive materials further comprises depositing a liner layer and a conductive fill material on the liner layer.

Example 7e: The method of example 6e, wherein after depositing a third one or more conductive materials in the trench opening, a third planarization process is performed wherein the third planarization process forms a substantially planar sixth uppermost surface of the contact electrode that is co-planar with a seventh uppermost surface of the metal line.

Example 8e: The method of example 7e, wherein forming the via electrode further comprises: forming the second opening comprising a fourth lateral thickness that is greater than a fifth lateral thickness of the memory device; and over-etching portions of the second dielectric below the first uppermost surface.

Example 9e: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; depositing a first conductive hydrogen barrier layer in the first opening; and depositing a first conductive material on the first conductive hydrogen barrier layer; forming a memory device by depositing a material layer stack comprising a ferroelectric material or a paraelectric material on the electrode structure and etching the material layer stack; depositing a second dielectric comprising an amorphous greater than 90% film density hydrogen barrier material on the memory device and on the etch stop layer; forming a via electrode on the memory device by a second process comprising: forming a second opening in the second dielectric; depositing a second conductive hydrogen barrier layer on at least a portion of an uppermost surface of the memory device in the second opening; depositing a conductive material on the second conductive hydrogen barrier layer; etching and removing the second dielectric from the logic region and depositing a third dielectric comprising a less than 90% film density material; performing a planarization of the third dielectric, wherein the planarization forms a first portion of the third dielectric above the second dielectric and forms a second portion of the third dielectric directly laterally adjacent to the second dielectric; etching the third dielectric to form a trench opening above the via electrode; forming a contact electrode in the trench opening by depositing a third conductive hydrogen barrier layer on the via electrode in the trench opening and on the third dielectric, by depositing a second conductive material on the third conductive hydrogen barrier layer, and by planarizing to remove the second conductive material and the third conductive hydrogen barrier layer from above the third dielectric; etching the third dielectric to form a hanging trench; masking a portion of the hanging trench to form a via opening in the third dielectric below the hanging trench; and forming a via structure by depositing one or more conductive materials in the via opening and in the hanging trench.

Example 10e: The method of example 9e, wherein performing the planarization comprises forming a vertical thickness of the third dielectric above the second dielectric that is at least equal to a vertical thickness of the contact electrode.

Example 11e: The method of example 9e, wherein etching the third dielectric to form the hanging trench further comprises etching to a level that is substantially co-planar with an uppermost surface of the via electrode.

Example 12e: The method of example 9e, wherein etching the material layer stack further recesses the etch stop layer to a level below an interface between the memory device and the etch stop layer, and wherein depositing the second dielectric further comprises depositing below the interface.

Example 13e: The method of example 9e wherein depositing a liner layer comprises simultaneously depositing a liner layer in the via opening, in the hanging trench and in the trench opening and on uppermost surface of the fourth dielectric.

Example 14e: The method of example 9e, wherein the via opening in the third dielectric comprises a first lateral width that is between 25-75% of a second lateral width of the hanging trench.

Example 1f: A device comprising: a first region comprising: a first conductive interconnect within a first dielectric in a first level; a second level above the first level, the second level comprising: a first electrode structure on at least a portion of the first conductive interconnect, the first electrode structure comprising: a first conductive hydrogen barrier layer; and a first conductive fill material adjacent to the first conductive hydrogen barrier layer; an insulator layer laterally surrounding the first electrode structure; and a memory device on least a portion of the first electrode structure, the memory device comprising a ferroelectric material or a paraelectric material; a second dielectric spanning the first region and on the insulator layer, the second dielectric comprising an amorphous, greater than 90% film density hydrogen barrier material, wherein the memory device is directly adjacent to and embedded within the second dielectric; a third dielectric comprising a less than 90% film density material on the second dielectric, the third dielectric within a third level above the second level; a second electrode structure coupled with the memory device, the second electrode structure comprising: a via electrode on at least a portion of the memory device and adjacent to the second dielectric; and a trench electrode on the via electrode, the trench electrode adjacent to the third dielectric; a second conductive hydrogen barrier layer comprising: a lateral portion on the memory device; first substantially vertical portions directly adjacent to the second dielectric; and second substantially vertical portions directly adjacent to the third dielectric; and a second conductive fill material that extends continuously from the lateral portion to a first uppermost surface of the third dielectric; and a second region adjacent to the first region, the second region comprising: a fourth dielectric comprising dielectric comprising a first less than 90% film density material directly adjacent to the second dielectric and below the third dielectric; a second conductive interconnect within the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein at least a first portion of the via structure is adjacent to the insulator layer.

Example 2f: The device of example 1f, wherein the trench electrode has a first width and the via electrode has a second width, where the first width is greater than the second width.

Example 3f: The device of example 2f, wherein the second conductive hydrogen barrier layer further extends on a second uppermost surface of the second dielectric.

Example 4f: The device of example 1f, wherein the electrode structure is a first electrode structure, wherein the memory device is a first memory device, wherein the via electrode is a first via electrode, and wherein the device further comprises: a fourth conductive interconnect on a first plane behind the first conductive interconnect on a second plane; a second memory device above the fourth conductive interconnect; a third electrode structure coupled between the second memory device and the fourth conductive interconnect, the third electrode structure comprising the first conductive hydrogen barrier layer; a second via electrode comprising the second conductive hydrogen barrier layer and the second conductive fill material, and wherein the trench electrode is further on and electrically coupled with the second via electrode.

Example 5f: The device of example 4f, wherein the second conductive hydrogen barrier layer extends from the first via electrode to the second via electrode on the second dielectric, and wherein the second conductive fill material laterally extends over the second dielectric and over the second via electrode.

Example 6f: The device of example 4f, wherein the via structure comprises a first vertical thickness that is substantially equal to a sum of vertical thicknesses of the electrode structure, the memory device, and the via electrode.

Example 7f: The device of example 4f, wherein the third conductive interconnect comprises a second vertical thickness that is substantially equal to a fourth vertical thickness of the trench electrode.

Example 8f: The device of example 4f, wherein the electrode structure comprises a first lateral thickness; the memory device further comprising a second lateral thickness, wherein the first lateral thickness is less than the second lateral thickness.

Example 9f: A device comprising: a first region comprising: a first conductive interconnect within a first dielectric in a first level; a second level above the first level, the second level comprising: a first electrode structure on the first conductive interconnect, the first electrode structure comprising: a first conductive fill material; a first conductive hydrogen barrier layer on the first conductive fill material; an insulator layer laterally surrounding the first electrode structure; a memory device on least a portion of the first electrode structure, the memory device comprising a ferroelectric material or a paraelectric material; and a second dielectric spanning the first region and on the insulator layer, the second dielectric comprising an amorphous, greater than 90% film density hydrogen barrier material, wherein the memory device is directly adjacent to and embedded within the second dielectric; a third dielectric comprising a less than 90% film density material on the second dielectric, the third dielectric within a third level above the second level; a second electrode structure coupled with the memory device, the second electrode structure comprising: a via electrode on at least a portion of the memory device and adjacent to the second dielectric; a trench electrode on the via electrode, the trench electrode adjacent to the third dielectric; a second conductive hydrogen barrier layer comprising: a lateral portion on the memory device; first substantially vertical portions directly adjacent to the second dielectric; and second substantially vertical portions directly adjacent to the third dielectric; a second conductive fill material that extends continuously from above the lateral portion to an uppermost surface of the third dielectric; and a liner layer between the second conductive hydrogen barrier layer and the second conductive fill material; and a second region adjacent to the first region, the second region comprising: a fourth dielectric comprising dielectric comprising a first less than 90% film density material directly adjacent to the second dielectric and below the third dielectric; a second conductive interconnect within the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein at least a first portion of the via structure is adjacent to the insulator layer.

Example 10f: The device of example 9f, wherein the memory device is in contact with the first conductive hydrogen barrier layer and the first conductive fill material, and wherein the memory device covers the first electrode structure.

Example 11f: A device comprising: a first region comprising: a first conductive interconnect within a first dielectric in a first level; a second level above the first level, the second level comprising: a first electrode structure on at least a portion of the first conductive interconnect, the first electrode structure comprising: a first conductive hydrogen barrier layer; and a first conductive fill material adjacent to the first conductive hydrogen barrier layer; an insulator layer laterally surrounding the first electrode structure; a memory device on least a portion of the first electrode structure, the memory device comprising a ferroelectric material or a paraelectric material; a second dielectric spanning the first region, the second dielectric comprising an amorphous, greater than 90% film density hydrogen barrier material, wherein the memory device is directly adjacent to and embedded within the second dielectric; a second region adjacent to the first region, the second region comprising: a second conductive interconnect within the first level; a via structure on the second conductive interconnect, the via structure within the second level; a metal line within a third level, the metal line in contact with the via structure; a third dielectric comprising a less than 90% film density material on the insulator layer, the third dielectric laterally adjacent to and in contact with the second dielectric, and wherein the via structure and the metal line are laterally surrounded by the third dielectric, wherein the third dielectric laterally extends on an uppermost surface of the second dielectric; and wherein the first region further comprises: a second electrode structure coupled with the memory device, the second electrode structure comprising: a via electrode on at least a portion of the memory device and adjacent to the second dielectric, the via electrode comprising: a second conductive hydrogen barrier layer comprising a first lateral portion on the memory device and first substantially vertical portions directly adjacent to the second dielectric; and a second conductive fill material on the second conductive hydrogen barrier layer, a trench electrode on the via electrode, the trench electrode adjacent to the third dielectric, the trench electrode comprising: the second conductive hydrogen barrier layer comprising a second lateral portion on the second dielectric; and second substantially vertical portions directly adjacent to the third dielectric, and wherein the second conductive fill material is directly adjacent to the second conductive hydrogen barrier layer and wherein the second conductive fill material extends continuously from a level of a lowermost surface to a level of an uppermost surface of the third dielectric.

Example 12f: The device of example 11f wherein the metal line has a lowermost surface that is at or below an uppermost surface of the via electrode.

Example 1g: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming a first electrode structure on the first conductive interconnect by a first process comprising: etching a first opening in the etch stop layer; depositing a first conductive hydrogen barrier layer in the first opening; and depositing a conductive material on the first conductive hydrogen barrier layer; forming a memory device by depositing a material layer stack comprising a ferroelectric material or a paraelectric material on the first electrode structure and etching the material layer stack; depositing a second dielectric comprising an amorphous greater than 90% film density hydrogen barrier material on the memory device and on the etch stop layer; etching and removing the second dielectric from the logic region and depositing a third dielectric comprising a first less than 90% film density material; etching the third dielectric to form a first via opening and exposing the second conductive interconnect; filling the first via opening with a first one or more conductive materials to form a via structure; depositing a fourth dielectric comprising a second less than 90% film density material on the third dielectric and on the via structure; forming a trench opening in the fourth dielectric and exposing the via structure; depositing a second one or more conductive materials in the trench opening on the via structure to form a metal line; forming a second electrode structure on the memory device by a second process comprising: forming a hanging trench opening in the fourth dielectric and exposing the third dielectric; forming a mask on a portion of the hanging trench, the mask providing a second opening that exposes a portion of the second dielectric; etching the second dielectric through the second opening to form a second via opening, the second via opening exposing the memory device; depositing a second conductive hydrogen barrier layer on a first uppermost surface of the memory device, in the second via opening, and in the hanging trench; and depositing a third one or more conductive materials on the second conductive hydrogen barrier layer in the second via opening to form a via electrode; and planarizing to form a contact electrode in the hanging trench, on the via electrode.

Example 2g: The method of example 1g, wherein the via electrode is a first via electrode, the memory device is a first memory device, wherein etching the material layer stack further comprises forming a second memory device on a first plane behind the first memory device on a second plane, and wherein the hanging trench is a first hanging trench, wherein the second process further comprises: forming a second hanging trench above the second memory device; forming the mask in the second hanging trench, the mask providing a third opening that exposes a portion of the second dielectric; etching the second dielectric through the third opening to form a third via opening, the third via opening exposing the second memory device; depositing the second conductive hydrogen barrier layer on the second memory device in the third via opening and in the second hanging trench; and wherein the planarizing forms a second via electrode in the third via opening, and further forms the contact electrode in the second hanging trench on the second via electrode.

Example 3g: The method of example 1g, wherein after depositing a third one or more conductive materials in the hanging trench opening and in the via opening, a third planarization process is performed wherein the third planarization process forms a substantially planar sixth uppermost surface of the trench electrode that is co-planar with a seventh uppermost surface of the metal line.

Example 4g: The method of example 1g, herein the second via opening comprises a first lateral thickness that is less than a second lateral thickness of the memory device, and wherein the hanging trench opening comprises a third lateral thickness that is greater than the first lateral thickness.

Example 5g: The method of example 1g, wherein forming the via electrode further comprises: forming the second opening comprising a fourth lateral thickness that is greater than a fifth lateral thickness of the memory device; and over-etching portions of the second dielectric below the first uppermost surface.

Example 6g: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming a first electrode structure on the first conductive interconnect by a first process comprising: etching a first opening in the etch stop layer; depositing a first conductive material on the first conductive interconnect; planarizing and recessing the first conductive material; depositing a first conductive hydrogen barrier layer in the first opening on the first conductive material; and planarizing the first conductive hydrogen barrier layer to form a conductive hydrogen barrier; forming a memory device by depositing a material layer stack comprising a ferroelectric material or a paraelectric material on the first electrode structure and etching the material layer stack; depositing a second dielectric comprising an amorphous greater than 90% film density hydrogen barrier material on the memory device and on the etch stop layer; etching and removing the second dielectric from the logic region and depositing a third dielectric comprising a first less than 90% film density material; etching the third dielectric to form a first via opening and exposing the second conductive interconnect; filling the first via opening with a first one or more conductive materials to form a via structure; depositing a fourth dielectric comprising a second less than 90% film density material on the third dielectric and on the via structure; forming a trench opening in the fourth dielectric and exposing the via structure; depositing a second one or more conductive materials in the trench opening on the via structure to form a metal line; forming a second electrode structure on the memory device by a second process comprising: forming a hanging trench in the fourth dielectric and exposing the third dielectric; forming a mask on a portion of the hanging trench, the mask providing a second opening that exposes a portion of the second dielectric; etching the second dielectric through the second opening to form a second via opening, the second via opening exposing the memory device; depositing a second conductive hydrogen barrier layer on the memory device in the second via opening and in the hanging trench; depositing a third one or more conductive materials on the second conductive hydrogen barrier layer; and planarizing to form a via electrode in the second via opening and a contact electrode in the hanging trench, on the via electrode.

Example 7g: The method of example 6g, wherein planarizing the first conductive hydrogen barrier layer to form a conductive hydrogen barrier causes dishing of an uppermost surface of the conductive hydrogen barrier.

Example 8g: The method of example 7g, wherein depositing the material layer stack comprises forming a lower most layer having a contour that matches the uppermost surface of the conductive hydrogen barrier.

Example 9g: The method of example 6g, wherein the first electrode structure comprises a first lateral thickness that is less than a second lateral thickness of the first electrode structure, and wherein etching the material layer stack recesses a portion of the etch stop layer to a level below an interface between the memory device and second conductive hydrogen barrier layer.

Example 10g: A method of fabricating a device structure, the method comprising: forming a first conductive interconnect in a first dielectric in a memory region and a second conductive interconnect in the first dielectric in a logic region; depositing an etch stop layer on the first dielectric and on the first conductive interconnect and on the second conductive interconnect; forming an electrode structure on the first conductive interconnect by a first process comprising: etching a first opening in the etch stop layer; depositing a first conductive hydrogen barrier layer in the first opening; and depositing a first conductive material on the first conductive hydrogen barrier layer; forming a memory device by depositing a material layer stack comprising a ferroelectric material or a paraelectric material on the electrode structure and etching the material layer stack; depositing a second dielectric comprising an amorphous greater than 90% film density hydrogen barrier material on the memory device and on the etch stop layer; etching and removing the second dielectric from the logic region and depositing a third dielectric comprising a less than 90% film density material; performing a planarization of the third dielectric, wherein the planarization forms a first portion of the third dielectric directly laterally adjacent to the second dielectric and a second portion of the third dielectric above the second dielectric; etching the third dielectric to form a first hanging trench above the second conductive interconnect; forming a first mask within a portion of the first hanging trench; and etching the third dielectric through an opening in the first mask to form a first via opening; depositing a liner layer in the first via opening, in the first hanging trench and on an uppermost surface of the third dielectric; depositing a second conductive material on the liner layer in the first via opening, and in the first hanging trench; planarizing to remove the second conductive material and the liner layer from above the third dielectric and forming a via structure in the first via opening and a metal line in the first hanging trench; etching the third dielectric and forming a second hanging trench opening in the third dielectric and exposing the second dielectric; forming a second mask within a portion of the second hanging trench; etching the second dielectric through an opening in the second mask to form a second via opening; depositing a second conductive hydrogen barrier layer on at least a portion of an uppermost surface of the memory device in the second via opening and in the second hanging trench; depositing one or more layers of conductive material on the second conductive hydrogen barrier layer; and planarizing to form a via electrode in the second via opening and a contact electrode in the second hanging trench, on the via electrode.

Example 11g: The method of example 10g, wherein etching the third dielectric to form the first hanging trench further comprises etching to a level that is substantially co-planar with an uppermost surface of the second dielectric.

Example 1h: A device comprising a first region, the first region comprising: a first conductive interconnect within a first dielectric in a first level; a second level above the first level, the second level comprising: an electrode structure on at least a portion of the first conductive interconnect, the first electrode structure comprising: a first conductive hydrogen barrier layer; and a first conductive material adjacent to the first conductive hydrogen barrier layer; an insulator layer laterally surrounding the electrode structure; a memory device on least a portion of the first electrode structure, the memory device comprising a ferroelectric material or a paraelectric material; a second dielectric spanning the first region, the second dielectric comprising an amorphous, greater than 90% film density hydrogen barrier material, wherein the memory device is directly adjacent to and embedded within the second dielectric; a third dielectric comprising a first less than 90% film density material on the second dielectric, the third dielectric within a third level above the second level; a via electrode structure on at least a portion of the memory device, the second electrode structure comprising: a second conductive hydrogen barrier layer comprising a lateral portion on the memory device and substantially vertical portions at opposite ends of the lateral portion, wherein the lateral portion and the substantially vertical portions are configured as a cup; and a second conductive material in contact with the second conductive hydrogen barrier layer; and wherein the via electrode structure further comprises a first portion adjacent to the second dielectric and a second portion adjacent to the third dielectric; and a second region adjacent to the first region, the second region comprising: a fourth dielectric comprising dielectric comprising a second less than 90% film density material directly adjacent to the second dielectric and below the third dielectric; a second conductive interconnect within the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein at least a first portion of the via structure is adjacent to the insulator layer.

Example 2h: The device of example 1h, wherein sidewalls of the second electrode structure are tapered, wherein the first portion is above the second portion, and wherein the first portion is wider than the second portion.

Example 3h: The device of example 1h, wherein the first portion and the second portion have a same lateral thickness.

Example 4h: The device of example 1h, wherein sidewalls of the second electrode structure are tapered, wherein the first portion is above the second portion, and wherein the first portion is wider than the second portion.

Example 5h: The device of example 1h wherein the second conductive material further comprises: a first conductive fill material; and a first liner layer between the first conductive fill material and the second conductive hydrogen barrier layer.

Example 6h: The device of example 1h wherein the electrode structure is a first electrode structure, the memory device is a first memory device and the device structure further comprises: a second memory device laterally separated from the first memory device; a third conductive interconnect below the second memory device; a second electrode structure directly between the third conductive interconnect and the second memory device; a second via electrode structure on the second memory device; and a bridge structure coupled between and in contact with the first via electrode structure and second via electrode structure, the bridge structure comprising a third conductive material, wherein an uppermost surface of the third conductive material is co-planar with an uppermost surface of the second conductive material.

Example 7h: The device of example 6h, wherein the bridge structure further comprises a third conductive hydrogen barrier layer between the third conductive material and the second conductive hydrogen barrier layer.

Example 8h: The device of example 7h wherein the third conductive material further comprises: a second conductive fill material; and a second liner layer between the second conductive fill material and the third conductive hydrogen barrier layer.

Example 9h: The device of example 8h wherein the second via electrode comprises the second conductive hydrogen barrier layer, wherein the third conductive hydrogen barrier layer extends on the second dielectric and is contact with the second conductive hydrogen barrier layer of the second via electrode.

Example 10h: The device of example 9h wherein the first conductive hydrogen barrier layer comprises one of TiAlN, with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys, wherein the second conductive hydrogen barrier layer comprises one of TiAlN, with greater than 30 atomic percent AlN, TaN with greater than 30 atomic percent $N_2$, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys and wherein the third conductive hydrogen barrier layer comprises one of TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys.

Example 11h: The device of example 6h, wherein the first conductive hydrogen barrier layer and the second conductive hydrogen barrier layer comprise different materials.

Example 12h: A device comprising: a first region comprising: a plurality of first conductive interconnects within a first level; and a second level above the first level, the second level comprising: a plurality of memory devices above a respective first conductive interconnect in the plurality of first conductive interconnects; an electrode structure coupled between a respective ferroelectric memory device in the plurality of ferroelectric memory devices and the respective first conductive interconnect in the plurality of first conductive interconnects, the electrode structure comprising: a first conductive hydrogen barrier layer; and a first conductive material adjacent to the first conductive hydrogen barrier layer; a second dielectric spanning the first region, the second dielectric comprising an amorphous, greater than 90% film density hydrogen barrier material, wherein the plurality of memory devices are directly adjacent to and embedded within the second dielectric; a third dielectric comprising a first less than 90% film density material on the second dielectric, the third dielectric within a third level above the second level; a plurality of via electrode structures, wherein a respective via electrode of the plurality of via electrode structures is on at least a portion of the individual ones of the plurality of memory devices, the respective via electrode structure comprising:

a second conductive hydrogen barrier layer comprising a lateral portion on individual ones of the plurality of memory devices memory device and substantially vertical portions at opposite ends of the lateral portion, wherein the lateral portion and the substantially vertical portions are configured as a cup; and a second conductive material in contact with the second conductive hydrogen barrier layer; wherein the respective via electrode structure further comprises a first portion adjacent to the second dielectric and a second portion adjacent to the third dielectric; a bridge structure coupled between and in contact with adjacent ones of the respective via electrode structures and second via electrode, the bridge structure comprising: a third conductive hydrogen barrier; and a third conductive material on the third conductive hydrogen barrier layer, wherein an uppermost surface of the third conductive material is co-planar with an uppermost surface of the second conductive material; and a second region adjacent to the first region, the second region comprising: a fourth dielectric comprising dielectric comprising a second less than 90% film density material directly adjacent to the second dielectric and below the third dielectric; a second conductive interconnect within the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein at least a first portion of the via structure is adjacent to the insulator layer.

Example 13h: The device of example 12h, wherein a lowermost surface of the bridge structure is on an uppermost surface of the second dielectric.

Example 14h: The device of example 12h, a lowermost surface of the bridge structure is below a level of an uppermost surface of the second dielectric.

Example 15h: The device of example 12h, wherein the respective via electrode has a lateral thickness that is greater than a lateral thickness of the individual ones of the plurality of memory devices.

Example 16h: A system comprising: a processor; a communication interface communicatively coupled to the processor; and a memory coupled to the processor, wherein the memory comprises bit-cells, wherein one of the bit-cell includes a first region comprising a first conductive interconnect within a first dielectric in a first level; a second level above the first level, the second level comprising: an electrode structure on at least a portion of the first conductive interconnect, the first electrode structure comprising: a first conductive hydrogen barrier layer; and a first conductive material adjacent to the first conductive hydrogen barrier layer; an insulator layer laterally surrounding the electrode structure; a memory device on least a portion of the first electrode structure, the memory device comprising a ferroelectric material or a paraelectric material; a second dielectric spanning the first region, the second dielectric comprising an amorphous, greater than 90% film density hydrogen barrier material, wherein the memory device is directly adjacent to and embedded within the second dielectric; a third dielectric comprising a first less than 90% film density material on the second dielectric, the third dielectric within a third level above the second level; a via electrode structure on at least a portion of the memory device, the second electrode structure comprising: a second conductive hydrogen barrier layer comprising a lateral portion on the memory device and substantially vertical portions at opposite ends of the lateral portion, wherein the lateral portion and the substantially vertical portions are configured as a cup; and a second conductive material in contact with the second conductive hydrogen barrier layer; and wherein the via electrode structure further comprises a first portion adjacent to the second dielectric and a second portion adjacent to the third dielectric; and a second region adjacent to the first region, the second region comprising: a fourth dielectric comprising dielectric comprising a second less than 90% film density material directly adjacent to the second dielectric and below the third dielectric; a second conductive interconnect within the first level; a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein at least a first portion of the via structure is adjacent to the insulator layer.

What is claimed is:

1. A device comprising:

a first region comprising:

a first conductive interconnect within a first dielectric in a first level;

a second level above the first level, the second level comprising:

an electrode structure on at least a portion of the first conductive interconnect, the electrode structure comprising:

a first conductive hydrogen barrier layer; and a first conductive fill material adjacent to the first conductive hydrogen barrier layer;

an insulator layer laterally surrounding the electrode structure;

a memory device on least a portion of the electrode structure, the memory device comprising a ferroelectric material or a paraelectric material;

a second dielectric spanning the first region, the second dielectric comprising an amorphous, greater than 90% film density hydrogen barrier material, wherein the memory device is directly adjacent to and embedded within the second dielectric; and a via electrode on at least a portion of the memory device, the via electrode comprising:

a second conductive hydrogen barrier layer comprising a first lateral portion in contact with the memory device;

first substantially vertical portions directly adjacent to the second dielectric; and a second conductive fill material adjacent to the second conductive hydrogen barrier layer;

a third level above the second level, the third level comprising:

a third dielectric comprising a first less than 90% film density material, wherein the third dielectric is on the second dielectric; and a contact electrode structure on the via electrode, the contact electrode structure comprising:

a third conductive hydrogen barrier layer comprising a second lateral portion on the via electrode and second substantially vertical portions directly adjacent to the third dielectric; and a third conductive fill material adjacent to the second conductive hydrogen barrier layer; and a second region adjacent to the first region, the second region comprising:

a fourth dielectric comprising a second less than 90% film density material on the insulator layer, the fourth dielectric directly adjacent to the second dielectric, a second conductive interconnect within the first dielectric in the first level;

a third conductive interconnect within the third level, wherein the third dielectric extends over the fourth dielectric and wherein the third dielectric laterally surrounds the third conductive interconnect; and a via structure coupled between the second conductive interconnect and the third conductive interconnect, wherein a first portion of the via structure is adjacent to the insulator layer and a second portion of the via structure is adjacent to the fourth dielectric.

2. The device of claim 1, wherein the second dielectric comprises $Al_xO_y$, $HfO_x$, $AlSiO_x$, $ZrO_x$,$TiO_x$, $AlSiO_X$, $HfSiO_X$, $TaSiO_X$, AlN, ZrN, or HfN.

3. The device of claim 1, wherein the third dielectric comprises $SiO_2$, SiOC, SiC, or $SiO_2$ doped with F.

4. The device of claim 1, wherein the insulator layer comprises silicon and one or more of nitrogen and carbon and the second dielectric does not comprise silicon nitride.

5. The device of claim 1, wherein the via electrode further comprises a first liner layer between the second conductive hydrogen barrier layer and the first conductive fill material, and wherein the first liner layer comprises a first material that is different from a second material of the second conductive hydrogen barrier layer.

6. The device of claim 1, wherein the contact electrode structure further comprises a second liner layer between the third conductive hydrogen barrier layer and the second conductive fill material, and wherein the second liner layer comprises a third material that is different from a fourth material of the third conductive hydrogen barrier layer.

7. The device of claim 1, wherein the contact electrode structure comprises a first lateral thickness that is greater than a second lateral thickness of the via electrode.

8. The device of claim 1, wherein the first conductive hydrogen barrier layer, the second conductive hydrogen barrier layer or the third conductive hydrogen barrier layer comprise TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide, or METGLAS series of alloys.

9. The device of claim 8, wherein the first conductive hydrogen barrier layer, the second conductive hydrogen barrier layer and the third conductive hydrogen barrier layer comprise different materials.

10. The device of claim 1, wherein the first conductive hydrogen barrier layer, the second conductive hydrogen barrier layer comprise a different material from a material of the third conductive hydrogen barrier layer.

11. The device of claim 1, wherein the electrode structure is a first electrode structure, wherein the memory device is a first memory device, wherein the via electrode is a first via electrode, and wherein the device further comprises:

a fourth conductive interconnect on a first plane behind the first conductive interconnect on a second plane;

a second memory device above the fourth conductive interconnect;

a second electrode structure coupled between the second memory device and the fourth conductive interconnect, the second electrode structure comprising the first conductive hydrogen barrier layer; and a second via electrode comprising the second conductive hydrogen barrier layer and the second conductive fill material, and wherein the contact electrode structure is further on and electrically coupled with the second via electrode.

12. The device of claim 11, wherein the third conductive hydrogen barrier layer extends on the second dielectric and is contact with the second conductive hydrogen barrier layer of the second via electrode, and wherein the third conductive fill material laterally extends over the second dielectric and over the second via electrode.

13. The device of claim 1, wherein the ferroelectric material comprises one of:

bismuth ferrite (BFO) with a first doping material where in the first doping material is one of lanthanum or elements from lanthanide series of periodic table;

lead zirconium titanate (PZT) or PZT with a second doping material, wherein the second doping material is one of La or Nb;

a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);

a perovskite material which includes one of: $BaTiO_3$, PbTiO3, KNbO3, or $NaTaO_3$;

a first hexagonal ferroelectric which includes one of: $YMnO_3$, or $LuFeO_3$;

a second hexagonal ferroelectric of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides; Hafnium oxides as $Hf_{(1-x)}E_xO_y$, where E includes one of Al, Ca, Ce, Dy, Er, Gd, Ge, La, Sc, Si, Sr, Sn, Zr, or Y, wherein x and y are first fractions;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are second fractions; $HfO_2$doped with one of: Al, Ca, Ce, Dy, Er, Gd, Ge, La, Sc, Si, Sr, Sn, or Y; or niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100, or wherein the paraelectric material comprises $SrTiO_3$, $Ba_{(x)}Sr_{(y)}TiO_3$, $HfZrO_2$, Hf—Si—O, or La-substituted $PbTiO_3$.

14. The device of claim 1, wherein the via structure comprises a first vertical thickness that is substantially equal to a sum of vertical thicknesses of the electrode structure, the memory device, and the via electrode.

15. A device comprising:

a first region comprising:

a first conductive interconnect within in a first level;

a second level above the first level, the second level comprising:

an electrode structure on at least a portion of the first conductive interconnect, the electrode structure comprising a first conductive hydrogen barrier layer and a first conductive fill material adjacent to the first conductive hydrogen barrier layer;

an insulator layer laterally surrounding the electrode structure;

a memory device on least a portion of the electrode structure, the memory device comprising a ferroelectric material or a paraelectric material;

a first dielectric spanning the first region, the first dielectric comprising an amorphous, greater than 90% film density hydrogen barrier material, wherein the memory device is directly adjacent to and embedded within the first dielectric; and a via electrode on at least a portion of the memory device, the via electrode comprising:

a second conductive hydrogen barrier layer comprising a first lateral portion on the memory device and first substantially vertical portions directly adjacent to the first dielectric;

a second conductive fill material; and a first liner layer directly between the second conductive hydrogen barrier layer and the second conductive fill material;

a third level above the second level, the third level comprising:

a second dielectric comprising a first less than 80% film density material on the first dielectric; and a contact electrode structure comprising:

a second liner layer comprising a second lateral portion on the via electrode and second substantially vertical portions directly adjacent to the second dielectric; and a third conductive fill material adjacent to the second liner layer; and a second region adjacent to the first region, the second region comprising:

a third dielectric comprising a second less than 80% film density material directly adjacent to the first dielectric, the third dielectric on the insulator layer, and wherein the second dielectric extends laterally on the third dielectric;

a second conductive interconnect within the first level;

a third conductive interconnect within the third level; and a via structure within the second level, the via structure coupled between the second conductive interconnect and the third conductive interconnect, wherein the via structure and the third conductive interconnect comprise:

a third liner layer adjacent to sidewalls of the third dielectric and the second dielectric, the third liner layer extending from an uppermost surface of the second conductive interconnect to an uppermost surface of the second dielectric; and a fourth conductive fill material continuously filling the via structure and the third conductive interconnect.

16. The device of claim 15, wherein the second liner layer and the third liner layer comprise a same material.

17. The device of claim 15, wherein the second conductive fill material and the third conductive fill material comprise a same material.

18. A device comprising:

a first region comprising:

a first conductive interconnect within a first dielectric in a first level;

a second level above the first level, the second level comprising:

an electrode structure on at least a portion of the first conductive interconnect, the electrode structure comprising:

a first conductive hydrogen barrier layer; and a first conductive fill material adjacent to the first conductive hydrogen barrier layer;

an insulator layer laterally surrounding the electrode structure;

a memory device on least a portion of the electrode structure, the memory device comprising a ferroelectric material or a paraelectric material;

a second dielectric comprising an amorphous greater than 90% film density hydrogen barrier material, wherein the memory device is directly adjacent to and embedded within the second dielectric; and a via electrode comprising:

a second conductive hydrogen barrier layer comprising a first lateral portion on the memory device and first substantially vertical portions directly adjacent to the second dielectric;

a second conductive fill material; and a first liner layer directly between the second conductive hydrogen barrier layer and the second conductive fill material; and a second region adjacent to the first region, the second region comprising:

a second conductive interconnect within the first level;

a via structure on the second conductive interconnect, the via structure within the second level;

a metal line within a third level, the metal line in contact with the via structure; and a third dielectric comprising a less than 90% film density material on the insulator layer, wherein the via structure and the metal line are laterally surrounded by the third dielectric, the third dielectric laterally adjacent to and in contact with the second dielectric, wherein the third dielectric laterally extends on an uppermost surface of the second dielectric;

wherein the first region further comprises:

a contact electrode structure on the via electrode, the contact electrode structure comprising:

a third conductive hydrogen barrier layer comprising a lateral portion on the via electrode and vertical portions adjacent to the third dielectric;

a third conductive fill material; and a second liner layer directly between the second conductive hydrogen barrier layer and the third conductive fill material.

19. The device of claim 18, wherein the second dielectric comprises $Al_xO_y$, $HfO_x$, $AlSiO_x$, $ZrO_x$, $TiO_x$, $AlSiO_X$, $HfSiO_X$, $TaSiO_X$, AlN, ZrN, or HfN, wherein the third dielectric comprises $SiO_2$, SiOC, SiC, or $SiO_2$ doped with F.

20. The device of claim 18, wherein the metal line has a lowermost surface that is at or below an uppermost surface of the via electrode.

* * * * *